United States Patent
Berger et al.

(10) Patent No.: US 10,360,964 B2
(45) Date of Patent: *Jul. 23, 2019

(54) METHOD OF WRITING CONTENTS IN MEMORY DURING A POWER UP SEQUENCE USING A DYNAMIC REDUNDANCY REGISTER IN A MEMORY DEVICE

(71) Applicant: SPIN TRANSFER TECHNOLOGIES, INC., Fremont, CA (US)

(72) Inventors: Neal Berger, Cupertino, CA (US); Benjamin Louie, Fremont, CA (US); Mourad El-Baraji, Fremont, CA (US); Lester Crudele, Tomball, TX (US); Daniel Hillman, San Jose, CA (US)

(73) Assignee: Spin Memory, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/855,589

(22) Filed: Dec. 27, 2017

(65) Prior Publication Data

US 2018/0122447 A1    May 3, 2018

Related U.S. Application Data

(63) Continuation-in-part of application No. 15/277,799, filed on Sep. 27, 2016.

(51) Int. Cl.
*G11C 13/00*    (2006.01)
*G11C 11/16*    (2006.01)
(Continued)

(52) U.S. Cl.
CPC ...... *G11C 11/1675* (2013.01); *G06F 12/0804* (2013.01); *G11C 7/1039* (2013.01);
(Continued)

(58) Field of Classification Search
CPC ............ G11C 11/1675; G11C 11/1677; G11C 11/1673; G11C 11/1697; G11C 11/1653;
(Continued)

(56) References Cited

U.S. PATENT DOCUMENTS 4,597,487 A    7/1986 Crosby et al.
5,541,868 A    7/1996 Prinz
(Continued)

FOREIGN PATENT DOCUMENTS

CA    2766141    1/2011
CN    105706259    6/2016
(Continued)

OTHER PUBLICATIONS

US 7,026,672 B2, 04/2006, Grandis (withdrawn)
(Continued)

*Primary Examiner* — Harry W Byrne
*Assistant Examiner* — Sultana Begum

(57) ABSTRACT

A method of writing data into a memory device is disclosed. The method comprises utilizing a pipeline to process write operations of a first plurality of data words addressed to a memory bank. The method further comprises writing a second plurality of data words and associated memory addresses into a cache memory, and wherein each data word of the second plurality of data words is associated with a pending operation. Additionally, the method comprises detecting a power up signal and responsive to the power up signal, transferring the second plurality of data words and associated memory addresses from the secure memory storage area to the cache memory. Finally, responsive to the transferring, and before the memory device is powered up, the method comprises processing the second plurality of
(Continued)

data words and associated memory addresses from the cache memory to the pipeline for writing data to the memory bank during power up.

20 Claims, 21 Drawing Sheets

(51) Int. Cl.
   *G06F 12/0804* (2016.01)
   *G11C 7/20* (2006.01)
   *G11C 7/10* (2006.01)
   *G11C 14/00* (2006.01)

(52) U.S. Cl.
   CPC ............ *G11C 7/20* (2013.01); *G11C 11/1653* (2013.01); *G11C 11/1673* (2013.01); *G11C 11/1677* (2013.01); *G11C 11/1697* (2013.01); *G11C 13/0033* (2013.01); *G11C 14/0081* (2013.01)

(58) Field of Classification Search
   CPC ..... G11C 14/0081; G11C 7/1039; G11C 7/20; G11C 2211/5614
   See application file for complete search history.

(56) References Cited

U.S. PATENT DOCUMENTS

| | | | |
|---|---|---|---|
| 5,559,952 A | 9/1996 | Fujimoto |
| 5,629,549 A | 5/1997 | Johnson |
| 5,640,343 A | 6/1997 | Gallagher et al. |
| 5,654,566 A | 8/1997 | Johnson |
| 5,691,936 A | 11/1997 | Sakakima et al. |
| 5,695,846 A | 12/1997 | Lange et al. |
| 5,695,864 A | 12/1997 | Zlonczewski |
| 5,732,016 A | 3/1998 | Chen et al. |
| 5,751,647 A | 5/1998 | O'Toole |
| 5,856,897 A | 1/1999 | Mauri |
| 5,896,252 A | 4/1999 | Kanai |
| 5,966,323 A | 10/1999 | Chen et al. |
| 6,016,269 A | 1/2000 | Peterson et al. |
| 6,055,179 A | 4/2000 | Koganei et al. |
| 6,064,948 A | 5/2000 | West |
| 6,075,941 A | 6/2000 | Itoh |
| 6,097,579 A | 8/2000 | Gill |
| 6,112,295 A | 8/2000 | Bhamidipati et al. |
| 6,124,711 A | 9/2000 | Tanaka et al. |
| 6,134,138 A | 10/2000 | Lu et al. |
| 6,140,838 A | 10/2000 | Johnson |
| 6,154,139 A | 11/2000 | Kanai et al. |
| 6,154,349 A | 11/2000 | Kanai et al. |
| 6,172,902 B1 | 1/2001 | Wegrowe et al. |
| 6,233,172 B1 | 5/2001 | Chen et al. |
| 6,233,690 B1 | 5/2001 | Choi et al. |
| 6,243,288 B1 | 6/2001 | Ishikawa et al. |
| 6,252,798 B1 | 6/2001 | Satoh et al. |
| 6,256,223 B1 | 7/2001 | Sun |
| 6,292,389 B1 | 9/2001 | Chen et al. |
| 6,347,049 B1 | 2/2002 | Childress et al. |
| 6,376,260 B1 | 4/2002 | Chen et al. |
| 6,385,082 B1 | 5/2002 | Abraham et al. |
| 6,436,526 B1 | 8/2002 | Odagawa et al. |
| 6,442,681 B1 | 8/2002 | Ryan et al. |
| 6,447,935 B1 | 9/2002 | Zhang et al. |
| 6,458,603 B1 | 10/2002 | Kersch et al. |
| 6,493,197 B2 | 12/2002 | Ito et al. |
| 6,522,137 B1 | 2/2003 | Sun et al. |
| 6,532,164 B2 | 3/2003 | Redon et al. |
| 6,538,918 B2 | 3/2003 | Swanson et al. |
| 6,545,903 B1 | 4/2003 | Savtchenko et al. |
| 6,545,906 B1 | 4/2003 | Savtchenko et al. |
| 6,563,681 B1 | 5/2003 | Sasaki et al. |
| 6,566,246 B1 | 5/2003 | deFelipe et al. |
| 6,603,677 B2 | 8/2003 | Redon et al. |
| 6,608,776 B2 | 8/2003 | Hidaka |
| 6,635,367 B2 | 10/2003 | Igarashi et al. |
| 6,653,153 B2 | 11/2003 | Doan et al. |
| 6,654,278 B1 | 11/2003 | Engel et al. |
| 6,677,165 B1 | 1/2004 | Lu et al. |
| 6,710,984 B1 | 3/2004 | Yuasa et al. |
| 6,713,195 B2 | 3/2004 | Wang et al. |
| 6,714,444 B2 | 3/2004 | Huai et al. |
| 6,731,537 B2 | 5/2004 | Kanamori |
| 6,744,086 B2 | 6/2004 | Daughton et al. |
| 6,750,491 B2 | 6/2004 | Sharma et al. |
| 6,751,074 B2 | 6/2004 | Inomata et al. |
| 6,765,824 B2 | 7/2004 | Kishi et al. |
| 6,772,036 B2 | 8/2004 | Eryurek et al. |
| 6,773,515 B2 | 8/2004 | Li et al. |
| 6,777,730 B2 | 8/2004 | Daughton et al. |
| 6,785,159 B2 | 8/2004 | Tuttle |
| 6,807,091 B2 | 10/2004 | Saito |
| 6,812,437 B2 | 11/2004 | Levy |
| 6,829,161 B2 | 12/2004 | Huai et al. |
| 6,835,423 B2 | 12/2004 | Chen et al. |
| 6,838,740 B2 | 1/2005 | Huai et al. |
| 6,839,821 B2 | 1/2005 | Estakhri |
| 6,842,317 B2 | 1/2005 | Sugita et al. |
| 6,842,366 B2 | 1/2005 | Chan |
| 6,847,547 B2 | 1/2005 | Albert et al. |
| 6,879,512 B2 | 4/2005 | Luo |
| 6,887,719 B2 | 5/2005 | Lu et al. |
| 6,888,742 B1 | 5/2005 | Nguyen et al. |
| 6,902,807 B1 | 6/2005 | Argitia et al. |
| 6,906,369 B2 | 6/2005 | Ross et al. |
| 6,920,063 B2 | 7/2005 | Huai et al. |
| 6,933,155 B2 | 8/2005 | Albert et al. |
| 6,936,479 B2 | 8/2005 | Sharma |
| 6,938,142 B2 | 8/2005 | Pawlowski |
| 6,956,257 B2 | 10/2005 | Zhu et al. |
| 6,958,927 B1 | 10/2005 | Nguyen et al. |
| 6,967,863 B2 | 11/2005 | Huai |
| 6,980,469 B2 | 12/2005 | Kent et al. |
| 6,984,529 B2 | 1/2006 | Stojakovic et al. |
| 6,985,385 B2 | 1/2006 | Nguyen et al. |
| 6,992,359 B2 | 1/2006 | Nguyen et al. |
| 6,995,962 B2 | 2/2006 | Saito et al. |
| 7,002,839 B2 | 2/2006 | Kawabata et al. |
| 7,005,958 B2 | 2/2006 | Wan |
| 7,006,371 B2 | 2/2006 | Matsuoka |
| 7,006,375 B2 | 2/2006 | Covington |
| 7,009,877 B1 | 3/2006 | Huai et al. |
| 7,033,126 B2 | 4/2006 | Van Den Berg |
| 7,041,598 B2 | 5/2006 | Sharma |
| 7,045,358 B2 | 5/2006 | Hong et al. |
| 7,045,368 B2 | 5/2006 | Hong et al. |
| 7,054,119 B2 | 5/2006 | Sharma et al. |
| 7,057,922 B2 | 6/2006 | Fukumoto |
| 7,095,646 B2 | 8/2006 | Slaughter et al. |
| 7,098,494 B2 | 8/2006 | Pakala et al. |
| 7,106,624 B2 | 9/2006 | Huai et al. |
| 7,110,287 B2 | 9/2006 | Huai et al. |
| 7,149,106 B2 | 12/2006 | Mancoff et al. |
| 7,161,829 B2 | 1/2007 | Huai et al. |
| 7,170,778 B2 | 1/2007 | Kent et al. |
| 7,187,577 B1 | 3/2007 | Wang |
| 7,190,611 B2 | 3/2007 | Nguyen et al. |
| 7,203,129 B2 | 4/2007 | Lin et al. |
| 7,203,302 B2 | 4/2007 | Huras |
| 7,227,773 B1 | 6/2007 | Nguyen et al. |
| 7,233,039 B2 | 6/2007 | Huai et al. |
| 7,242,045 B2 | 7/2007 | Nguyen et al. |
| 7,245,462 B2 | 7/2007 | Huai et al. |
| 7,262,941 B2 | 8/2007 | Li et al. |
| 7,273,780 B2 | 9/2007 | Kim |
| 7,283,333 B2 | 10/2007 | Gill |
| 7,307,876 B2 | 12/2007 | Kent et al. |
| 7,313,015 B2 | 12/2007 | Bessho |
| 7,324,387 B1 | 1/2008 | Bergemont et al. |
| 7,335,960 B2 | 2/2008 | Han et al. |
| 7,351,494 B2 | 4/2008 | Bae et al. |
| 7,351,594 B2 | 4/2008 | Bae et al. |
| 7,352,021 B2 | 4/2008 | Bae et al. |

(56) References Cited

U.S. PATENT DOCUMENTS

| | | |
|---|---|---|
| 7,369,427 B2 | 5/2008 | Diao et al. |
| 7,372,722 B2 | 5/2008 | Jeong |
| 7,376,006 B2 | 5/2008 | Bednorz et al. |
| 7,386,765 B2 | 6/2008 | Ellis |
| 7,404,017 B2 | 7/2008 | Kuo |
| 7,436,699 B2 | 10/2008 | Tanizaki |
| 7,449,345 B2 | 11/2008 | Horng et al. |
| 7,453,719 B2 | 11/2008 | Sakimura |
| 7,476,919 B2 | 1/2009 | Hong et al. |
| 7,502,249 B1 | 3/2009 | Ding |
| 7,502,253 B2 | 3/2009 | Rizzo |
| 7,508,042 B2 | 3/2009 | Guo |
| 7,511,985 B2 | 3/2009 | Horii |
| 7,515,458 B2 | 4/2009 | Hung et al. |
| 7,532,503 B2 | 5/2009 | Morise et al. |
| 7,541,117 B2 | 6/2009 | Ogawa |
| 7,542,326 B2 | 6/2009 | Yoshimura |
| 7,573,737 B2 | 8/2009 | Kent et al. |
| 7,576,956 B2 | 8/2009 | Huai |
| 7,582,166 B2 | 9/2009 | Lampe |
| 7,598,555 B1 | 10/2009 | Papworth-Parkin |
| 7,602,000 B2 | 10/2009 | Sun et al. |
| 7,619,431 B2 | 11/2009 | DeWilde et al. |
| 7,642,612 B2 | 1/2010 | Izumi et al. |
| 7,660,161 B2 | 2/2010 | Van Tran |
| 7,663,171 B2 | 2/2010 | Inokuchi et al. |
| 7,675,792 B2 | 3/2010 | Bedeschi |
| 7,696,551 B2 | 4/2010 | Xiao |
| 7,733,699 B2 | 6/2010 | Roohparvar |
| 7,773,439 B2 | 8/2010 | Do et al. |
| 7,776,665 B2 | 8/2010 | Izumi et al. |
| 7,796,439 B2 | 9/2010 | Arai |
| 7,821,818 B2 | 10/2010 | Dieny et al. |
| 7,852,662 B2 | 12/2010 | Yang |
| 7,861,141 B2 | 12/2010 | Chen |
| 7,881,095 B2 | 2/2011 | Lu |
| 7,911,832 B2 | 3/2011 | Kent et al. |
| 7,916,515 B2 | 3/2011 | Li |
| 7,936,595 B2 | 5/2011 | Han et al. |
| 7,936,598 B2 | 5/2011 | Zheng et al. |
| 7,954,006 B1 | 5/2011 | Mangipudi |
| 7,983,077 B2 | 7/2011 | Park |
| 7,986,544 B2 | 7/2011 | Kent et al. |
| 8,008,095 B2 | 8/2011 | Assefa et al. |
| 8,041,879 B2 | 10/2011 | Erez |
| 8,058,925 B2 | 11/2011 | Rasmussen |
| 8,077,496 B2 | 12/2011 | Choi |
| 8,080,365 B2 | 12/2011 | Nozaki |
| 8,088,556 B2 | 1/2012 | Nozaki |
| 8,094,480 B2 | 1/2012 | Tonomura |
| 8,102,701 B2 | 1/2012 | Prejbeanu et al. |
| 8,105,948 B2 | 1/2012 | Zhong et al. |
| 8,120,949 B2 | 2/2012 | Ranjan et al. |
| 8,143,683 B2 | 3/2012 | Wang et al. |
| 8,144,509 B2 | 3/2012 | Jung |
| 8,148,970 B2 | 4/2012 | Fuse |
| 8,159,867 B2 | 4/2012 | Cho et al. |
| 8,201,024 B2 | 6/2012 | Burger |
| 8,223,534 B2 | 7/2012 | Chung |
| 8,255,742 B2 | 8/2012 | Ipek et al. |
| 8,278,996 B2 | 10/2012 | Miki |
| 8,279,666 B2 | 10/2012 | Dieny et al. |
| 8,295,073 B2 | 10/2012 | Norman |
| 8,295,082 B2 | 10/2012 | Chua-Eoan |
| 8,334,213 B2 | 12/2012 | Mao |
| 8,345,474 B2 | 1/2013 | Oh |
| 8,349,536 B2 | 1/2013 | Nozaki |
| 8,362,580 B2 | 1/2013 | Chen et al. |
| 8,363,465 B2 | 1/2013 | Kent et al. |
| 8,386,836 B2 | 2/2013 | Burger |
| 8,415,650 B2 | 4/2013 | Greene |
| 8,416,620 B2 | 4/2013 | Zheng et al. |
| 8,422,286 B2 | 4/2013 | Ranjan et al. |
| 8,432,727 B2 | 4/2013 | Ryu |
| 8,441,844 B2 | 5/2013 | El Baraji |
| 8,456,883 B1 | 6/2013 | Liu |
| 8,456,926 B2 | 6/2013 | Ong et al. |
| 8,477,530 B2 | 7/2013 | Ranjan et al. |
| 8,492,881 B2 | 7/2013 | Kuroiwa et al. |
| 8,495,432 B2 | 7/2013 | Dickens |
| 8,535,952 B2 | 9/2013 | Ranjan et al. |
| 8,539,303 B2 | 9/2013 | Lu |
| 8,542,524 B2 | 9/2013 | Keshtbod et al. |
| 8,549,303 B2 | 10/2013 | Fifield et al. |
| 8,558,334 B2 | 10/2013 | Ueki et al. |
| 8,559,215 B2 | 10/2013 | Zhou et al. |
| 8,574,928 B2 | 11/2013 | Satoh et al. |
| 8,582,353 B2 | 11/2013 | Lee |
| 8,590,139 B2 | 11/2013 | Op DeBeeck et al. |
| 8,592,927 B2 | 11/2013 | Jan |
| 8,593,868 B2 | 11/2013 | Park |
| 8,609,439 B2 | 12/2013 | Prejbeanu et al. |
| 8,617,408 B2 | 12/2013 | Balamane |
| 8,625,339 B2 | 1/2014 | Ong |
| 8,634,232 B2 | 1/2014 | Oh |
| 8,687,415 B2 | 4/2014 | Parkin et al. |
| 8,716,317 B2 | 5/2014 | Saida |
| 8,716,817 B2 | 5/2014 | Saida |
| 8,716,818 B2 | 5/2014 | Yoshikawa et al. |
| 8,722,543 B2 | 5/2014 | Belen |
| 8,737,137 B1 | 5/2014 | Choy et al. |
| 8,755,222 B2 | 6/2014 | Kent et al. |
| 8,779,410 B2 | 7/2014 | Sato et al. |
| 8,780,617 B2 | 7/2014 | Kang |
| 8,792,269 B1 | 7/2014 | Abedifard |
| 8,802,451 B2 | 8/2014 | Malmhall |
| 8,810,974 B2 | 8/2014 | Noel et al. |
| 8,817,525 B2 | 8/2014 | Ishihara |
| 8,852,760 B2 | 10/2014 | Wang et al. |
| 8,853,807 B2 | 10/2014 | Son et al. |
| 8,860,156 B2 | 10/2014 | Beach et al. |
| 8,867,258 B2 | 10/2014 | Rao |
| 8,883,520 B2 | 11/2014 | Satoh et al. |
| 8,902,628 B2 | 12/2014 | Ha |
| 8,966,345 B2 | 2/2015 | Wilkerson et al. |
| 8,987,849 B2 | 3/2015 | Jan |
| 9,019,754 B1 | 4/2015 | Bedeschi |
| 9,026,888 B2 | 5/2015 | Kwok |
| 9,036,407 B2 | 5/2015 | Wang et al. |
| 9,043,674 B2 | 5/2015 | Wu et al. |
| 9,070,441 B2 | 6/2015 | Otsuka et al. |
| 9,070,855 B2 | 6/2015 | Gan et al. |
| 9,082,888 B2 | 7/2015 | Kent et al. |
| 9,104,595 B2 | 8/2015 | Sah |
| 9,130,155 B2 | 9/2015 | Chepulskyy et al. |
| 9,136,463 B2 | 9/2015 | Li |
| 9,140,747 B2 | 9/2015 | Kim |
| 9,165,629 B2 | 10/2015 | Chih |
| 9,165,787 B2 | 10/2015 | Kang |
| 9,166,155 B2 | 10/2015 | Deshpande |
| 9,189,326 B2 | 11/2015 | Kalamatianos |
| 9,190,471 B2 | 11/2015 | Yi et al. |
| 9,196,332 B2 | 11/2015 | Zhang et al. |
| 9,229,853 B2 | 1/2016 | Khan et al. |
| 9,231,191 B2 | 1/2016 | Huang et al. |
| 9,245,608 B2 | 1/2016 | Chen et al. |
| 9,250,990 B2 | 2/2016 | Motwani et al. |
| 9,251,896 B2 | 2/2016 | Ikeda |
| 9,257,483 B2 | 2/2016 | Ishigaki |
| 9,263,667 B1 | 2/2016 | Pinarbasi |
| 9,286,186 B2 | 3/2016 | Weiss |
| 9,298,552 B2 | 3/2016 | Leem et al. |
| 9,299,412 B2 | 3/2016 | Naeimi et al. |
| 9,317,429 B2 | 4/2016 | Ramanujan et al. |
| 9,330,791 B2 | 5/2016 | Cho |
| 9,337,412 B2 | 5/2016 | Pinarbasi et al. |
| 9,341,939 B1 | 5/2016 | Yu et al. |
| 9,362,486 B2 | 6/2016 | Kim et al. |
| 9,378,817 B2 | 6/2016 | Kawai |
| 9,379,314 B2 | 6/2016 | Park et al. |
| 9,396,991 B2 | 7/2016 | Arvin et al. |
| 9,401,336 B2 | 7/2016 | Arvin et al. |
| 9,406,876 B2 | 8/2016 | Pinarbasi |
| 9,418,721 B2 | 8/2016 | Bose et al. |

(56) References Cited

U.S. PATENT DOCUMENTS

| | | |
|---|---|---|
| 9,449,720 B1 | 9/2016 | Lung |
| 9,450,180 B1 | 9/2016 | Annunziata |
| 9,455,013 B2 | 9/2016 | Kim |
| 9,466,789 B2 | 10/2016 | Wang et al. |
| 9,472,282 B2 | 10/2016 | Lee |
| 9,472,748 B2 | 10/2016 | Kuo et al. |
| 9,484,527 B2 | 11/2016 | Han et al. |
| 9,488,416 B2 | 11/2016 | Fujita et al. |
| 9,490,054 B2 | 11/2016 | Jan |
| 9,508,456 B1 | 11/2016 | Shim |
| 9,548,116 B2 | 1/2017 | Roy |
| 9,548,445 B2 | 1/2017 | Lee et al. |
| 9,553,102 B2 | 1/2017 | Wang |
| 9,583,167 B2 | 2/2017 | Chung |
| 9,594,683 B2 | 3/2017 | Dittrich |
| 9,608,038 B2 | 3/2017 | Wang et al. |
| 9,634,237 B2 | 4/2017 | Lee et al. |
| 9,662,925 B2 | 5/2017 | Raksha et al. |
| 9,720,516 B2 | 8/2017 | Yu |
| 9,728,712 B2 | 8/2017 | Kardasz et al. |
| 9,741,926 B1 | 8/2017 | Pinarbasi et al. |
| 9,772,555 B2 | 9/2017 | Park et al. |
| 9,773,974 B2 | 9/2017 | Pinarbasi et al. |
| 9,780,300 B2 | 10/2017 | Zhou et al. |
| 9,793,319 B2 | 10/2017 | Gan et al. |
| 9,853,006 B2 | 12/2017 | Arvin et al. |
| 9,853,206 B2 | 12/2017 | Pinarbasi et al. |
| 9,853,292 B2 | 12/2017 | Loveridge et al. |
| 9,858,976 B2 | 1/2018 | Ikegami |
| 9,859,333 B2 | 1/2018 | Kim et al. |
| 9,865,806 B2 | 1/2018 | Choi et al. |
| 9,935,258 B2 | 4/2018 | Chen et al. |
| 10,008,662 B2 | 6/2018 | You |
| 10,026,609 B2 | 7/2018 | Sreenivasan et al. |
| 10,038,137 B2 | 7/2018 | Chuang |
| 10,043,851 B1 | 8/2018 | Shen |
| 10,043,967 B2 | 8/2018 | Chen |
| 10,062,837 B2 | 8/2018 | Kim et al. |
| 10,115,446 B1 | 10/2018 | Louie et al. |
| 10,134,988 B2 | 11/2018 | Fennimore et al. |
| 10,163,479 B2 | 12/2018 | Berger et al. |
| 10,186,614 B2 | 1/2019 | Asami |
| 2002/0090533 A1 | 7/2002 | Zhang et al. |
| 2002/0105823 A1 | 8/2002 | Redon et al. |
| 2003/0085186 A1 | 5/2003 | Fujioka |
| 2003/0117840 A1 | 6/2003 | Sharma et al. |
| 2003/0151944 A1 | 8/2003 | Saito |
| 2003/0197984 A1 | 10/2003 | Inomata et al. |
| 2003/0218903 A1 | 11/2003 | Luo |
| 2004/0012994 A1 | 1/2004 | Slaughter et al. |
| 2004/0026369 A1 | 2/2004 | Ying |
| 2004/0061154 A1 | 4/2004 | Huai et al. |
| 2004/0094785 A1 | 5/2004 | Zhu et al. |
| 2004/0130936 A1 | 7/2004 | Nguyen et al. |
| 2004/0173315 A1 | 9/2004 | Leung |
| 2004/0257717 A1 | 12/2004 | Sharma et al. |
| 2005/0029551 A1 | 2/2005 | Atwood et al. |
| 2005/0041342 A1 | 2/2005 | Huai et al. |
| 2005/0051820 A1 | 3/2005 | Stojakovic et al. |
| 2005/0063222 A1 | 3/2005 | Huai et al. |
| 2005/0104101 A1 | 5/2005 | Sun et al. |
| 2005/0128842 A1 | 6/2005 | Wei |
| 2005/0136600 A1 | 6/2005 | Huai |
| 2005/0158881 A1 | 7/2005 | Sharma |
| 2005/0180202 A1 | 8/2005 | Huai et al. |
| 2005/0184839 A1 | 8/2005 | Nguyen et al. |
| 2005/0201023 A1 | 9/2005 | Huai et al. |
| 2005/0237787 A1 | 10/2005 | Huai et al. |
| 2005/0251628 A1 | 11/2005 | Jarvis et al. |
| 2005/0280058 A1 | 12/2005 | Pakala et al. |
| 2006/0018057 A1 | 1/2006 | Huai |
| 2006/0049472 A1 | 3/2006 | Diao et al. |
| 2006/0077734 A1 | 4/2006 | Fong |
| 2006/0087880 A1 | 4/2006 | Mancoff et al. |
| 2006/0092696 A1 | 5/2006 | Bessho |
| 2006/0132990 A1 | 6/2006 | Morise et al. |
| 2006/0227465 A1 | 10/2006 | Inokuchi et al. |
| 2006/0271755 A1* | 11/2006 | Miura ............... G06F 11/1068 711/165 |
| 2006/0291305 A1 | 12/2006 | Suzuki et al. |
| 2007/0019337 A1 | 1/2007 | Apalkov et al. |
| 2007/0096229 A1 | 5/2007 | Yoshikawa |
| 2007/0220935 A1 | 9/2007 | Cernea |
| 2007/0226592 A1 | 9/2007 | Radke |
| 2007/0242501 A1 | 10/2007 | Hung et al. |
| 2008/0049488 A1 | 2/2008 | Rizzo |
| 2008/0079530 A1 | 4/2008 | Weidman et al. |
| 2008/0112094 A1 | 5/2008 | Kent et al. |
| 2008/0144376 A1 | 6/2008 | Lee |
| 2008/0151614 A1 | 6/2008 | Guo |
| 2008/0259508 A2 | 10/2008 | Kent et al. |
| 2008/0276040 A1 | 11/2008 | Moritoki |
| 2008/0294938 A1* | 11/2008 | Kondo ............... G06F 11/1068 714/24 |
| 2008/0297292 A1 | 12/2008 | Viala et al. |
| 2009/0040825 A1 | 2/2009 | Adusumilli et al. |
| 2009/0046501 A1 | 2/2009 | Ranjan et al. |
| 2009/0072185 A1 | 3/2009 | Raksha et al. |
| 2009/0091037 A1 | 4/2009 | Assefa et al. |
| 2009/0098413 A1 | 4/2009 | Kanegae |
| 2009/0146231 A1 | 6/2009 | Kuper et al. |
| 2009/0161421 A1 | 6/2009 | Cho et al. |
| 2009/0209102 A1 | 8/2009 | Zhong et al. |
| 2009/0231909 A1 | 9/2009 | Dieny |
| 2009/0265514 A1 | 10/2009 | Biles et al. |
| 2010/0110803 A1 | 5/2010 | Arai |
| 2010/0124091 A1 | 5/2010 | Cowburn |
| 2010/0161892 A1 | 6/2010 | Dama et al. |
| 2010/0162065 A1 | 6/2010 | Norman |
| 2010/0193891 A1 | 8/2010 | Wang et al. |
| 2010/0195401 A1 | 8/2010 | Jeong et al. |
| 2010/0246254 A1 | 9/2010 | Prejbeanu et al. |
| 2010/0271090 A1 | 10/2010 | Rasmussen |
| 2010/0271870 A1 | 10/2010 | Zheng et al. |
| 2010/0290275 A1 | 11/2010 | Park et al. |
| 2011/0032645 A1 | 2/2011 | Noel et al. |
| 2011/0058412 A1 | 3/2011 | Zheng et al. |
| 2011/0061786 A1 | 3/2011 | Mason |
| 2011/0089511 A1 | 4/2011 | Keshtbod et al. |
| 2011/0133298 A1 | 6/2011 | Chen et al. |
| 2011/0310691 A1* | 12/2011 | Zhou ..................... G11C 8/16 365/230.03 |
| 2011/0320696 A1 | 12/2011 | Fee et al. |
| 2012/0052258 A1 | 3/2012 | Op DeBeeck et al. |
| 2012/0069649 A1 | 3/2012 | Ranjan et al. |
| 2012/0127804 A1 | 5/2012 | Ong et al. |
| 2012/0155156 A1 | 6/2012 | Watts |
| 2012/0155158 A1 | 6/2012 | Higo et al. |
| 2012/0163113 A1 | 6/2012 | Hatano et al. |
| 2012/0280336 A1 | 6/2012 | Watts |
| 2012/0181642 A1 | 7/2012 | Prejbeanu et al. |
| 2012/0188818 A1 | 7/2012 | Ranjan et al. |
| 2012/0191900 A1 | 7/2012 | Kinimatsu et al. |
| 2012/0254636 A1 | 10/2012 | Tsukamoto et al. |
| 2012/0280339 A1 | 11/2012 | Zhang et al. |
| 2012/0294078 A1 | 11/2012 | Kent et al. |
| 2012/0299133 A1 | 11/2012 | Son et al. |
| 2012/0324274 A1 | 12/2012 | Hori |
| 2013/0001506 A1 | 1/2013 | Sato et al. |
| 2013/0001652 A1 | 1/2013 | Yoshikawa et al. |
| 2013/0021841 A1 | 1/2013 | Zhou et al. |
| 2013/0107633 A1 | 5/2013 | Kim |
| 2013/0244344 A1 | 9/2013 | Malmhall et al. |
| 2013/0267042 A1 | 10/2013 | Satoh et al. |
| 2013/0270661 A1 | 10/2013 | Yi et al. |
| 2013/0275691 A1 | 10/2013 | Chew |
| 2013/0307097 A1 | 11/2013 | Yi et al. |
| 2013/0341801 A1 | 12/2013 | Satoh et al. |
| 2014/0009994 A1 | 1/2014 | Parkin et al. |
| 2014/0042571 A1 | 2/2014 | Gan et al. |
| 2014/0063949 A1 | 3/2014 | Tokiwa |
| 2014/0070341 A1 | 3/2014 | Beach et al. |
| 2014/0089762 A1 | 3/2014 | Pangal et al. |
| 2014/0103472 A1 | 4/2014 | Kent et al. |

(56) References Cited

U.S. PATENT DOCUMENTS

| | | | |
|---|---|---|---|
| 2014/0136870 A1* | 5/2014 | Breternitz | G06F 1/3203 713/323 |
| 2014/0149827 A1 | 5/2014 | Kim et al. | |
| 2014/0151837 A1 | 6/2014 | Ryu | |
| 2014/0169085 A1 | 6/2014 | Wang et al. | |
| 2014/0177316 A1 | 6/2014 | Otsuka et al. | |
| 2014/0217531 A1 | 8/2014 | Jan | |
| 2014/0219034 A1 | 8/2014 | Gomez et al. | |
| 2014/0252439 A1 | 9/2014 | Guo | |
| 2014/0264671 A1 | 9/2014 | Chepulskyy et al. | |
| 2014/0281284 A1 | 9/2014 | Block et al. | |
| 2014/0289358 A1 | 9/2014 | Lindamood et al. | |
| 2015/0056368 A1 | 2/2015 | Wang et al. | |
| 2015/0098287 A1 | 4/2015 | Lee | |
| 2015/0135039 A1* | 5/2015 | Mekhanik | G06F 11/1072 714/773 |
| 2015/0143343 A1 | 5/2015 | Weiss et al. | |
| 2015/0154116 A1 | 6/2015 | Dittrich et al. | |
| 2015/0206568 A1 | 7/2015 | Bose et al. | |
| 2015/0206569 A1 | 7/2015 | Bose et al. | |
| 2015/0242269 A1 | 8/2015 | Pelley et al. | |
| 2015/0262701 A1 | 9/2015 | Takizawa | |
| 2015/0278011 A1 | 10/2015 | Keppel et al. | |
| 2015/0279904 A1 | 10/2015 | Pinarbasi et al. | |
| 2015/0378814 A1 | 12/2015 | Webb et al. | |
| 2015/0380088 A1 | 12/2015 | Naeimi et al. | |
| 2016/0027525 A1 | 1/2016 | Kim et al. | |
| 2016/0070474 A1* | 3/2016 | Yu | G06F 3/0608 711/103 |
| 2016/0085443 A1 | 3/2016 | Tomishima et al. | |
| 2016/0085621 A1 | 3/2016 | Motwani et al. | |
| 2016/0085692 A1 | 3/2016 | Kwok | |
| 2016/0086600 A1 | 3/2016 | Bauer et al. | |
| 2016/0087193 A1 | 3/2016 | Pinarbasi et al. | |
| 2016/0163973 A1 | 6/2016 | Pinarbasi | |
| 2016/0218278 A1 | 7/2016 | Pinarbasi et al. | |
| 2016/0260486 A1 | 9/2016 | Tani | |
| 2016/0283385 A1 | 9/2016 | Boyd et al. | |
| 2016/0300615 A1 | 10/2016 | Lee | |
| 2016/0315118 A1 | 10/2016 | Kardasz et al. | |
| 2016/0378592 A1 | 12/2016 | Ikegami et al. | |
| 2017/0062712 A1 | 3/2017 | Choi et al. | |
| 2017/0084322 A1 | 3/2017 | Wang et al. | |
| 2017/0123991 A1 | 5/2017 | Sela et al. | |
| 2017/0133104 A1 | 5/2017 | Darbari et al. | |
| 2017/0199459 A1 | 7/2017 | Ryu et al. | |
| 2018/0018134 A1 | 1/2018 | Kang | |
| 2018/0033957 A1 | 2/2018 | Zhang | |
| 2018/0097006 A1 | 4/2018 | Kim et al. | |
| 2018/0114589 A1 | 4/2018 | El-Baraji et al. | |
| 2018/0119278 A1 | 5/2018 | Kornmeyer | |
| 2018/0121117 A1 | 5/2018 | Berger et al. | |
| 2018/0121355 A1 | 5/2018 | Berger et al. | |
| 2018/0121361 A1 | 5/2018 | Berger et al. | |
| 2018/0122446 A1 | 5/2018 | Berger et al. | |
| 2018/0122447 A1 | 5/2018 | Berger et al. | |
| 2018/0122448 A1 | 5/2018 | Berger et al. | |
| 2018/0122449 A1 | 5/2018 | Berger et al. | |
| 2018/0122450 A1 | 5/2018 | Berger et al. | |
| 2018/0130945 A1 | 5/2018 | Choi et al. | |
| 2018/0211821 A1 | 7/2018 | Kogler | |
| 2018/0233362 A1 | 8/2018 | Glodde | |
| 2018/0233363 A1 | 8/2018 | Glodde | |
| 2018/0248110 A1 | 8/2018 | Kardasz et al. | |
| 2018/0248113 A1 | 8/2018 | Pinarbasi et al. | |
| 2018/0331279 A1 | 11/2018 | Shen | |

FOREIGN PATENT DOCUMENTS

| | | |
|---|---|---|
| EP | 1345277 | 9/2003 |
| FR | 2817998 | 6/2002 |
| FR | 2832542 | 5/2003 |
| FR | 2910716 | 6/2008 |
| JP | H10-004012 | 1/1998 |
| JP | H11-120758 | 4/1999 |
| JP | H11-352867 | 12/1999 |
| JP | 2001-195878 | 7/2001 |
| JP | 2002-261352 | 9/2002 |
| JP | 2002-357489 | 12/2002 |
| JP | 2003-318461 | 11/2003 |
| JP | 2005-044848 | 2/2005 |
| JP | 2005-150482 | 6/2005 |
| JP | 2005-535111 | 11/2005 |
| JP | 2006128579 | 5/2006 |
| JP | 2008-524830 | 7/2008 |
| JP | 2009-027177 | 2/2009 |
| JP | 2013-012546 | 1/2013 |
| JP | 2014-039061 | 2/2014 |
| JP | 5635666 | 12/2014 |
| JP | 2015-002352 | 1/2015 |
| KR | 10-2012-0053953 | 5/2012 |
| KR | 10-2014-015246 | 9/2014 |
| WO | 2009-080636 | 7/2009 |
| WO | 2011-005484 | 1/2011 |
| WO | 2014-062681 | 4/2014 |

OTHER PUBLICATIONS

US 2016/0218273 A1, 06/2016, Pinarbasi (withdrawn)

Bhatti Sarpreet et al., "Spintronics Based Random Access Memory: a Review," Material Today, Nov. 2107, pp. 530-548, vol. 20, No. 9, Elsevier.

Helia Naeimi, et al., "STTRAM Scaling and Retention Failure," Intel Technology Journal, vol. 17, Issue 1, 2013, pp. 54-75 (22 pages).

S. Ikeda, et al., "A Perpendicular-Anisotropy CoFeB—MgO Magnetic Tunnel Junction", Nature Materials, vol. 9, Sep. 2010, pp. 721-724 (4 pages).

R.H. Kock, et al., "Thermally Assisted Magnetization Reversal in Submicron-Sized Magnetic Thin Films", Physical Review Letters, The American Physical Society, vol. 84, No. 23, Jun. 5, 2000, pp. 5419-5422 (4 pages).

K.J. Lee, et al., "Analytical Investigation of Spin-Transfer Dynamics Using Perpendicular-to-Plane Polarizer", Applied Physics Letters, American insitute of Physics, vol. 86, (2005), pp 022505-1 to 022505-3 (3 pages).

Kirsten Martens, et al., "Thermally Induced Magnetic Switching in Thin Ferromagnetic Annuli", NSF grants PHY-0351964 (DLS), 2005, 11 pages.

Kristen Martens, et al., "Magnetic Reversal in Nanoscropic Ferromagnetic Rings", NSF grants PHY-0351964 (DLS) 2005, 23 pages.

"Magnetic Technology Spintronics, Media and Interface", Data Storage Institute, R&D Highlights, Sep. 2010, 3 pages.

Daniel Scott Matic, "A Magnetic Tunnel Junction Compact Model for STT-RAM and MeRAM", Master Thesis University of California, Los Angeles, 2013, pp. 43.

* cited by examiner

METHOD OF WRITING CONTENTS IN MEMORY DURING A POWER UP SEQUENCE USING A DYNAMIC REDUNDANCY REGISTER IN A MEMORY DEVICE

CROSS-REFERENCE TO RELATED APPLICATION

The present application is a Continuation-in-part of, claims the benefit of and priority to U.S. application Ser. No. 15/277,799, filed Sep. 27, 2016, entitled "DEVICE WITH DYNAMIC REDUNDANCY REGISTERS" and hereby incorporated by reference in its entirety.

FIELD

The present patent document relates to registers that are added to devices, and more particularly registers added to random access memory (RAM). The methods and devices described herein are particularly useful in spin-transfer torque magnetic memory (STT-MRAM) devices.

BACKGROUND

Magnetoresistive random-access memory ("MRAM") is a non-volatile memory technology that stores data through magnetic storage elements. These magnetic storage elements are two ferromagnetic plates or electrodes that can hold a magnetic field and are separated by a non-magnetic material, such as a non-magnetic metal or insulator. In general, one of the plates has its magnetization pinned (i.e., a "reference layer"), meaning that this layer has a higher coercivity than the other layer and requires a larger magnetic field or spin-polarized current to change the orientation of its magnetization. The second plate is typically referred to as the free layer and its magnetization direction can be changed by a smaller magnetic field or spin-polarized current relative to the reference layer.

MRAM devices store information by changing the orientation of the magnetization of the free layer. In particular, based on whether the free layer is in a parallel or anti-parallel alignment relative to the reference layer, either a "1" or a "0" can be stored in each MRAM cell. Due to the spin-polarized electron tunneling effect, the electrical resistance of the cell changes due to the orientation of the magnetization of the two layers. The cell's resistance will be different for the parallel and anti-parallel states and thus the cell's resistance can be used to distinguish between a "1" and a "0." MRAM devices are generally considered as non-volatile memory devices since they maintain the information even when the power is off. The two plates can be sub-micron in lateral size and the magnetization direction can still be stable with respect to thermal fluctuations.

MRAM devices are considered as the next generation structures for a wide range of memory applications. MRAM products based on spin torque transfer switching are already making its way into large data storage devices. Spin transfer torque magnetic random access memory ("STT-MRAM") has an inherently stochastic write mechanism, wherein bits have certain probability of write failure on any given write cycle. The write failures are most generally random, and have a characteristic failure rate. A high write error rate (WER) may make the memory unreliable.

In memory devices, and especially STT-MRAM, methods and systems for verifying and re-writing data words are beneficial.

SUMMARY AND CLAIMABLE SUBJECT MATTER

In an embodiment, a device with dynamic redundancy registers is disclosed. In one aspect, a memory device comprising random access memory (RAM) device, and specifically an STT-MRAM device, is provided. The present disclosure provides backup dynamic redundancy registers that allow the device to operate with high write error rate (WER). The dynamic redundancy registers allow verifies, re-writes, and relocation of data words that fail to write correctly to a memory bank, generally, without loss of throughput, speed, or restriction on random access addressing.

In one aspect, the present disclosure teaches a memory bank that is coupled to an e1 register. The e1 register is coupled to the e2 register. The e1 register stores data words that are to be verified or re-written to the memory bank. The e1 register also stores an associated address for data words within the memory bank. Data words in the e1 register may be verified against data words in the memory bank at the associated address within the memory bank. If a system write operation fails on the memory bank, a re-write operation may be tried by writing a data word from the e1 register to the memory bank. The fact that the system write operation failed may be determined through a verify operation. Re-write operation from e1 register to memory bank may be tried as many times as necessary to successfully complete write operation or may not be tried at all. In one example, the number of re-write operations may be configurable based on control bit(s) associated with re-write attempts. In one aspect, the number of re-write operations may be configurable on a per-bank basis or per-segment of bank basis. These control bits may be stored in the e1 register and associated with a particular data word and communicated and updated as appropriate.

In one aspect, the re-write operation may be tried only when memory bank is idle (that is there are no write or read operations for that memory bank). In this way, re-write operations may be transparent to and with no delay of incoming system read and system write operations. After the desired number of re-write attempts (0 to n) from the e1 register, the memory device moves (relocates) data word from the e1 register to the e2 register. The memory device may also move associated address within memory bank for data word from the e1 register to the e2 register. In one aspect, the memory device does not comprise an e2 register. Instead, after a desired number of re-write attempts, the memory device relocates the data word and associated address from the e1 register to a secure area in memory reserved for storing data words associated with pending re-write and verify operations in the e1 register.

In one embodiment, a re-write operation may occur only once from the e1 register to the memory bank. The memory device then relocates the data word and associated address from the e1 register to the e2 register if the re-write operation failed. Alternatively, if there is no e2 register, the memory device then relocates the data word and associated address from the e1 register to the secure storage area in memory. Although explained with reference to one memory bank and two dynamic redundancy registers, one or more memory banks and two or more dynamic redundancy registers may also be used. Alternatively, in certain embodiments only one dynamic redundancy register may be used, e.g., embodiments without an e2 register.

Typically, the first level dynamic redundancy register (e1 register) may operate at clock cycle speed of memory bank (some operations may operate at clock cycle speed of memory bank while other operations may occur independent or multiples of memory bank clock cycle speed). The e1 register may be either non-volatile or volatile, and may typically comprise SRAM. The e1 register may also comprise a content addressable memory (CAM) array which allows reduced size of e1 register. In one embodiment, e1 register may be high-speed, smaller register than a last level register.

Typically, the last level dynamic redundancy register (e2 register) may operate at clock cycle speed of main memory bank (some operations may operate at clock cycle speed of memory bank while other operations may occur independent or multiples of memory bank clock cycle speed). The last level may be either non-volatile or volatile, and may typically comprise MRAM. The e2 register may also comprise a CAM. The last level dynamic register may beneficially comprise non-volatile memory which allows data to be backed up on power down. The e2 register typically prioritizes reliability over size as compared to memory bank. In one embodiment, the last level register may comprise more entries than the e1 register. In one embodiment, e2 register entries may be invalidated when a write operation occurs for a data word having associated address common with data word in e2 register. Alternatively, in an embodiment without an e2 register, entries in the secure memory storage area may be invalidated when a write operation occurs for a data word having an associated address common with data word in the secure memory storage.

In one aspect, the e1 register stores a data word and an associated address for data words in a pipeline structure that have not had an opportunity to verify. For example, a data word may not have an opportunity to verify because of row address change. That is, a write operation may occur on a different row address than a verify operation. Thus, the data word for a verify operation would be stored within e1 register and verify would be performed, if possible, on another data word from e1 register having common row address with the data word for write operation. This feature is especially beneficial in pseudo-dual port memory banks. A dual port memory bank allows read and write operations to be performed simultaneously. A pseudo-dual port allows read and write operations to be simultaneously (e.g., substantially within the same memory device clock cycle) performed on less than all ports. In one example, a pseudo-dual port MRAM may allow verify and write operations to be simultaneously performed as long as the operations share a common row address and different column addresses. In one aspect, a data word may be read from the e1 register rather than main memory bank if the data word failed to write or verify to memory bank.

In another aspect, the e1 or e2 register data word, associated address, and control bits can be deleted, overwritten, invalidated such that the data is not used, or otherwise considered garbage when another write operation for the same associated address occurs on the memory bank. In one aspect, a data word may be read from the e2 register rather than the main memory bank if such read operation is beneficial. For example, if e1 register relocated a data word to e2 register. In another aspect, data stored in the e2 SRAM and CAM is backed up onto the e2 non-volatile RAM for storage during power down. In another embodiment, data stored in e2 non-volatile RAM may be transferred to e2 volatile RAM during power up. In another aspect, the memory device may move data from the e1 register to the e2 register in order to free room in the e1 register. In another aspect, e2 register may not store data words and associated addresses but instead remap data words and associated addresses received from e1 register into a different area of memory bank. In another aspect e2 register may move data words to memory bank upon power down.

Typically, e2 register should be more reliable than memory bank because data may not be recoverable in case of e2 register failure. Thus, schemes can be implemented to increase reliability of e2 register. For example, e2 register may comprise status bits that allow data manipulation of a particular data word or other entry within e2 only if all or a predetermined number of status bits are set to one. In another scheme, multiple copies of data word may be maintained in e2 register and selected based on a voting scheme. In another scheme, a more stringent error correction code (ECC) scheme may be performed within e2 register than in memory bank. In another scheme, e2 register points to particular addresses within main memory for storing data words rather than storing the data word within e2 itself.

In one embodiment of the present invention, only one dynamic redundancy register, e.g., the e1 register may be used in a memory device. In other words, the memory device will have no e2 register. In one embodiment, upon receiving the power down signal, the e1 register may attempt to perform all the pending operations, e.g., verify and re-write operations associated with the data words stored in the e1 register prior to shutting down. In other words, upon receiving the power down signal, the e1 register may attempt to perform all the pending verify operations and move all the data words associated with pending re-write operations (e.g. operations that have failed verification) stored within it to the appropriate corresponding locations in the memory bank. In one embodiment, if the verify operations and re-write operations succeed, the corresponding entries for the data words in the e1 register may be deleted prior to shutting down (if the e1 register comprises non-volatile memory). Any data words in the e1 register that could not be successfully re-written or verified prior to shutting down will be stored in a secure memory storage area. In one embodiment, the memory device ensures that data is written securely to the secure memory storage area by using one or multiple schemes including voting, error-correcting code (ECC), or storing multiple copies.

In one embodiment where only the e1 register is used, upon power up of the memory device and receipt of power up signal, another attempt can be made to perform all the pending re-write or verify operations using the associated addresses for the data words. As stated above, subsequent to powering down, the secure memory storage area will comprise data words (with their associated addresses) that have not yet been verified or that have failed verification. The verify and re-write operations can be directly attempted from the secure memory storage area or they can be recalled to the e1 register prior to processing the pending operations to the pipeline. In one embodiment, if the attempt to verify or write the data words back to memory on power up succeeds, the corresponding entries for the data words in the secure memory storage area or the e1 register may be deleted. Any data words that could not be successfully re-written or verified subsequent to powering up will be stored in the e1 register.

In one aspect, the present disclosure teaches an access method and system into memory banks. Pseudo-dual ports allow using the disclosed Y-mux structure to simultaneously perform verify and write operations on two data words sharing a common row address (e.g., sharing a common word line). In other embodiments, dual port memory bank could allow simultaneous read and write operations. The Y-mux structure of the present disclosure operates using two column decoders for the column address. One column decoder allows decoding for write column addresses. The other column decoder allows decoding for read and verify column addresses. The disclosed pseudo-dual port memory bank with Y-mux structure requires only a single-port memory cell. As explained, a dual port memory bank may allow read and write operations to be simultaneously performed, but requires a dual port memory cell. A single port memory cells, for example an STT MRAM memory cell, may be more area efficient than a dual port memory cell, for example a dual port STT MRAM memory cell. Thus, the present disclosure teaches, in one embodiment, a Y-mux structure to create a pseudo dual port memory bank with single port memory cells. Thus, e1 register operates with the disclosed pseudo dual port memory bank to permit write and verify operations sharing common row address to occur simultaneously.

In another aspect, the memory device includes control bits and signals that are used for the control logic of this disclosure. The memory device may thus know whether data is located in a memory bank, memory pipeline, e1 register, or e2 register for read operations. In another aspect, data for operations may invalidated based on control bits and signals to maintain consistency of operations. Such control bits and signals may include valid bit, active bank signal, fail count bits, e2 entry inactive bit. A valid bit indicates that particular data within a register is valid for data manipulation operations. An active bank signal indicates whether the memory bank for operation is active (i.e., that a system write or system read is being performed in that bank). Fail count bits indicate the number of re-write operations have occurred for the data word. The e2 entry inactive bit indicates that the associated entry in e2 should not be used for data manipulation operations.

In another aspect, the present disclosure teaches a memory device having pipeline structure for write and verify, among other data manipulation operations. This pipeline structure may be used to control system write, verify, and re-write operations, among other data manipulation operations. Using the pipeline structure of the present disclosure, data integrity is maintained and data flow is structured. In one embodiment, a delay register implements a delay cycle allowing memory to reach stable state before performing a verify operation on a data word. This delay cycle allows a write operation to be performed for a data word, followed by a delay cycle, followed by a verify operation for the data word.

In one embodiment, a method of writing data into a memory device is disclosed. The method comprises utilizing a pipeline to process write operations of a first plurality of data words addressed to a memory bank. The method further comprises writing a second plurality of data words and associated memory addresses into a cache memory, e.g., an e1 register, wherein the cache memory is associated with the memory bank and wherein further each data word of the second plurality of data words is either awaiting write verification associated with the memory bank or is to be re-written into the memory bank. Further, the method comprises detecting a power down signal and responsive to the power down signal, transferring the second plurality of data words and associated memory addresses from the cache memory, e.g., the e1 register, into a secure memory storage area reserved in the memory bank. Finally, the method comprises powering down the memory device. It should be noted that in this embodiment only one dynamic redundancy register, e.g., the e1 register may be used in the memory device. In other words, the memory device will have no e2 register.

In one aspect of this embodiment, the memory bank comprises a plurality of spin-transfer torque magnetic random access memory (STT-MRAM) cells. In another aspect, the method further comprises responsive to the power down signal, transferring any partially completed write operations of the pipeline to the secure memory storage area. In a different aspect, the method further comprises responsive to the power down signal, and before the transferring, copying any partially completed write operations of the pipeline to the cache memory.

In one aspect of the embodiment, the transferring comprises utilizing a secure communication process that is substantially compliant with one of: voting; ECC encoding; use of multiple copies; comparing multiple copies; and voting from multiple copies. In another aspect, the power down signal originates from a system level software stack and represents a system wide orderly power down event. In a different aspect, the power down sequence is initiated when an analog detector detects that the operating power of the chip has decreased by a predetermined threshold level. In one aspect, the method further comprises removing a data word and its associated address from the cache memory responsive to an indication that the data word has been verified as properly written to the memory bank. In another, the method further comprises receiving a power up signal and responsive to the power up signal, transferring the second plurality of data words and associated memory addresses from the secure memory storage area to the cache memory and processing the second plurality of data words from the cache memory, through the pipeline for writing into the memory bank.

In one embodiment, a method of writing data into a memory device is disclosed. The method comprises utilizing a pipeline to process write operations of a first plurality of data words addressed to a memory bank. The method further comprises writing a second plurality of data words and associated memory addresses into a cache memory, wherein the cache memory is associated with the memory bank and wherein further each data word of the second plurality of data words is either awaiting write verification associated with the memory bank or is to be re-written into the memory bank. The method also comprises detecting a power down signal and responsive to the power down signal, and before the memory device is powered down, processing data words of the second plurality of data words and associated memory addresses through the pipeline to write data into the memory bank. The method finally comprises powering down the memory device.

In one aspect, the memory bank comprises a plurality of spin-transfer torque magnetic random access memory (STT-MRAM) cells. In another aspect, the power down signal originates from a system level software stack and represents a system wide orderly power down event. In a different aspect, the power down sequence is initiated when an analog detector detects that the operating power of the chip has decreased by a threshold level. In one aspect, the method further comprises removing a data word and its associated address from the cache memory responsive to an indication that the data word has been verified as properly written to the memory bank. In yet another aspect, the method further comprises subsequent to the processing the data words and before the power down, transferring any unprocessed data words of the second plurality of data words from the cache memory to a secure memory storage area of the memory bank. In one aspect, the transferring comprises utilizing a secure communication process substantially compliant with one of: voting; ECC encoding; use of multiple copies; comparing multiple copies; and voting from multiple copies.

In one aspect, the method also comprises receiving a power up signal and responsive to the power up signal, transferring any data words and associated memory addresses from the secure memory storage area to the cache memory and processing the data words, from the cache memory, through the pipeline for writing into the memory bank.

In one embodiment, a method of writing data into a memory device is disclosed. The method comprises utilizing a pipeline to process write operations of a first plurality of data words addressed to a memory bank. The method further comprises writing a second plurality of data words and associated memory addresses into a cache memory, wherein the cache memory is associated with the memory bank and wherein further each data word of the second plurality of data words is either awaiting write verification associated with the memory bank or is to be re-written into the memory bank. The method also comprises detecting a power down signal and responsive to the power down signal, transferring the second plurality of data words and associated memory addresses from the cache memory into a secure memory storage area in the memory bank. Additionally, the method comprises detecting a power up signal and responsive to the power up signal, and before the memory device is powered up, transferring the second plurality of data words and associated memory addresses from the secure memory storage area to the cache memory. Further, the method comprises responsive to the transferring, and before the memory device is powered up, processing the second plurality of data words and associated memory addresses from the cache memory to the pipeline for writing data to the memory bank during power up.

In one aspect, the memory bank comprises a plurality of spin-transfer torque magnetic random access memory (STT-MRAM) cells. Further, in one aspect, the method further comprises responsive to the power down signal, transferring any partially completed write operations of the pipeline to the secure memory storage area. In another aspect, the method further comprises responsive to the power down signal, copying any partially completed write operations of the pipeline to the cache memory. In one aspect, the transferring comprises utilizing a secure communication process substantially compliant with one of: voting; ECC encoding; use of multiple copies; comparing multiple copies; and voting from multiple copies.

In one embodiment, the power down signal originates from a system level software stack and represents a system wide orderly power down event. In a different aspect, the power down sequence is initiated when an analog detector detects that the operating power of the chip has decreased by a threshold level. In another aspect, the method further comprises removing a data word and its associated address from the cache memory responsive to an indication that the data word has been verified as properly written to the memory bank.

In one embodiment, a memory pipeline for performing a write operation in a memory device is disclosed. The memory pipeline comprises an initial pipe-stage comprising an input register operable to receive a first data word and an associated address to be written into a memory bank. The memory pipeline also comprises a pre-read register of the first pipe-stage coupled to the input register and operable to receive the first data word and the associated address from the input register and further operable to pre-read a second data word stored in the memory bank at the associated address, and wherein the pre-read register is further operable to store mask bits associated with pre-reading the second data word, wherein the mask bits comprise information regarding a bit-wise comparison between the first data word and the second data word. Further, the memory pipeline comprises a write register of the second pipe-stage operable to receive the first data word, the associated address and the mask bits from the pre-read register, wherein the write register is further operable to use information from the mask bits to write the first data word into the memory bank by changing those bits in the first data word that differ from the second data word, and wherein the second pipe-stage follows the first pipe-stage.

In one aspect the memory bank comprises memory cells that are spin-transfer torque magnetic random access memory (STT-MRAM) cells. In another aspect, the pre-read register further comprises ECC bits for correcting bit errors in data words read from the memory bank. In one aspect, the pre-read is performed as part of a bit redundancy remapping operation. In another aspect the pre-read register stores the mask bits in a first level dynamic redundancy register. In a further aspect, the memory pipeline further comprises a delay register of the third pipe-stage operable to provide delay cycles between the write register and a verify register, wherein the delay cycles are used to find a verify operation in a first level dynamic redundancy register with a row address in common with the first data word wherein the third pipe-stage follows the second pipe-stage. In one aspect the delay register is further operable to receive the first data word and associated address from the write register. In another aspect, the delay register is further operable to transmit the first data word and associated address to the first level dynamic redundancy register responsive to receipt of a row address change signal. In one aspect, the memory pipeline further comprises a verify register of the fourth pipe-stage operable to receive the first data word and associated address from the delay register, and further operable to read a third data word at the associated address from the memory bank, wherein the fourth pipe-stage follows the third pipe-stage. Further, the memory pipeline comprises compare logic operable to compare contents of the first data word and the third data word to determine if the first data word wrote correctly to the memory bank.

In one embodiment, a memory pipeline for performing a write operation in a memory device is disclosed. The memory pipeline comprises an initial pipe-stage comprising an input register operable to receive a first data word and an associated address to be written into a memory bank. Further, the pipeline comprises a first write register of a first pipe-stage coupled to the input register and operable to receive the first data word and the associated address from the input register in a first clock cycle, wherein the first write register is further operable to perform a first attempt at writing the data word into the memory bank at a location corresponding to the associated address. The pipeline also comprises a second write register of the second pipe-stage coupled to the first write register and operable to receive the first data word and the associated address from the first write register in a second clock cycle, wherein the second write register is further operable to perform a second attempt at writing the first data word into the memory bank at the location corresponding to the associated address, and further wherein a second data word is input into the first write register in the second clock cycle subsequent to writing the first data word into the second write register from the first write register, wherein the second pipe-stage follows the first pipe-stage.

In one aspect, the pipeline further comprises a delay register of the third pipe-stage operable to receive the first data word and the associated address from the second write register on a third cycle, wherein a third data word is input into the first write register and the second data word is transferred from the first write register into the second write register for a second attempt at writing the second data word on the third cycle into the memory bank, wherein the third pipe-stage follows the second pipe-stage. In one aspect, the delay register is further operable to provide a delay cycle between the write register and a verify register, wherein the delay cycle is used to find a verify operation in a first level dynamic redundancy register with a row address in common with the first data word. In one aspect, the delay register is further operable to transmit the first data word and the associated address to the first level dynamic redundancy register responsive to receipt of a row address change signal. In another aspect, the memory pipeline further comprises a verify register of the fourth pipe-stage coupled to the delay register wherein the verify register is operable to receive the first data word from the delay register on a fourth clock cycle, and wherein the verify register performs a read operation on the memory bank at the associated address to determine whether the first data word wrote correctly to the memory bank, wherein the fourth pipe-stage follows the third pipe-stage. In yet another aspect, the memory pipeline also comprises compare logic operable to perform a compare operation between the first data word in the verify register and a data word read from the memory bank at the associated address in the verify register.

In one aspect, the memory pipeline additionally comprises a verify results register of the fifth pipe-stage operable to receive the first data word and the associated address from the verify register, wherein responsive to a determination that a verify operation associated with the compare operation failed, the verify results register is further operable to transfer the first data word and the associated address to a first level dynamic redundancy register, wherein the fifth pipe-stage follows the fourth pipe-stage. In one aspect, the memory cells of the memory bank comprise spin-transfer torque magnetic random access memory (STT-MRAM) cells. In another aspect responsive to receiving a read operation, write operations associated with the memory pipeline are stalled until the read operation is completed.

In one embodiment of the present invention, a memory device for storing data is disclosed. The memory device comprises a memory bank comprising a plurality of addressable memory cells configured in a plurality of segments wherein each segment contains N rows per segment, wherein the memory bank comprises a total of B entries, and wherein the memory cells are characterized by having a prescribed write error rate, E. The memory device also comprises a pipeline comprising M pipestages and configured to process write operations of a first plurality of data words addressed to a given segment of the memory bank. Further, the memory comprises a cache memory, e.g., the e1 register comprising Y number of entries, the cache memory associated with the given segment of the memory bank wherein the cache memory is operable for storing a second plurality of data words and associated memory addresses, and wherein further each data word of the second plurality of data words is either awaiting write verification associated with the given segment of the memory bank or is to be re-written into the given segment of the memory bank, and wherein the Y number of entries is based on the M, the N and the prescribed word error rate, E, to prevent overflow of the cache memory.

In one aspect, the Y number of entries is at least (N*M)+ (B*E) entries. In one aspect, the memory cells of the memory bank comprise spin-transfer torque magnetic random access memory (STT-MRAM) cells. In one aspect, the memory device further comprises a plurality of pipelines and a plurality of cache memories, and wherein further each segment of the plurality of segments has associated therewith a respective pipeline of the plurality of pipelines and a respective cache memory of the plurality of cache memories. In one aspect, the cache memory comprises one or more status indicators for indicating a partial occupancy level of the cache memory. In one aspect, the pipeline supports multiple write attempts for a given write operation. In another aspect, the pipeline supports a pre-read operation for a given write operation. In one aspect, the pipeline is operable to flush a currently processing first memory operation to the cache memory if a second memory operation enters the pipeline has a different row address as the first memory operation.

In one embodiment, a memory device for storing data is disclosed. The memory device comprises a plurality of memory banks, wherein each memory bank comprises a plurality of addressable memory cells and a plurality of pipelines each comprising a plurality of pipe-stages, wherein each pipeline is associated with a respective one of the plurality of memory banks, and wherein each pipeline is configured to process write operations of a first plurality of data words addressed to its associated memory bank. The memory device further comprises a plurality of cache memories, wherein each cache memory is associated with a respective one of the plurality of memory banks and a respective one of the plurality of pipelines, and wherein each cache memory is operable for storing a second plurality of data words and associated memory addresses, and wherein further each data word of the second plurality of data words is either awaiting write verification associated with the given segment of an associated memory bank or is to be re-written into the given segment of the associated memory bank.

In one aspect, the addressable memory cells of the associated memory bank comprise spin-transfer torque magnetic random access memory (STT-MRAM) cells. In one aspect, each pipeline is operable to flush a currently processing first memory operation to an associated cache memory if a second memory operation that enters the pipeline has a different row address as the first memory operation. In another aspect, each cache memory comprises one or more status indicators for indicating a partial occupancy level of the cache memory. In one aspect, each pipeline supports multiple write attempts for a given write operation. In another aspect, each pipeline supports a pre-read operation for a given write operation.

In one embodiment, a memory device for storing data is disclosed. The memory device comprises a memory bank comprising a memory array of addressable memory cells and a pipeline configured to process read and write operations addressed to the memory bank. Further, the memory comprises an x decoder circuit coupled to the memory array for decoding an x portion of a memory address for the memory array and a y multiplexer circuit coupled to the memory array and operable to simultaneously multiplex across the memory array based on two y portions of memory addresses and, based thereon with the x portion, for simultaneously writing a value and reading a value associated with two separate memory cells of the memory array, wherein the x decoder and the y multiplexer comprise a read port and a write port which are operable to simultaneously operate with respect to the memory array.

In one aspect, the x decoder is operable to assert a row line of the memory array and wherein the two separate memory cells share the row line in common. In another aspect, the read port and the write port allow a write operation and a read-verify operation, that share a common row, to simultaneously access the memory array. In one aspect, the read port and the write port allow a write operation and a read-verify operation, that share a common row and that have different y portions, to simultaneously access the memory array. In another aspect, the addressable memory cells comprise spin-transfer torque magnetic random access memory (STT-MRAM) cells. In one aspect of the invention, the x portion of the memory address decodes to a common row line shared by the two separate memory cells of the memory array and wherein further the two y portions of memory addresses respectively select first and second sets of bit lines associated with the two separate memory cells of the memory array. In one aspect, the memory device further comprises a plurality of input/output channels, the plurality of input/output channels coupled to the y multiplexer circuit.

These and other objects, features, aspects, and advantages of the embodiments will become better understood with reference to the following description and accompanying drawings. Moreover, the object, features, aspect, and advantages of the embodiments can be modified and combined without departing from the teachings of the present disclosure.

BRIEF DESCRIPTION OF THE DRAWINGS

The accompanying drawings, which are included as part of the present specification, illustrate the presently preferred embodiments and, together with the general description given above and the detailed description given below, serve to explain and teach the principles of the MTJ devices described herein.

Figure 1:
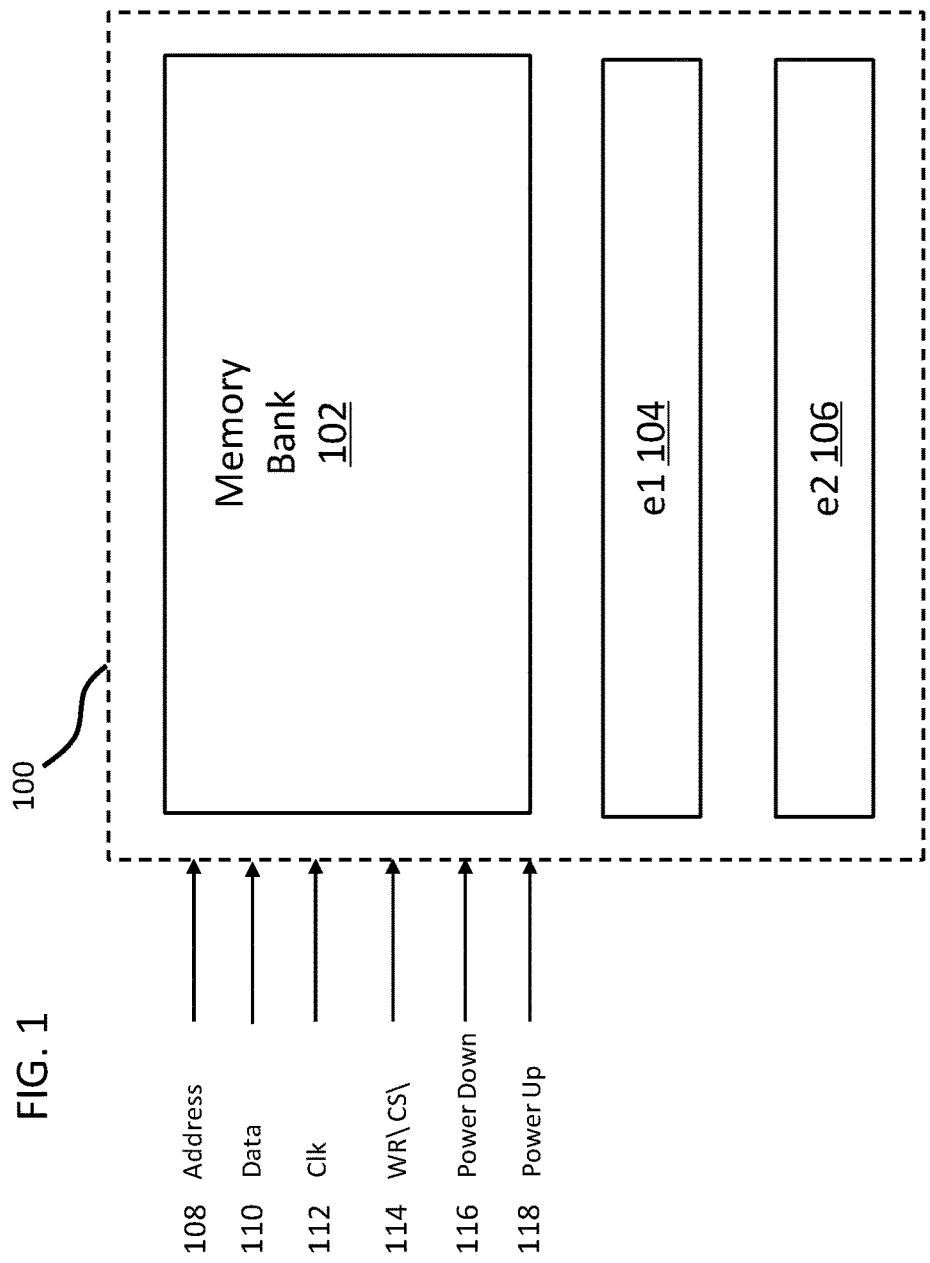
FIG. 1 is a block diagram of exemplary memory device of the present disclosure having redundancy registers.

The figures are not necessarily drawn to scale and the elements of similar structures or functions are generally represented by like reference numerals for illustrative purposes throughout the figures. The figures are only intended to facilitate the description of the various embodiments described herein; the figures do not describe every aspect of the teachings disclosed herein and do not limit the scope of the claims.

DETAILED DESCRIPTION

The following description is presented to enable any person skilled in the art to create and use dynamic redundancy registers that allow devices, and especially magnetic semiconductor device such as an MRAM, to operate with high write error rate (WER). Each of the features and teachings disclosed herein can be utilized separately or in conjunction with other features to implement the disclosed system and method. Representative examples utilizing many of these additional features and teachings, both separately and in combination, are described in further detail with reference to the attached drawings. This detailed description is merely intended to teach a person of skill in the art further details for practicing preferred aspects of the present teachings and is not intended to limit the scope of the claims. Therefore, combinations of features disclosed in the following detailed description may not be necessary to practice the teachings in the broadest sense, and are instead taught merely to describe particularly representative examples of the present teachings.

In the following description, for purposes of explanation only, specific nomenclature is set forth to provide a thorough understanding of the present teachings. However, it will be apparent to one skilled in the art that these specific details are not required to practice the present teachings.

FIG. 1 is a block diagram of exemplary memory device of the present disclosure having dynamic redundancy registers (e1 register 104 and e2 register 106, in this case). FIG. 1 shows memory devices 100 described herein that includes memory bank 102, e1 register 104, and e2 register 106. Moreover, memory device 100 communicates with data signals, for example, address signal 108, data word signal 110, clock signal 112, write and chip select signals 114, power down signal 116, power up signal 118. Note that FIG. 1 illustrates certain teachings of the present disclosure. However, it should be understood that the specific signals 108-118 illustrated may be modified by those with ordinary skill in the art without departing from the teachings of the present disclosure. Moreover, other communication interfaces, for example a double data rate (DDR) interface, to the memory device may be used. Although shown with only two dynamic redundancy registers here (e1 register 104 and e2 register 106) and one memory bank (memory bank 102), memory device 100 may comprise two or more dynamic redundancy registers and one or more memory banks. The two or more dynamic redundancy registers could be implemented using some combination e1 register 104 and e2 register 106. The two or more dynamic redundancy registers may also operate hierarchically or in parallel.

Memory bank 102 comprises an array of data storage elements comprising data bits and may be implemented by volatile or non-volatile RAM technologies such as static random-access memory (SRAM), dynamic random-access memory (DRAM), resistive random-access memory (RRAM), phase-change memory (PCM), MRAM, STT-MRAM, or other RAM technologies. In an exemplary embodiment, memory bank 102 may include an error correcting code block (not pictured). The teachings of the present disclosure are especially beneficial when memory bank 102 comprises STT-MRAM which suffers from an inherently stochastic write mechanism, wherein bits have certain probability of write failure on any given write cycle. The teachings of the present disclosure allow memory bank 102 to be operated with high WER. However, many such errors can be corrected using the teachings of the present disclosure. Operating with high WER may allow memory bank 102 to operate under other beneficial conditions. For example, memory bank 102 could operate under high write speed, low write voltage (which may enable higher bitcell endurance), reducing ECC bits, or increased ECC decode speed, among other beneficial conditions.

In one embodiment, memory bank 102 may comprise 65,536×50 addressable bits. Further, the 50 bits comprise a 32-bit data word and 18 parity bits for error correction. Operations may be performed on memory bank 102 including system read, system write, re-write and verify operations, among other data manipulations. A particular operation, for example a write operation, may occur at a particular address within memory bank 102. The operation may have a row address, indicating a word line, and a column address. The address for write operations may be communicated through a write port of memory bank 102. The address for read or verify operations may be communicated through a read port of memory bank 102.

In one embodiment, memory bank 102 comprises a pseudo-dual port memory bank allowing memory device 100 to simultaneously (e.g., substantially within a memory device clock cycle) perform a write operation and a verify operation sharing a common row (word line) address. System read operations to memory bank 102 generally supersede write and verify operations. Thus, system read operation would be performed before the scheduled write and verify operations. Write and verify operation could then happen on a subsequent clock cycle.

It should be noted that if a dual-port memory bank 102 is used, read and write operations may be simultaneously performed. In other words, a dual-port memory bank would also permit two write operations (or two read operations) to be performed simultaneously. By contrast, a pseudo-dual port memory bank can comprise two ports, however, both ports may not be designed to service the same operations. For example, typically a write operation requires a write driver with corresponding sense amplifiers that can support the higher current requirements of a write operation. In other words, a write driver tends to occupy more surface area on the chip as compared to a read driver because of the high current requirements for a write operation. A dual port memory bank optimizes both ports to support write operations, which, in turn, means that both ports can also support read operations because the requirements for read drivers are less stringent than for write drivers. A pseudo dual port memory bank, on the other hand, optimizes one of the ports to support a write operation and one of the ports to support a read operation. In the current case, because memory device 100 will be receiving a write and a verify operation sharing a common row (word line) address in the same clock cycle, a pseudo-dual port memory bank can be used to process the write and verify operation simultaneously.

The e1 register 104 is coupled to memory bank 102 and e2 register 106. The e1 register 104 comprises an array of data storage elements comprising data bits and may be implemented by volatile and non-volatile RAM technologies. The e1 register 104 may also comprise control bits and communicate using control signals that maintain consistency of operations within memory device 100. Typically, data is more reliably written to e1 register 104 than within memory bank 102. Thus, if memory bank 102 comprises STT-MRAM, then e1 register 104 might comprise SRAM. In other embodiments, e1 register may comprise non-volatile RAM such as STT-RAM. The e1 register may also comprise a dual-port STT-RAM to allow simultaneous read and write operations. In this case, e1 register 104 can run at the same cycle throughput speed as a memory bank. The e1 register 104 may also comprise content addressable memory (CAM). In one embodiment, the e1 register may be located off the memory chip and on a system card or even on the CPU. In other words, the e1 register can be located on a different chip besides the memory chip.

Generally, e1 register 104 stores data words and associated addresses for data in memory bank 102 that has not been verified or has failed verification. In one embodiment, e1 register 104 may store data words that have not been verified. For example, e1 register 104 receives a ROWchg signal that indicates row address change within a pipeline structure of the present disclosure. The ROWchg signal indicates that the data word and the associated address from the pipeline structure should be stored within e1 register 104. The ROWchg signal may also indicate that that another data word and associated address should be transmitted from e1 register 104 to the pipeline structure for a verify operation. If a pseudo-dual port memory bank is used, e1 register 104 may choose a data word and an associated address such that they share a common row address with a data word in the write register of the pipeline structure. In this way, a write operation and a verify operation can be simultaneously performed since the data words share a common row address.

In another embodiment, e1 register 104 may store data words that have failed verification. For example, the pipeline structure may transmit a signal to e1 register 104 indicating that a data word has failed to write (i.e., failed verification) to memory bank 102. The pipeline structure may also transmit data word and associated address (in the case that e1 register 104 does not already contain the data word and associated address) to e1 register 104 in order to later try to re-write the data word to memory bank 102. In another example, a read operation may occur and pipeline structure may determine that the read operation did not occur within a predetermined error budget. The pipeline structure may then transmit a signal indicating that the read operation failed and transmit the data word and associated address to e1 register 104 for storage.

From the preceding, one of ordinary skill in the art will understand that e1 register 104 may store data words and associated addresses for future verification. For example, a data word may not have had an opportunity to verify due to a row address change. Thus, e1 register 104 may transmit the data word and associated address to the pipeline structure of the present disclosure during some subsequent clock cycle to verify the data word. Typically, a control signal may indicate to e1 register 104 that a row address change will occur or that memory bank 102 will become inactive during subsequent clock cycles. The e1 register 104 may then determine the appropriate data word sharing a common row address with the data word to be written (in case of row address change) during the subsequent clock cycle. The e1 register 104 then transmits the data word and associated address to verify register of the pipeline structure. In one embodiment, e1 register 104 may also transmit the physical address within e1 register 104 if the data word is already stored within e1 register 104. In this way, control bits associated with the data word may be updated.

From the preceding, a person skilled in the art will understand that e1 register 104 may also store data words for future re-write attempts. The e1 register 104 may receive data words that have failed verification from the pipeline structure of the present disclosure. Memory device 100 may have attempted a write operation and the data word failed a verify operation. Memory device 100 may also have attempted a read operation and the data word may have failed to read within a specified error budget. In both cases, the pipeline structure of the present disclosure may transmit the data word to e1 register 104. Memory bank 102 may become inactive during a subsequent cycle. The e1 register 104 may then determine an appropriate data word to attempt to re-write to memory bank 102. In this case, e1 register 104 may transmit a data word and associated address to the pipeline structure. The e1 register 104 transmits the data word such that a write register could re-write the data word during the clock cycle that memory bank 102 would otherwise be inactive.

Generally, e1 register 102 may also relocate data words, associated addresses, and control bits to e2 register 106. If no more re-write attempts are desired, e1 register 104 may relocate data word and associated address to e2 register 106. The e1 register may also relocate data to memory bank 102 or e2 register 106 on power down so that data is stored in non-volatile memory in the case that e1 register 104 comprises volatile memory. The e1 register 104 may also relocate data to e2 register 106 in the case that e1 register 104 lacks space for data words.

The e1 register comprises control bits and communicates using control signals. In one embodiment, e1 register comprises valid bits indicating whether the associated data word is a valid entry within e1 register. In another embodiment, e1 register comprises fail count bits indicating the number of re-write attempts associated with a data word. In this way, memory device 100 may try only a specified number of re-write attempts. In another embodiment, e1 register comprises bits indicating that the associated data word has not been verified due to row address change and should be verified.

The e2 register 106 is coupled to e1 register 104 and may also be coupled to memory bank 102. The e2 register 106 comprises an array of data storage elements comprising data bits and may be implemented by volatile and non-volatile RAM technologies. The e2 register 106 may also comprise an ECC block and CAM. The e2 register 106 may comprise data words, associated addresses, and control bits. Typically, e2 register 106 will comprise a non-volatile memory technology, for example STT-MRAM. In one embodiment, the e2 register may be located off the memory chip and on a system card or even on the CPU. In other words, the e2 register can be located on a different chip besides the memory chip.

The e2 register 106 stores data words and associated addresses relocated from e1 register 104. In another embodiment, rather than storing data words and associated data words from e1 register 104, e2 register 106 remaps those data words to addresses within memory bank 102. For example, e2 register 106 may store remap addresses in memory bank 102. The e2 register 106 then temporarily stores a data word from e1 register and then writes it to an appropriate remap address in memory bank 102. When a data word should be read, e2 register contains the appropriate remap address for reading the data word from memory bank 102.

Data words and associated addresses may be relocated to e2 register 106 or remapped based on different conditions. In one embodiment, e1 register 104 relocates data words and associated addresses to e2 register 106 because the data words failed to write to memory bank 102 after the specified number of re-write attempts.

In another embodiment, e1 register 104 relocates data words and associated addresses to e2 register 106 because power down signal 116 indicates that data word and associated address should be moved to non-volatile memory, such as e2 register 106 comprising STT-MRAM. In one embodiment, e1 register 104 may attempt to process any pending verifies or re-write attempts associated with data words stored in e1 prior to relocating the contents of the e1 register to the e2 register upon receipt of the power down signal. In other words, when a power down signal is received, but before the chip powers down, the e1 register can, in one embodiment, attempt to process all the entries within the e1 register prior to storing the entries in the e2 register. For example, the e1 register may attempt sending data words associated with any pending re-write operations or verify operations to the pipeline structure to process them prior to moving them to the e2 register. Any operations that are successfully processed may then be deleted, overwritten or invalidated from the e1 register and would not need to be stored in the e2 register. Any operations that are not successfully processed on power down, will be stored in the e2 register.

In another embodiment, e1 register 104 relocates data words and associated addresses to e2 register 106 because e1 register 104 lacks space. One of ordinary skill in the art will understand that desired control bits may also be relocated with associated data word. In another embodiment, if data word fails to write to a physical address within e2 register 106 after a predetermined number of write attempts a different physical address may be chosen for data word.

The e2 register 106 may also be coupled to an input register of a pipeline structure. In this way, e2 register 106 may receive control signals indicating that a write operation for a data word sharing a common associated address with a data word within e2 register 106 may be occurring. Thus, control bits within e2 register 106 may indicate that a data word within e2 register 106 is invalid because of a system write operation.

Memory device 100 also communicates using exemplary signals 108-118. Address signal 108 comprises address within memory bank 102 of data to be written to or read from (or otherwise manipulated). Data word signal 110 comprises a data word to be written to (or otherwise manipulated) memory bank 102. Clock signal 112 comprises a memory device 100 clock signal or other clock signal (such as for specific components within memory device 100). Write and chip select signals 114 comprise signals used to determine the operation to be performed within memory bank 102. For example, if write signal is high and chip select signal is low a read operation might be performed on memory bank 102.

Power down signal 116 indicates whether power will be removed from memory device 100 or specific components within memory device 100. Thus, power down signal 116 may be used to determine that contents of e1 register 104 should be written to memory or e2 register 106. As mentioned above, the e1 register 104 may attempt to process any pending verifies or re-write attempts associated with data words stored in e1 prior to relocating the contents of the e1 register to the e2 register upon receipt of the power down signal but before the device powers down.

Power up signal 118 indicates that power is provided to memory device 100. Power up signal may indicate that e2 non-volatile memory contents should be loaded to e2 volatile memory. One of ordinary skill in the art will recognize that the specific signals 108-118 may be modified without departing from the present disclosure. In one embodiment, upon receipt of the power up signal and before loading the memory contents to e2 volatile memory, another attempt is made to process any pending verifies or re-write attempts associated with data words stored in the e2 register. If the e2 register is connected to the pipeline structure, the attempts to process the data words in the e2 register may occur directly from the e2 register. In a different embodiment, the e2 register may need to move its contents to the e1 register prior to attempting the verify and re-write operations through the pipeline.

Power down signal 116 may indicate that e2 register 106 volatile memory contents should be moved to e2 register 106 non-volatile memory. For example, e2 register 106 volatile memory contents not already stored in e2 non-volatile memory may be moved to e2 register 106 non-volatile memory. Again, in one embodiment, if the e2 register is connected to the pipeline structure, upon receipt of the power down signal, the e2 register may attempt to process any pending verify or re-write operations prior to moving the contents into non-volatile memory.

In another embodiment, power down signal 116 may indicate that e2 register 106 contents should be moved to non-volatile memory bank 102.

In another embodiment, power down signal 116 may indicate that certain data words within e1 register 104 should be verified to memory bank 102. In another embodiment, power down signal 116 indicates that certain data words within e1 register 104 should be re-written to memory bank 102. If the verify or re-write operations are unsuccessful, as mentioned above, the data words associated with those operations would then be moved to the e2 register upon power down.

Figure 9:
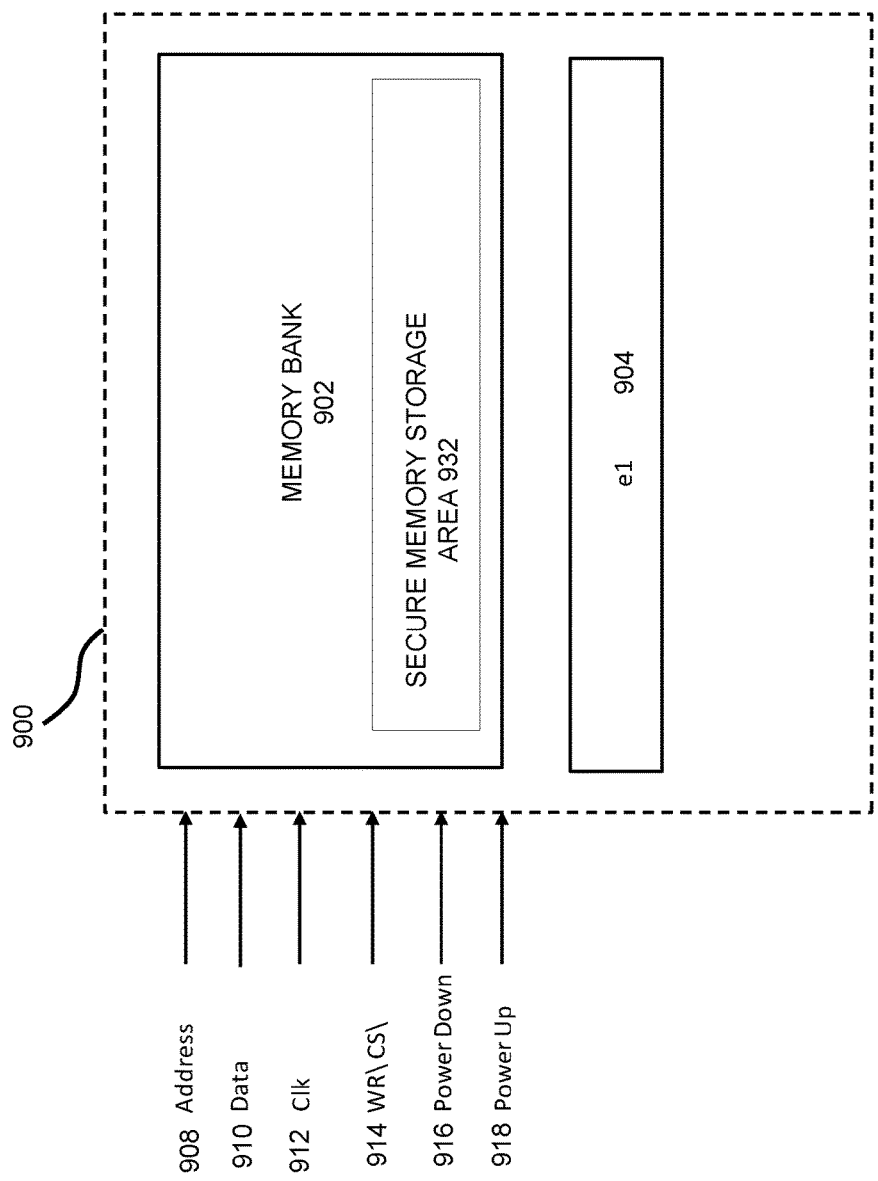
FIG. 9 is a block diagram of exemplary memory device of the present disclosure having a single redundancy register.

FIG. 9 is a block diagram of exemplary memory device of the present disclosure having a single dynamic redundancy register (e1 register 904 in this case). FIG. 9 shows memory devices 900 described herein that includes memory bank 902 and e1 register 904. As compared to the embodiment shown in FIG. 1, the embodiment of FIG. 9 does not comprise an e2 register. Instead memory bank 902 comprises a secure memory storage area 932 that may be reserved for the e1 register to relocate data words, associated addresses, and control bits. In one embodiment, the reserved secured memory storage area 932 performs substantially the same function as the e2 register described in FIG. 1. However, instead of dedicating a separate dedicated register, the e1 register is able to relocate its contents to a secured location in memory as will be further described below.

Additionally, memory device 900 communicates with data signals, for example, address signal 908, data word signal 910, clock signal 912, write and chip select signals 914, power down signal 916, and power up signal 918. Note that FIG. 9 illustrates certain teachings of the present disclosure. However, it should be understood that the specific signals 908-918 illustrated may be modified by those with ordinary skill in the art without departing from the teachings of the present disclosure. Moreover, other communication interfaces, for example a double data rate (DDR) interface, to the memory device may be used. Although shown with only one memory bank (memory bank 102), memory device 900 may comprise one or more memory banks. Note further that while write and chip select signals have been lumped into one signal 914 in FIG. 9, write, chip select and read may all comprise separate signals to memory device 900.

Memory bank 902 comprises an array of data storage elements comprising data bits and may be implemented by volatile or non-volatile RAM technologies such as static random-access memory (SRAM), dynamic random-access memory (DRAM), resistive random-access memory (RRAM), phase-change memory (PCM), MRAM, STT-MRAM, or other RAM technologies. In an exemplary embodiment, memory bank 902 may include an error correcting code block (not pictured). As noted above, the teachings of the present disclosure are especially beneficial when memory bank 902 comprises STT-MRAM which suffers from an inherently stochastic write mechanism, wherein bits have certain probability of write failure on any given write cycle. The teachings of the present disclosure allow memory bank 902 to be operated with high WER. However, many such errors can be corrected using the teachings of the present disclosure. Operating with high WER may allow memory bank 902 to operate under other beneficial conditions. For example, memory bank 902 could operate under high write speed, low write voltage (which may enable higher bitcell endurance), reducing ECC bits, or increased ECC decode speed, among other beneficial conditions.

In one embodiment, memory bank 902 may comprise 65,536×50 addressable bits for instance. Further, the 50 bits comprise a 32-bit data word and 18 parity bits for error correction. Operations may be performed on memory bank 902 including system read, system write, re-write and verify operations, among other data manipulations. A particular operation, for example a write operation, may occur at a particular address within memory bank 902. The operation may have a row address, indicating a word line, and a column address. The address for write operations may be communicated through a write port of memory bank 902. The address for read or verify operations may be communicated through a read port of memory bank 902.

In one embodiment, memory bank 902 comprises a pseudo-dual port memory bank allowing memory device 900 to simultaneously (e.g., substantially within a memory device clock cycle) perform a write operation and a verify operation sharing a common row (word line) address. System read operations to memory bank 902 generally supersede write and verify operations. Thus, system read operation would be performed before the scheduled write and verify operations. Write and verify operation could then happen on a subsequent clock cycle. As explained above, a pseudo-dual port memory bank can used to implement the write and verify operation on the same clock cycle.

The e1 register 904 is coupled to memory bank 902. The e1 register 904 comprises an array of data storage elements comprising data bits and may be implemented by volatile and non-volatile RAM technologies. The e1 register 904 may also comprise control bits and communicate using control signals that maintain consistency of operations within memory device 900. Typically, data is more reliably written to e1 register 904 than within memory bank 902. Thus, if memory bank 902 comprises STT-MRAM, then e1 register 904 might comprise SRAM. In other embodiments, e1 register may comprise non-volatile RAM such as STT-RAM. The e1 register may also comprise a dual-port STT-RAM to allow simultaneous read and write operations. In this case, e1 register 904 can run at the same cycle throughput speed as a memory bank. The e1 register 904 may also comprise content addressable memory (CAM).

Generally, e1 register 904 stores data words and associated addresses for data in memory bank 902 that have not been verified or have failed verification. In one embodiment, e1 register 904 may store data words that have not been verified. For example, e1 register 904 receives a ROWchg signal that indicates row address change within a pipeline structure of the present disclosure. The ROWchg signal indicates that the data word and the associated address from the pipeline structure should be stored within e1 register 904. The ROWchg signal may also indicate that that another data word and associated address should be transmitted from e1 register 904 to the pipeline structure for a verify operation. If a pseudo-dual port memory bank is used, e1 register 904 may choose a data word and an associated address such that they share a common row address with a data word in the write register of the pipeline structure. In this way, a write operation and a verify operation can be simultaneously performed since the data words share a common row address.

In another embodiment, e1 register 904 may store data words that have failed verification. For example, the pipeline structure may transmit a signal to e1 register 904 indicating that a data word has failed to write (e.g., failed verification) to memory bank 902. The pipeline structure may also transmit data word and associated address (in the case that e1 register 904 does not already contain the data word and associated address) to e1 register 904 in order to later try to re-write the data word to memory bank 902. In another example, a read operation may occur and pipeline structure may determine that the read operation did not occur within a predetermined error budget. The pipeline structure may then transmit a signal indicating that the read operation failed to occur within the error budget and transmit the data word and associated address to e1 register 904 for storage.

From the preceding, one of ordinary skill in the art will understand that e1 register 904 may store data words and associated addresses for future verification. For example, a data word may not have had an opportunity to verify due to a row address change. Thus, e1 register 904 may transmit the data word and associated address to the pipeline structure of the present disclosure during some subsequent clock cycle to verify the data word. Typically, a control signal may indicate to e1 register 904 that a row address change will occur or that memory bank 902 will become inactive during subsequent clock cycles. The e1 register 904 may then determine the appropriate data word sharing a common row address with the data word to be written (in case of row address change) during the subsequent clock cycle. The e1 register 904 then transmits the data word and associated address to verify register of the pipeline structure. In one embodiment, e1 register 904 may also transmit the physical address within e1 register 904 if the data word is already stored within e1 register 904. In this way, control bits associated with the data word may be updated.

From the preceding, a person skilled in the art will understand that e1 register 904 may also store data words for future re-write attempts. The e1 register 904 may receive data words that have failed verification from the pipeline structure of the present disclosure. Memory device 900 may have attempted a write operation and the data word failed a verify operation. Memory device 900 may also have attempted a read operation and the data word may have failed to read within a specified error budget. In both cases, the pipeline structure of the present disclosure may transmit the data word to e1 register 904. Memory bank 902 may become inactive during a subsequent cycle. The e1 register 904 may then determine an appropriate data word to attempt to re-write to memory bank 902. In this case, e1 register 904 may transmit a data word and associated address to the pipeline structure. The e1 register 904 transmits the data word such that a write register could re-write the data word during the clock cycle that memory bank 902 would otherwise be inactive.

In the embodiment of FIG. 9, the e1 register 902 may relocate data words, associated addresses, and control bits to secure memory storage 932 in memory bank 902. If no more re-write attempts are desired, e1 register 904 may relocate data word and associated address to secure memory storage 332. The e1 register may also relocate data to secure memory storage 932 on power down so that data is stored in non-volatile memory in the case that e1 register 104 comprises volatile memory. As mentioned above, generally, e1 register 904 stores data words and associated addresses for data in memory bank 902 that have not been verified or have failed verification.

Processing Operations Pending in a Dynamic Redundancy Register Prior to Powering Down In one embodiment, upon receiving the power down signal, the e1 register 904 may attempt to perform all the pending operations associated with the data words stored in the e1 register prior to the device shutting down. For example, the e1 register may attempt to store all the data words to be re-written back into memory to the targeted locations in the memory bank 102 using the associated addresses for the data words (also stored within e1). It should be noted, however, that prior to attempting pending operations stored in the e1 register, the memory device will first flush out the pipeline and finish up any pending operations in the pipeline from before the power down signal was received.

Note that, in one embodiment, the power down signal originates from a system level software stack and represents a system wide orderly power down event. However, in a different embodiment, the power down signal may not be part of a system wide orderly power down event. In other words, an analog detector may be configured to monitor the power level of the chip (e.g., a VCC power supply pin) and initiate a power down sequence if the power level of the chip falls below a certain threshold level, e.g., falls 10% or more. Further, one or more capacitors may be configured to hold charge in order to sustain the power level above a threshold level, which allows the entire power down sequence to finish to completion.

In one embodiment, a status pin(s) or register may be configured that allows the system to determine whether a power down sequence is complete. This status pin(s) or register may be used whether the shut down sequence is a result of an orderly shut down process or not. The status pin(s) or register may, for example, be associated with a timer that is set to allow the system enough time to run the entire power down sequence to completion.

As mentioned above, the e1 register may comprise data words that have not yet been verified or that have failed verification. Upon receiving the power down signal, but before powering down, the e1 register may attempt to perform all the pending verify operations and move all the data words associated with pending re-write operations (e.g. operations that have failed verification) stored within it to the appropriate corresponding locations in the memory bank. In this embodiment, the power down sequence will typically take longer because it may take a few cycles for the e1 register to attempt to perform all the pending verify or re-write operations. In one embodiment, the power down signal 916 from the user or system warns the e1 register 904 to expect a shut down sequence. Upon notification of the power down signal, the e1 register can then attempt to perform the pending verify and re-write operations. In one embodiment, an option bit (or bits) or pin(s) (not shown) is provided to the user to disable the processing of the contents of the e1 register prior to shutting down. For example, if a user wants to avoid a long power down sequence, an option may be provided to disable this scheme. By way of further example, the option bit(s) may be used to disable the scheme during a test mode.

In one embodiment, the e1 register may simply transmit the data words to the appropriate registers in the pipeline structure. For example, a data word to be re-written into the memory bank may be transmitted to the write register in the pipeline from the e1 register. From the pipeline, the data can be directed to the targeted locations within the memory bank 902.

Another data word to be verified may be transferred to the verify register in the pipeline. Further details regarding the pipeline are provided in connection with FIG. 5.

In one embodiment, if the verify operations or the attempt to re-write the data words back to memory succeed, the corresponding entries for the data words in the e1 register may be deleted prior to shutting down. In other words, any data words that were successfully re-written or verified can be deleted from the e1 register prior to shutting down. Any data words in the e1 register that could not be successfully re-written or verified prior to shutting down will be stored in secure memory storage area 932. In one embodiment, where e1 comprises volatile memory, the data words that were successfully re-written or verified do not need to be proactively deleted, instead they will be deleted automatically once the power down sequence completes.

Memory bank 902 can comprise a secure area reserved for e1 register to transfer its contents into upon shutting down. In one embodiment, the memory device 900 ensures that data is written securely to the secure memory storage area 932 by using one or multiple schemes including voting, error-correcting code (ECC), or storing multiple copies. For example, in one embodiment, multiple copies of each of the data words can be written into secure memory storage area 932. When one of the data words needs to be read, each of the copies of the data word are read from the secure memory storage area and compared to determine if the data between all the copies is consistent. In case of inconsistency, a voting scheme is used to determine the correct data word. In other words, the most frequently occurring version of the data word between the various copies is selected as the data word. In another embodiment, ECC is used to ensure that the data words are error corrected to ensure that they are written accurately into the secure memory storage area 932.

Processing Operations Pending in Secured Memory Location Upon Powering Up Using a Dynamic Redundancy Register In one embodiment, upon power up of the memory device and receipt of power up signal 918, but before the device enters mission mode (or starts accepting commands), another attempt can be made to perform all the pending re-write or verify using the associated addresses for the data words. As mentioned previously, subsequent to powering down, the secure memory storage area will comprise data words (with their associated addresses) that have not yet been verified or that have failed verification. The pending re-write or verify operations will now be stored in non-volatile memory in secure memory storage area 932 where they were re-located to following power down. The verify and re-write operations can be directly attempted from the secure memory storage area 932 or they can be recalled to the e1 register prior to processing the pending operations.

If the contents of secure storage area 932 are moved to the e1 register prior to re-attempting the pending operations, subsequent to the receipt of the power up signal 918, the e1 register may attempt to perform all the pending verify operations and move all the data words associated with pending re-write operations (e.g. operations that have failed verification) to the appropriate corresponding locations in the memory bank.

Alternatively, secure memory storage area 932 may be connected to the pipeline structure and the data words for the pending operations can be directed directly from secure memory storage area 932 to the pipeline structure. For example, a re-write operation can be sent directly from the secure memory storage area to a write register in the pipeline structure. Similarly, a pending verify operation may be sent to a verify register in the pipeline structure directly from the secure memory storage area. The verify and re-write operations that do not complete successfully can be transferred to the e1 register. In other words, the verify and re-write operations that cannot complete in the specified amount of time are transferred to the e1 register.

It should be noted that power up sequence in this scheme will typically take longer because it may take a few cycles to attempt to perform all the pending verify or re-write operations.

In one embodiment, an option bit(s) or pin(s) (not shown) can be set to determine whether to enable or disable this feature. Some users, for example, may not want a long power up sequence. In such cases, an option bit may be provided to users to disable this feature.

In one embodiment, the data words associated with pending operations may be simply transmitted to the appropriate registers in the pipeline structure (from either the e1 register or the secured memory storage). From the pipeline, the data can be directed to their targeted locations within the memory bank 902.

In one embodiment, if the attempt to verify or write the data words back to memory on power up succeeds, the corresponding entries for the data words in the secure memory storage area 932 or the e1 register may be deleted prior to shutting down. In other words, any data words that were successfully re-written or verified can be deleted from both the secure memory storage area 932 and the e1 register 904. Any data words that could not be successfully re-written or verified subsequent to powering up will be stored in the e1 register.

Performing a Blind Save into a Dynamic Redundancy Register on Power Down and a Blind Recall into a Dynamic Redundancy Register on Power Up In one embodiment, instead of attempting to process entries in the e1 register on power down, the memory device blindly transfers all the contents of the e1 register into secure memory storage area 932 on power down. As mentioned previously, the power down signal 916 can be used to indicate that a power down sequence is expected. In response to the power down signal, e1 register 904 can dump the entirely of its contents into secure memory storage area 932. The blind save on power down will typically require more time than a regular power down sequence, but will not consume as many cycles as trying to execute pending operations in the e1 register prior to shut down.

In one embodiment, the memory device 900 ensures that data is written securely to the secure memory storage area 932 by using one or multiple schemes including voting, error-correcting code (ECC), or storing multiple copies. For example, in one embodiment, multiple copies of each of the data words can be written into secure memory storage area 932. When one of the data words needs to be read, each of the copies of the data word are read from the secure memory storage area and compared to determine if the data between all the copies is consistent. In case of inconsistency, a voting scheme can be used to determine the correct data word. In other words, the most frequently occurring version of the data word between the various copies is selected as the data word. In another embodiment, ECC is used to ensure that the data words are error corrected to ensure that they are written accurately into the secure memory storage area 932.

In one embodiment, instead of attempting to process pending verify and re-write entries from the secure memory storage area 932 on power up, the memory device blindly transfers all the contents from the secure area of the memory array into the e1 register. In other words, no attempt is made to process the operations associated with the data words stored in the secure memory storage area 932 on power up. The data words are simply saved to the e1 register.

It should be noted that the design for memory device 900 does not necessitate attempting pending verify and re-write operations on both shut down and power up. In other words, memory device may attempt to process pending re-write and verify operations only on power up, but not on power down. Alternatively, in one embodiment, memory device may attempt pending operations only on power down, but not during the power up sequence (e.g., not before the device enters mission mode). In a different embodiment, memory device may attempt pending operations both on power down and power up. In cases where the pending verify and re-write operations are not processed, the corresponding data words are either transferred directly from the e1 register to the secure memory storage area 932 (on power down) or from the secure memory storage area to the e1 register (on power up).

The e1 register 904 may also relocate data to secure memory storage 932 in the case that e1 register 904 lacks space for data words. The e1 register comprises control bits and communicates using control signals. In one embodiment, e1 register comprises valid bits indicating whether the associated data word is a valid entry within e1 register. In another embodiment, e1 register comprises fail count bits indicating the number of re-write attempts associated with a data word. In this way, memory device 900 may try only a specified number of re-write attempts. In another embodiment, e1 register comprises bits indicating that the associated data word has not been verified due to row address change and should be verified.

Memory device 900 also communicates using exemplary signals 908-918. Address signal 908 comprises address within memory bank 902 of data to be written to or read from (or otherwise manipulated). Data word signal 910 comprises a data word to be written to (or otherwise manipulated) memory bank 902. Clock signal 912 comprises a memory device 900 clock signal or other clock signal (such as for specific components within memory device 900). Write and chip select signals 914 comprise signals used to determine the operation to be performed within memory bank 902. For example, if write signal is high and chip select signal is low a read operation might be performed on memory bank 902. Note that in such case write and chip select signals can be separate signals.

Power down signal 916 indicates whether power will be removed from memory device 900 or specific components within memory device 900 in accordance with an orderly shut down. Thus, power down signal 916 may be used to determine that contents of e1 register 904 should be written to secure memory storage area 932 as detailed above. Further, as detailed above, in one embodiment, power down signal 916 may indicate that certain data words within e1 register 904 should be verified to memory bank 902. In another embodiment, power down signal 916 indicates that certain data words within e1 register 904 should be re-written to memory bank 902.

Power up signal 918 indicates that power is provided to memory device 900. Power up signal may indicate that contents of the non-volatile secure memory storage area 932 should be loaded to the e1 volatile memory. Further, as detailed above, in one embodiment, power up signal 918 may indicate that certain data words within secure memory storage 932 should be verified to memory bank 902. In another embodiment, power up signal 918 indicates that certain data words within secure memory storage 932 should be re-written to memory bank 902.

One of ordinary skill in the art will recognize that the specific signals 908-918 may be modified without departing from the present disclosure.

Figure 10:
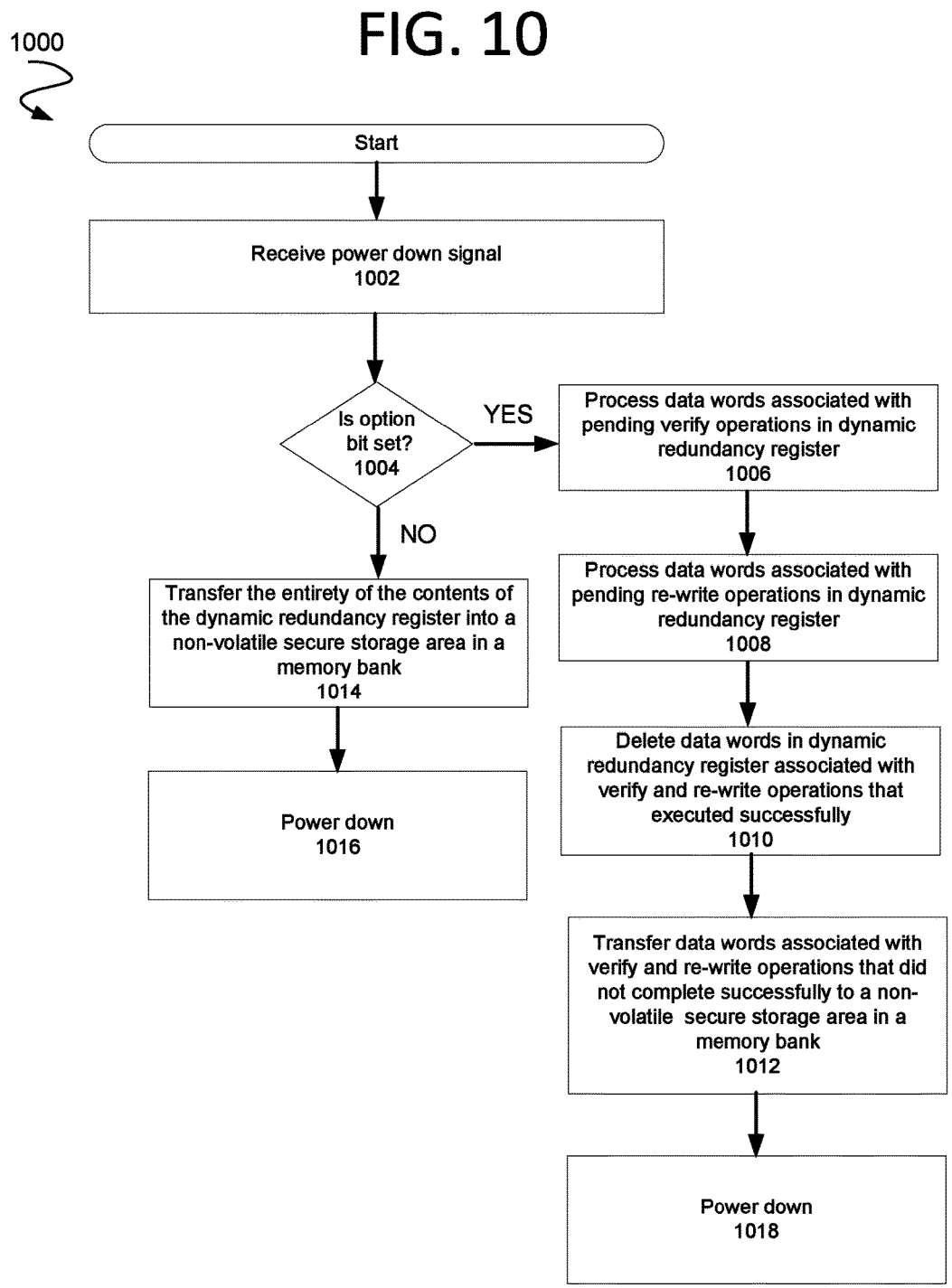
FIG. 10 depicts an exemplary embodiment for a process flow showing the processing of pending memory related operations in a dynamic redundancy register on power down in an exemplary memory device of the present disclosure.

FIG. 10 depicts an exemplary embodiment for a process flow 1000 showing the processing of pending memory related operations in a dynamic redundancy register on power down in an exemplary memory device of the present disclosure.

At step 1002, a power down signal 916 is received. As stated above, the power down signal originates from a system level software stack and represents a system wide orderly power down event. In a different embodiment, the power down sequence is initiated when an analog detector detects that the operating power of the chip has fallen below a threshold level as noted above. At step 1004, the memory device 900 determines if an option bit or pin is set for enabling the processing of pending operations in a dynamic redundancy register prior to shutting down.

If the option bit or pin is set, then at step 1006 the memory device processes data words associated with pending verify operations in the e1 register 904. In other words, any verifies for which corresponding data words and addresses are stored in the e1 register 904 are attempted prior to powering down. Similarly, at step 1008, the memory device processes any pending re-write operations in the e1 register. Data words corresponding to any verifies or re-writes that are successful are deleted from the dynamic redundancy register at step 1010. As noted above, if the dynamic redundancy register comprises volatile memory then a pro-active deletion step is not necessary. At step 1012, the remaining data words, if any, corresponding to operations that did not complete successfully are transferred to non-volatile secure memory storage area 932. As noted previously, operations may not complete successfully because of certain specification mandated time limits on the power down sequence. At step 1018, the memory device is ready for power down and/or powers down.

Alternatively, if at step 1004, the option bit is not set, then at step 1014 all the contents of the e1 register are re-located directly to the non-volatile secure memory storage area 932 without attempting any of the verify and re-write operations associated with data words stored in the e1 register. At step 1016, the memory device powers down.

Figure 11:
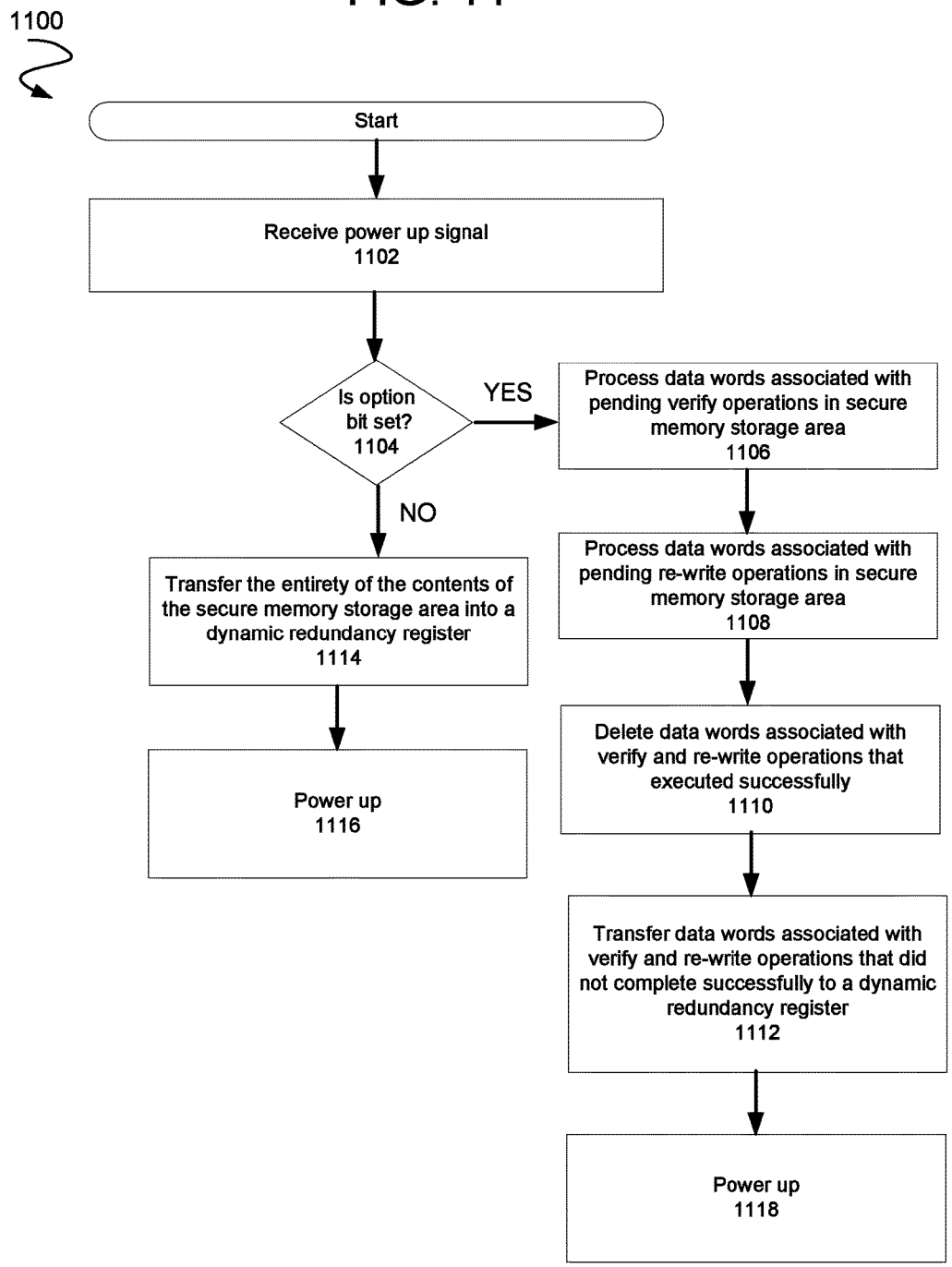
FIG. 11 depicts an exemplary embodiment for a process flow showing the processing of pending memory related operations in a secure memory storage area on power up using a dynamic redundancy register in an exemplary memory device of the present disclosure.

FIG. 11 depicts an exemplary embodiment for a process flow 1100 showing the processing of pending memory related operations in a secure memory storage area on power up using a dynamic redundancy register in an exemplary memory device of the present disclosure.

At step 1102, a power up signal 918 is received from system level resources. At step 1104, the memory device 900 determines if an option bit is set for enabling the processing of pending operations in a secure memory storage area using a dynamic redundancy register prior to powering up.

If the option bit is set, then at step 1106 the memory device processes data words associated with pending verify operations in the secure memory storage area 932. In other words, any verifies for which corresponding data words and addresses are stored in the secure memory are attempted prior to powering up. Similarly, at step 1008, the memory device processes any pending re-write operations in the secure memory area 932. As noted above, the data words and addresses associated with the pending verify and re-write operations can be injected directly into the pipeline structure from the secure memory storage area. Alternatively, in a different embodiment, the verify and re-write operations can be attempted by first transferring the corresponding data words and addresses to a dynamic redundancy register, e.g. the e1 register, then to the pipeline.

Data words corresponding to any verifies or re-writes that are successful are deleted from the secure memory storage area 932 (or the e1 register if transferred there prior to attempting the operations) at step 1110. If the verifies and re-writes are attempted directly from the secure memory storage, then at step 1112, the remaining data words corresponding to operations that did not complete successfully are transferred to the e1 register. As noted previously, operations may not complete successfully because of certain specification mandated time limits on the power up sequence. At step 1112, the memory device is ready to power up and/or powers up.

Alternatively, if at step 1104, the option bit is not set, then at step 1114 all the contents of the secure memory storage area 932 are re-located directly to the dynamic redundancy register without attempting any of the verify and re-write operations associated with data words stored in the secure memory storage. At step 1116, the memory device powers down.

Figure 12:
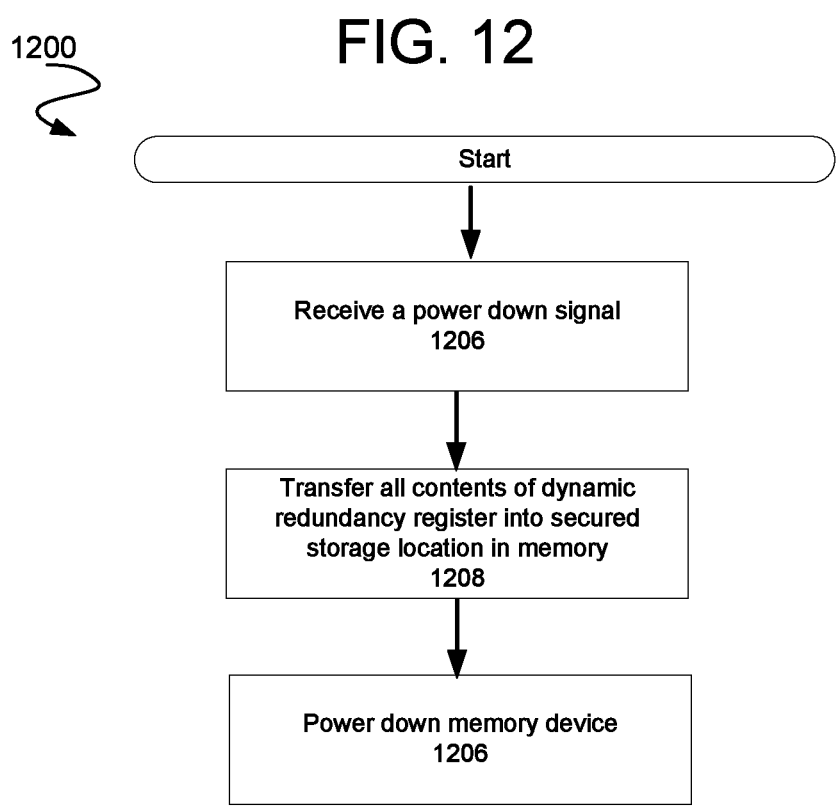
FIG. 12 depicts an exemplary embodiment for a process flow showing the processing of performing a blind save of the contents of a dynamic redundancy register on power down in an exemplary memory device of the present disclosure.

FIG. 12 depicts an exemplary embodiment for a process flow 1200 showing the processing of performing a blind save of the contents of a dynamic redundancy register on power down in an exemplary memory device of the present disclosure. Upon receipt of a power down signal 916 at step 1206, all the contents of the dynamic redundancy register (e.g. the e1 register) are transferred to secure storage location 932 without attempting to perform any of the operations associated with the data words stored in the e1 register. At step 1206, the memory device is then powered off.

Figure 13:
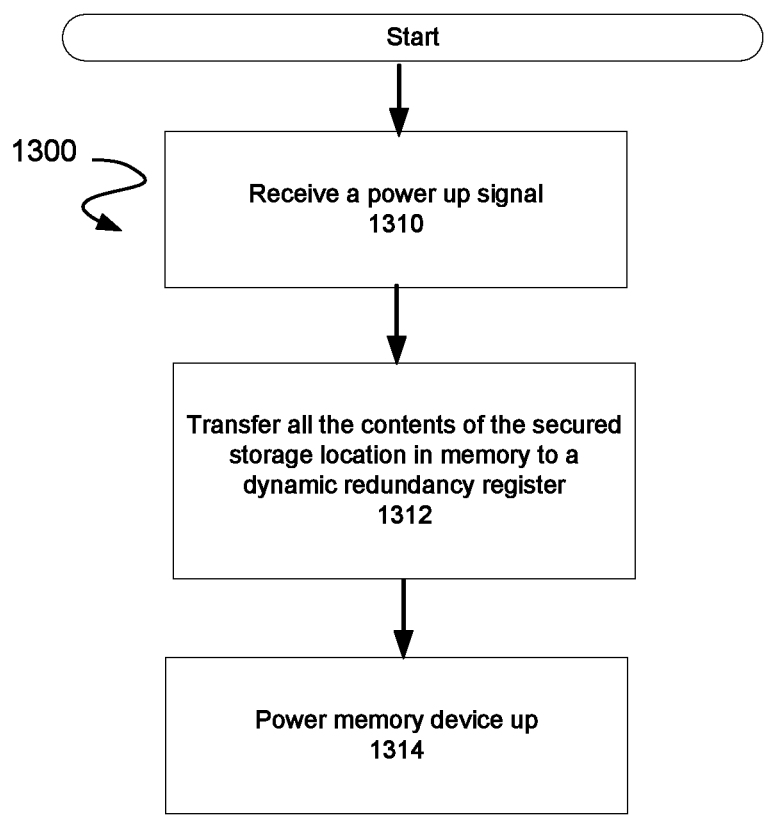
FIG. 13 depicts an exemplary embodiment for a process flow showing the processing of performing a blind recall of the contents of the memory bank into a dynamic redundancy register on power up in an exemplary memory device of the present disclosure.

FIG. 13 depicts an exemplary embodiment for a process flow 1300 showing the processing of performing a blind recall of the contents of the memory bank into a dynamic redundancy register on power up in an exemplary memory device of the present disclosure. Upon receipt of a power up signal 918 at step 1310, at step 1312, all the contents of the secure memory storage area 932 are transferred to the dynamic redundancy register (e.g. the e1 register) without attempting to perform any of the operations associated with the data words stored in the secure memory storage area. At step 1314, the memory device is then powered off.

Figure 2:
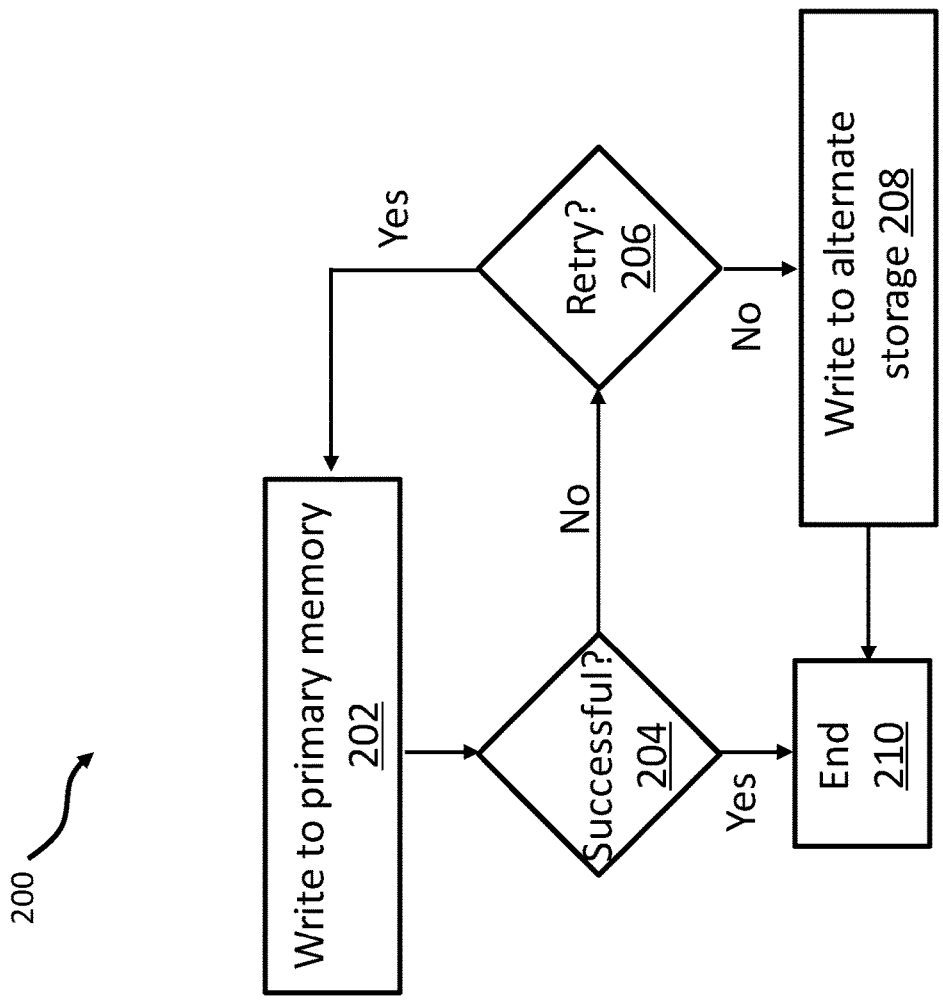
FIG. 2 is an exemplary embodiment for a process flow showing a write operation using exemplary memory device of the present disclosure and illustrates the high-level write operation performed on a memory device.

FIG. 2 depicts an exemplary embodiment for a process flow showing a write operation using an exemplary memory device of the present disclosure and illustrates the high-level write operation performed on a memory device. In step 202, a write operation to be performed on primary memory (e.g., input register to memory bank 102) exists within a memory device. In step 202, the system write operation may be performed on primary memory. In step 204, it is determined whether system write operation was successful. For example, a verify operation could determine whether the write operation successfully occurred (for example, whether the data word was written with an acceptable error budget or perfectly) within primary memory. If the write operation was successful, process flow 200 proceeds to end step 210. On the other hand, if the write operation was unsuccessful, a determination is made whether write operation should be retried in step 206. One retry is illustrated during process flow 200 of FIG. 2, but as many tries to write data into memory bank may be tried as desired (0 to n retries). If a retry should be tried, the data will be written from e1 register to primary memory when process flow 200 returns to step 202. From this description a person having ordinary skill in the art will understand the operation of steps 202-206 and 210. However, in some instances, a write operation from e1 register to primary memory may be unsuccessful despite the total desired number of retries. In that case, if a determination is made at step 206 that no more tries should be made to write data from e1 register to primary memory, process flow 200 will proceed to step 208. In step 208, data is written to alternate storage (e.g., from e1 register to e2 register).

Figure 3:
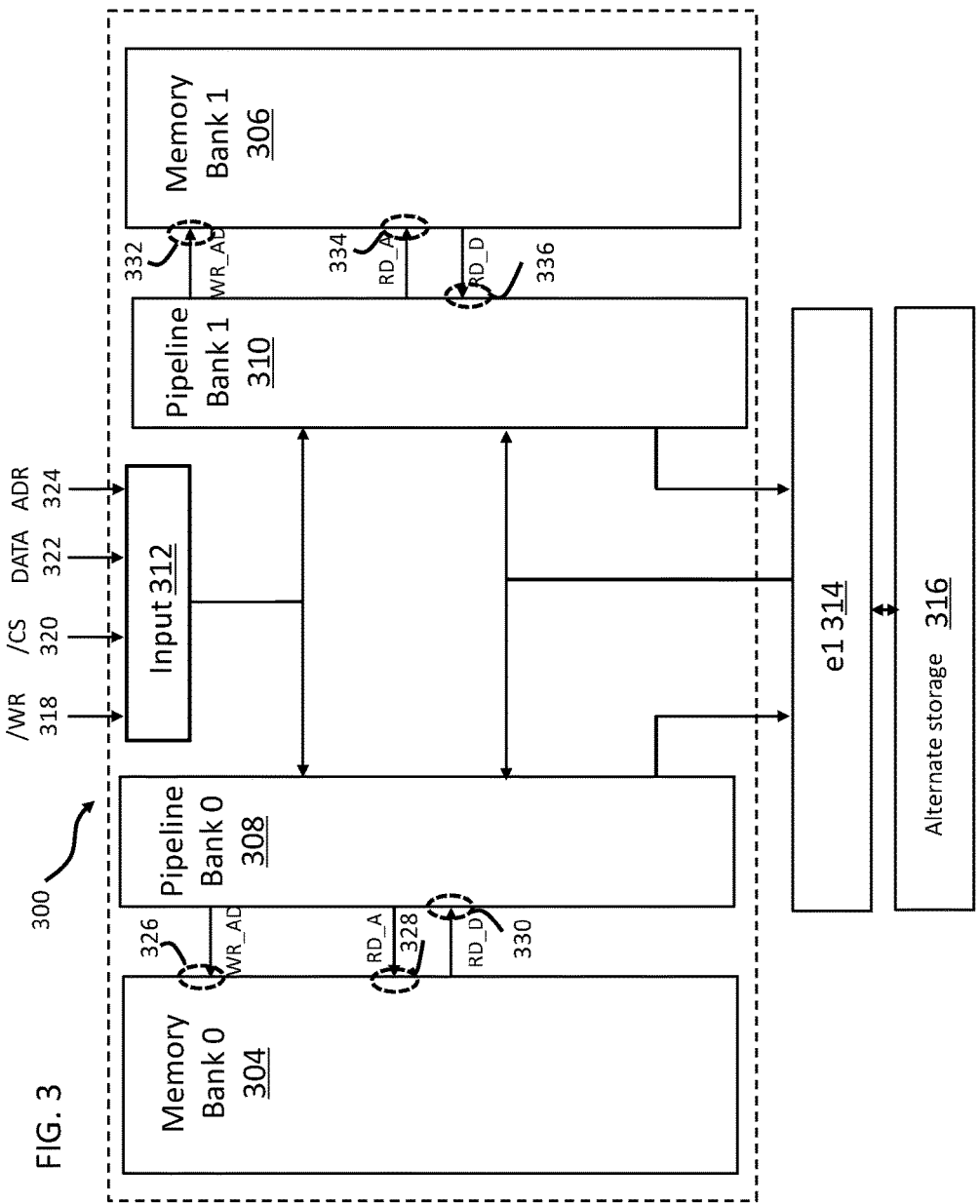
FIG. 3 is a block diagram of exemplary embodiment of a memory device of the present disclosure having dynamic redundancy registers.

FIG. 3 is a block diagram of exemplary embodiment of a memory device 300 of the present disclosure having dynamic redundancy registers. FIG. 3 is a block diagram of memory device 300 described herein that include memory banks 304 and 306, pipeline banks 308 and 310, input register 312, e1 register 314, and e2 register 316. Memory device 300 communicates using signals 318-324. Memory device 300 includes ports 326-336 for performing read, write, and verify (or other data manipulation) operations on memory banks 304 and 306. Memory device 300 is described herein to describe aspects of the present disclosure. One of ordinary skill would understand how to modify memory device 300 without departing from the teachings of the present disclosure. Thus, for example, the specific signals 318-324 may be modified by those with ordinary skill in the art without departing from the teachings of the present disclosure. Although shown with only two dynamic redundancy registers here (e1 register 314 and e2 register 316) and two memory banks (memory banks 304 and 306), memory device 300 may comprise two or more dynamic redundancy registers and one or more memory banks. In one embodiment, memory device may only comprise a single dynamic redundancy register as discussed above.

Memory banks 304 and 306 have previously been described with respect to FIG. 1. Memory banks 304 and 306 also include two ports (326 and 328; 332 and 334, respectively) for performing read, write, and verify (or other data manipulation) operations. Memory bank 304 could, for example, comprise data words having even addresses while memory bank 306 comprises data words having odd addresses. Two ports 326 and 328 of memory bank 304 are coupled to bit lines of memory bank 304. Likewise, two ports 332 and 334 of memory bank 306 are coupled to bit lines of memory bank 306. Although shown with one read and one write port per memory bank, memory device 300 may comprise any desired number of read and write ports. For example, in one embodiment, memory device can comprise two write ports and a single read port. In one embodiment, a dual port memory bank is used. Thus, each port 326-336 could perform simultaneous read and write operations. However, one of ordinary skill in the art will understand that the discussion proceeds with pseudo-dual port memory banks 304-306 in mind to highlight specific teachings of the present disclosure. The Y-mux structure of the present disclosure allows pseudo-dual port memory banks 304-308 to perform simultaneous write and verify operations sharing common row address and different column address. As explained above, a pseudo-dual port memory bank may have one port optimized to perform write operations and another port optimized to perform read operations.

As shown in FIG. 3, the memory device may comprise two memory banks. Alternatively, the memory device may comprise several memory banks, e.g., 2, 4, 8, 16 etc. In one embodiment, each memory bank will be associated its own respective pipeline. In another embodiment, each memory bank will be associated with a dedicated pipeline and a dedicate device redundancy register. In other words, the memory device will contain an e1 register for each of the memory banks. If each memory bank has a dedicated e1 register, the size of each of the e1 registers will likely be smaller than an e1 register that services all memory banks. This will likely increase re-write and verify efficiency.

With respect to memory bank 304, write port 326 allows transmission of signals comprising write address and write data to memory bank 304 from pipeline bank 308. Port 328 allows transmission of data signals comprising read address or verify address to memory bank 304 from pipeline bank 308. Port 330 allows transmission of data signals comprising read data word from memory bank 304 to pipeline bank 308.

Pipeline banks 308 and 310 comprise data registers for implementing the write, read, and verify (and other data manipulation) operations of the present disclosure. Pipeline banks 308 and 310 are coupled to memory banks 304 and 306, respectively, using pseudo-dual port structures, as explained above, for providing simultaneous write and verify operations. Moreover, pipeline banks 308 and 310 are coupled to input register 312. As explained in connection with FIG. 5, pipeline banks 308 and 310 implement a pipeline structure that allows verify and write operations to be simultaneously performed on memory banks 304 and 306. Moreover, pipeline banks communicate with e1 register 314 to implement a pipeline structure of the present disclosure.

Input register 312 comprises data storage elements comprising data bits. Input register comprises a data word, an associated addresses within memory banks, and control bits indicating a system operation such as system read or system write. For example, input register 312 may comprise a data word to be written to memory banks (received from data signal 322), the address of the data (received from address signal 324), and control bits. Input register 312 may be coupled to pipeline bank 308 and pipeline bank 310 to communicate a data word, its associated address, and control bits. One of ordinary skill in the art will recognize that other connections are possible and consistent with the teachings of the present disclosure and the specific connections are shown for ease of understanding. For example, input register 312 may be coupled to e1 register 314 for transferring the associated address of data word to e1 register 312 and control signals.

The e1 register 314 has been described in connection with FIG. 1, and will also be further described in connection with FIG. 7. The e1 register 314 is coupled to pipeline banks 308 and 310 and e2 register 316. The e1 register 314 comprises data storage elements comprising data bits. For example, e1 register 314 may comprise data word and associated addresses for data words that have failed to verify correctly within memory banks 304 and 306. The e1 register 314 may comprise data words and associated addresses for data words that have not yet been verified within memory banks 304 and 306. The e1 register 314 may also comprise data words and associated addresses for data words that have failed to read from memory banks 304 and 306 within an associated error budget.

The e2 register 316 has been described in connection with FIG. 1, and will also further be described in connection with FIG. 8. The e2 register 316 may be coupled to e1 register 314. As noted above, the e2 register 316 can, in one embodiment, be optional. The e2 register 316 comprises data storage elements comprising data bits. The e2 register 316 comprises data words, associated addresses, and control bits. These data words have typically failed to write to memory banks 304 and 306. These words may have also been written from e1 register 314 to e2 register 316 because of power down of memory device 300 or lack of space within e1 register. In one embodiment, e2 register 316 may optionally be coupled to pipeline banks 308 and 310 or memory banks 304 and 306 in order to write data words (or other signals). For example, rather than storing data words and associated address from e1 register 316, e2 register may store remap addresses within memory banks 304 and 306 for writing directly to memory banks through a remap process. In another embodiment, e2 register 316 writes data to memory banks 304 and 306 during power down.

Figure 4:
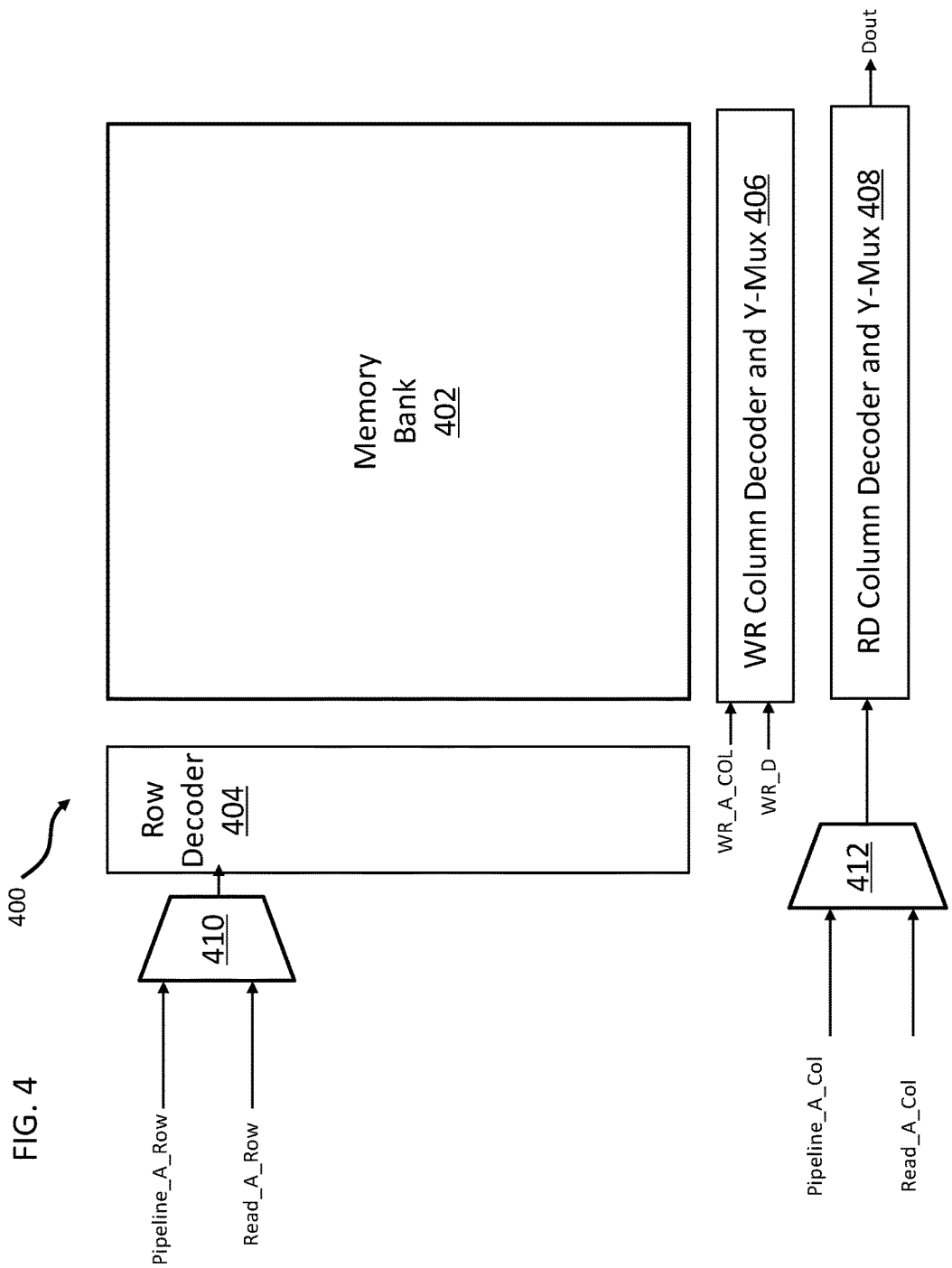
FIG. 4 is a block diagram of exemplary embodiment of a memory device of the present disclosure showing Y-mux structure.

FIG. 4 is a block diagram of exemplary embodiment of a memory device of the present disclosure showing a Y-mux structure. The Y-mux structure of the present disclosure allows pseudo-dual port memory banks to perform simultaneous write and verify operations sharing common row address and different column address. Accordingly, the Y-mux structure prevents the e1 register from overflowing by allowing both a write and verify operation to take place in the same cycle (provided they share a common row address). FIG. 4 shows portion of memory device 400 comprising memory bank 402, row decoder 404, write column decoder and y-mux 406, read column decoder and y-mux 408, and muxes 410-412.

FIG. 4 shows a Y-mux structure for decoders 406-408. As mentioned above, the Y-mux structure allows simultaneous verify and write operations for data words sharing a common row address (word line) in the memory bank but different column address. In one embodiment, one set of x addresses (common row address) and two sets of y addresses (one for the write and another for the verify operation) are inputted into the Y-mux structure. The row address (x address) for both the verify and the write operation need to be the same. Further, the addresses for verify and write operations need to address different columns. In other words, the verify and write operation cannot be performed at the same column address. In one embodiment, instead of a pseudo-dual port memory bank utilizing the Y-mux structure, a dual ported memory bank can be used that allows two writes or two reads to be performed simultaneously.

Memory bank 402 is coupled to decoders 404-408. Row decoder 404 takes as an input the row of address for data word that is to be written to or read or verified from memory bank 402. Row decoder then determines appropriate row for the data word. In various embodiments, a data word is a pre-defined number of bits for a piece of information handled by a memory device. For example, a data word may comprise 8, 16, 24, etc. bits. The size of a data word is dependent on the memory device and may be varied as necessary.

Mux 410 is coupled to row decoder 404. Mux 410 takes as inputs the pipeline row address (Pipeline_A_Row) and read row address (Read_A_Row). Pipeline row address indicates the row address for data words received from the pipeline for either a write or verify operation. Typically, the pipeline row address indicates a shared row address between a data word to be written to memory bank 402 and another data word to be simultaneously verified in memory bank 402. Read row address indicates a row address for a data word to be read from memory bank 402. Read row address generally takes precedence over pipeline row address when pseudo-dual port memory bank 402 is used. Mux 410 then outputs appropriate row address to row decoder 404. Row address decoder 404 then activates the appropriate row in memory bank 402. Appropriate activation schemes will be known to those with ordinary skill in the art.

Write column decoder and y-mux 406 is coupled to memory bank 402. Write column decoder and y-mux 406 takes as inputs write address column WR_A_Col and write data WR_D, such as data word. Write address column indicates a column address for a system write or re-write operation received from the pipeline structure of the present disclosure. Write column decoder and y-mux 406 then determines appropriate column address for write operation. Write column decoder and y-mux 406 then activates the appropriate column in memory bank 402. Appropriate activation schemes will be known to those with ordinary skill in the art.

Read column decoder and y-mux 408 is coupled to memory bank 402. Read column decoder and y-mux 408 takes as its input the column address output from mux 412. Read column decoder and y-mux 408 then determines the appropriate column for read operation. Read column decoder and y-mux 408 then activates the appropriate column in memory bank 402. Appropriate activation schemes will be known to those with ordinary skill in the art.

Mux 412 is coupled to read column decoder and y-mux 408. Mux 412 takes as inputs pipeline column address (Pipeline_A_Col) and read column address (Read_A_Col). Pipeline column address indicates column address of data word that should be verified in memory bank 402. Pipeline column address is received from the pipeline structure. Read column address indicates a column address for a data word that should be read from memory bank 402. Typically, read column address takes precedence when a pseudo-dual port memory bank 402 is used. Mux 412 outputs signal comprising column address for read operation or verify operation to read column decoder and y-mux 408. Thus, operating together, row and column decoders 404-408 perform operation on specific addresses within memory bank 402 (for example, read, write, or verify).

One of ordinary skill in the art will understand that the Y-mux structure of column decoders and y-mux 406-408 allows memory bank 402 to be operated as a pseudo-dual port memory bank. A single port memory cell may thus be used, but memory bank 402 may simultaneously perform verify and write operations when those operations share a common row address but different column addresses. If a dual port memory bank 402 was used, read and write or verify and write operations could be performed simultaneously (and not necessarily on a common row address). Further, with a dual port memory bank, two writes or two reads could be performed simultaneously as well. As mentioned above, in one embodiment, the pseudo-dual port of the memory bank is designed so that one port is optimized for a read operation and the other port is optimized for a write operation. The port that is optimized for a write operation can also perform reads because write ports typically require a strong driver. However the read port typically cannot perform writes because the driver does not support write operations with higher current requirements.

Figure 17:
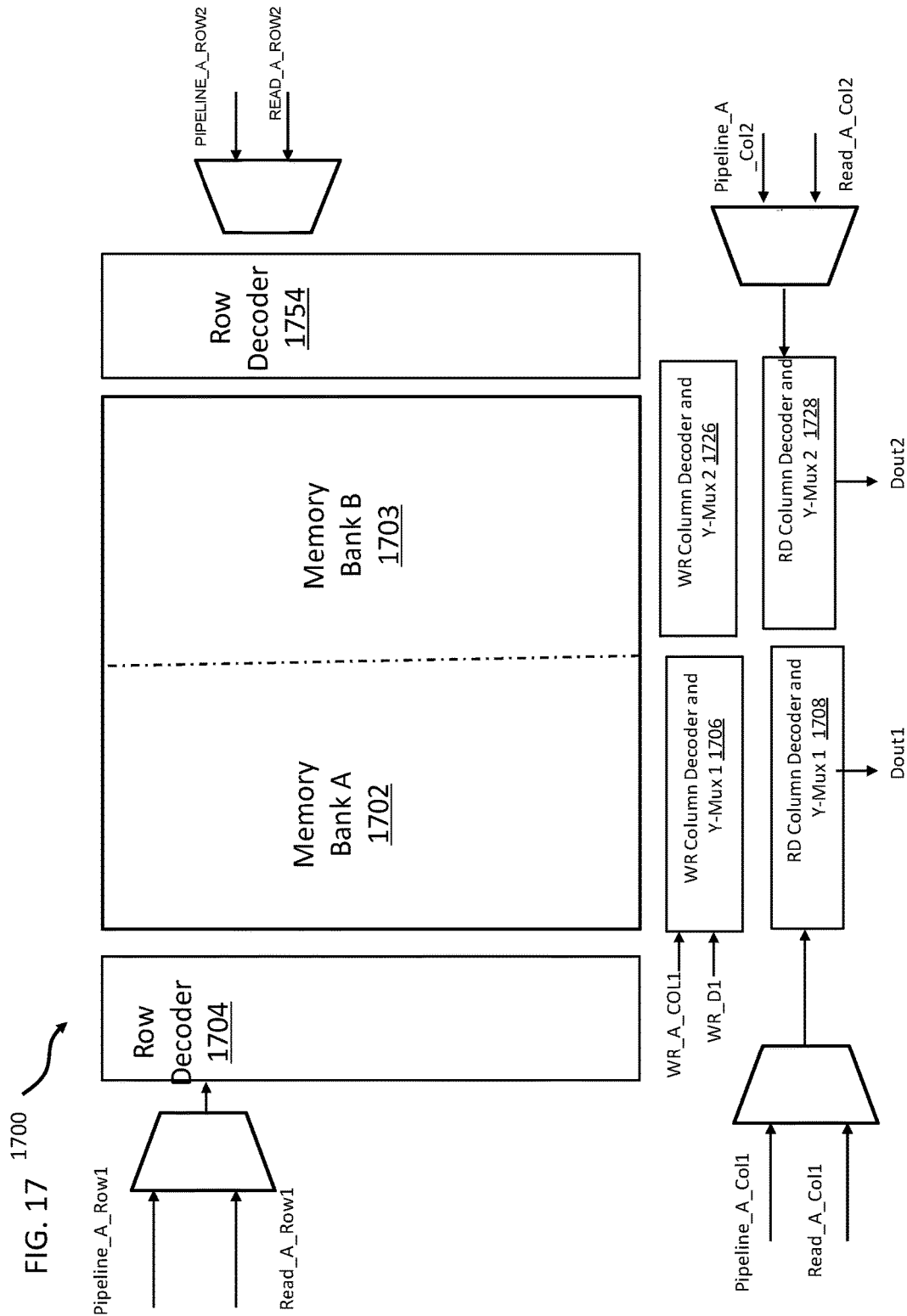
FIG. 17 illustrates the manner in which a memory bank can be segmented in accordance with an embodiment of the present invention.

A Memory Device with a Plurality of Memory Banks where Each Memory Bank is Associated with a Corresponding Memory Instruction Pipeline and a Dynamic Redundancy Register FIG. 17 illustrates the manner in which a memory bank can be segmented in accordance with an embodiment of the present invention. As shown in FIG. 17, a memory bank can be split into segments, memory bank A 1702 and memory bank B 1703. Instead of being driven by one set of row and column decoders, the memory bank is now split into two and driven from both sides with two sets or row and column decoders. The row decoders 1704 and 1754 perform substantially the same function as the row decoder 404 in FIG. 4. Similarly, the two segments can each be driven by a Write column decoder and Y-mux (e.g., 1706 and 1726) and a Read column decoder and Y-mux (e.g., 1708 and 1728). The write column decoder and Y-mux and the Read column decoder and Y-mux structures perform substantially the same function as the Write column decoder and Y-mux 406 and the Read column decoder and Y-mux 408 shown in FIG. 4.

Each of the segments may be considered a separate memory bank. As mentioned above, in an alternate embodiment, the memory device may comprise several memory banks or segments, e.g., 2, 4, 8, 16 etc. In one embodiment, each memory bank or segment will be associated its own pipeline. In another embodiment, each memory segment will be associated with a dedicated pipeline and a dedicated device redundancy register. In other words, the memory device will contain an e1 register for each of the memory banks or segments.

Figure 18:
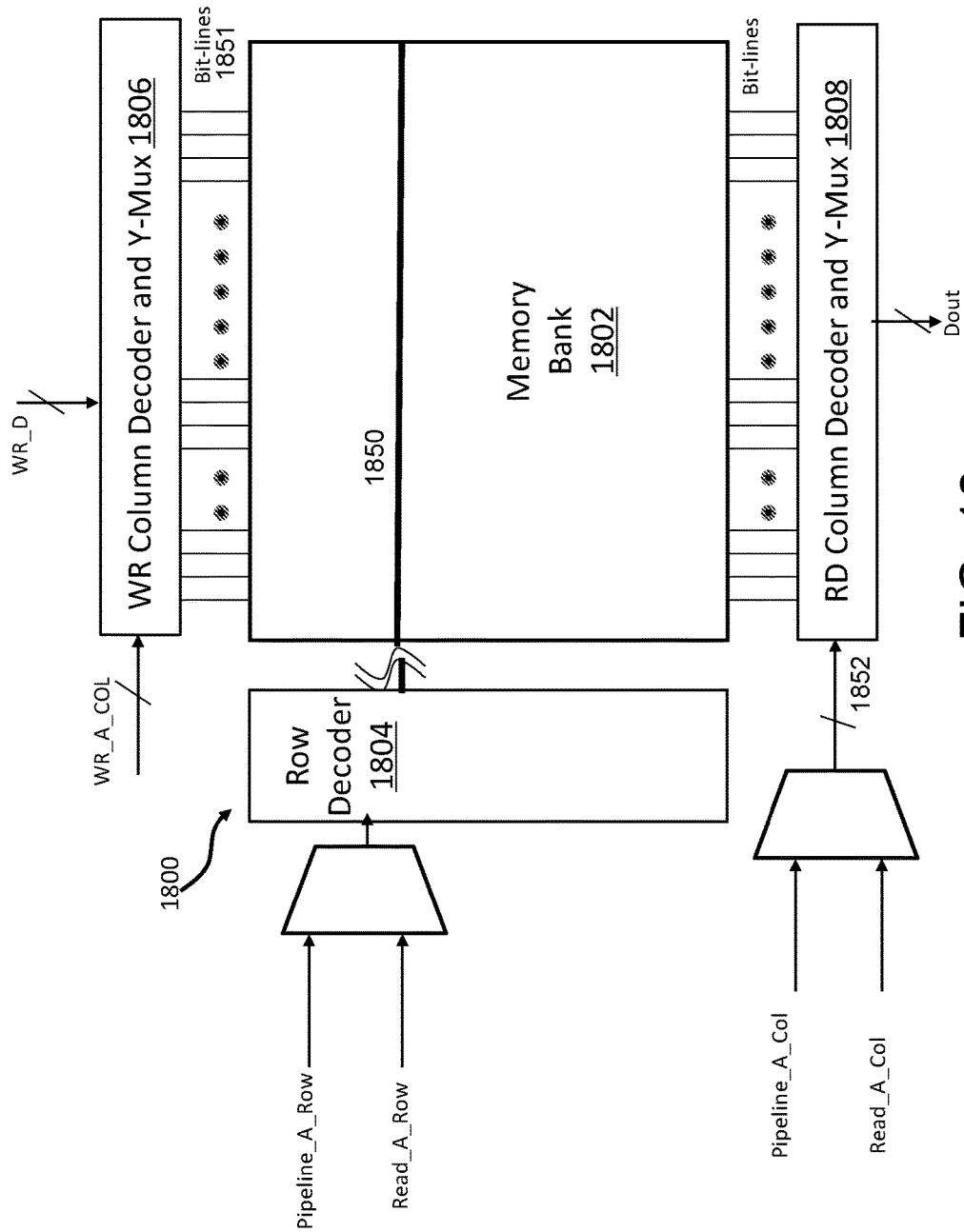
FIG. 18 is a block diagram of exemplary embodiment of a memory device of the present disclosure showing the operation of a row and column decoder in conjunction with a Y-mux structure in accordance with an embodiment of the present invention.

A Memory Device with a Dual Y-Multiplexer Structure for Performing Two Simultaneous Operations on the Same Row of A Memory Bank FIG. 18 is a block diagram of exemplary embodiment of a memory device of the present disclosure showing the operation of a row and column decoder in conjunction with a Y-mux structure in accordance with an embodiment of the present invention. As mentioned above, the Y-mux structure of the present disclosure allows pseudo-dual port memory banks to perform simultaneous write and verify operations sharing common row address and different column address. FIG. 18 shows portion of memory device 1800 comprising memory bank 1802, row decoder 1804, write column decoder and y-mux 1806, and read column decoder and y-mux 1808. Note that memory bank 1802, row decoder 1804, write column decoder and y-mux 1806, and read column decoder and y-mux 1808 perform substantially similar functions as the corresponding components in FIG. 4. Further note that write column decoder and y-mux 1806, row decoder 1804 and read column decoder and y-mux 1808 together comprise a read/write port for the pseudo dual port memory bank.

FIG. 18 shows a Y-mux structure for decoders 1806 and 1808. Memory bank 1850 will typically comprise a plurality of rows and column bit-lines. The Y-mux structure allows simultaneous verify and write operations for data words sharing a common row address (word line) in the memory bank but different column address. For example, the row decoder 1804 may activate a row address 1850 (an x address). At the same time, column decoder and Y-mux 1806 multiplexes the column bit-lines 1851 based on a column address (WR_A_COL) to arrive at the column lines associated with the addressed data word in the Y-mux. In other words, the WR_A_COL signal is used to select the appropriate column bit-lines 1851 to write the data inputted through the WR_D signal. In the same cycle as column decoder and Y-mux 1806 are writing a data word to the memory bank 1802, the read column decoder and Y-mux is used to perform the verify operation that shares the common row address (on row 1850) as the write operation. For example, the read address 1852 is used to select the appropriate bit-lines for the verify (or read) operation and the result is outputted through the D-out signal. Accordingly, the column decoder and Y-mux 1806 is used to write a data word into the memory bank 1802 at a row address 1850 in the same cycle as the read column decoder and Y-mux 1808 is used to verify (or read) a data word from row address 1850.

Figure 5:
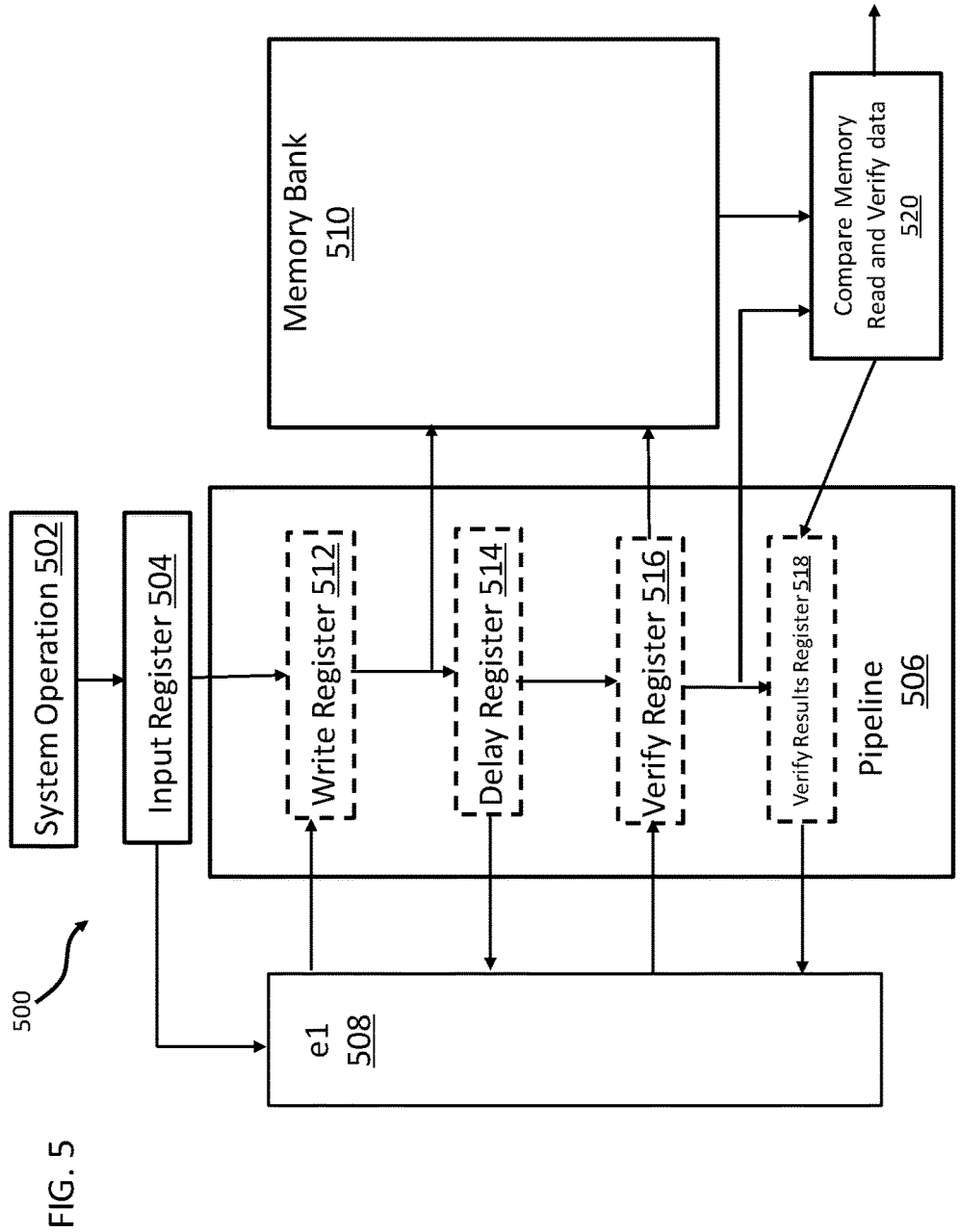
FIG. 5 is a block diagram of exemplary embodiment of a memory device of the present disclosure showing pipeline structure that allows verification and re-write operations.

FIG. 5 is a block diagram of exemplary embodiment of a memory device of the present disclosure showing pipeline structure that allows verification and re-write operations. FIG. 5 shows exemplary pipeline 500 for implementing the pipeline flow for system write, re-write, and verify operations, among other data manipulation operations. Pipeline 500 is implemented using system operations 502, input register 504, memory pipeline 506, e1 register 508, and memory bank 510. Memory pipeline 506 comprises write register 512, delay register 514, verify register 516, and verify results register 518. Moreover pipeline 500 comprises compare memory logic 520.

System operation 502 comprises signals for performing a desired operation such as system write and system read, among other data manipulation operations. As such, system operation 502 typically includes signals indicating a data word, the associated data address within memory bank 510, and control signals indicating the operation to be performed on memory bank 510 (such as write or chip select signal), among other signals for performing data manipulation operations and maintaining appropriate states. Typically, the signals from system operation 502 are stored in input register 504. Other configurations for signals from system operation 502 may be used without departing from the scope of the present disclosure. Moreover, other embodiments of pipeline 500 are possible without departing from the teachings of this disclosure. For example, delay register 514 allows delay between write and verify operation on a data word. STT-MRAM may require a delay between write operations at a particular address and verify operation at the common address. The delay cycle allows data storage elements within memory bank 510 to return to a stable state before performing verify operation. Other RAM technologies, and in some instances STT-MRAM itself, may not require such delay and delay register 514 is not necessary.

Input register 504 is coupled to write register 512. Input register 504 comprises data storage elements comprising data bits. In certain embodiments, input register 504 can include data bits for a data word, associated address, a valid bit, and other desired control bits. The input register 504 comprises the initial stage of the pipeline.

In one embodiment, for example, where a pseudo-dual bank memory bank is used, the input register 504 adds a delay in the pipeline that allows the memory device time to search for a data word and an associated address in the e1 register 508 that shares a common row address with a data word (associated with a write operation) in the input register. For example, a write operation may be received into the input register 504 from system operations 502 along with the data word to be written and its corresponding address. The input register provides the requisite delay to be able to search in the e1 register for a verify operation that shares a common row address with the data word associated with the write operation. As discussed above, e1 register 904 can receive a ROWchg signal that indicates row address change within a pipeline structure of the present disclosure. The ROWchg signal may indicate that another data word and associated address should be transmitted from e1 register 904 to the pipeline structure for a verify operation. If a pseudo-dual port memory bank is used, e1 register 904 may choose a data word and an associated address such that they share a common row address with a data word to be written into the write register of the pipeline structure. In this way, a write operation and a verify operation can be simultaneously performed since the data words share a common row address. The input register 504 provides the necessary delay in the pipeline to be able to look for the matching verify operation in the e1 register before the data word to be written is inserted into the write register 512. In other words, the delay of input register 504 allows enough time to search for the matching verify operation in the e1 register prior to inserting the data words to be written and verified into the write register 512 and the verify register 516 respectively.

The valid bit indicates whether data manipulation operations such as system write operation should be performed or the register should not be used to perform such operations. For example, valid bits based on a write signal and chip select signal provided by system operation 502 may indicate whether data word in input register is used for write. Input register 504 may also be coupled to e1 register 508, for example, to transmit associated address and control bits to e1 register 508. This associated address and control bits may be used in case of row address change in the pipeline or to invalidate an e1 register 500 entry with the same associated address, for example. For example, the address and control bits may be used to look for a pending verify operation in the e1 register that shares a common row address with a data word to be written into the memory bank.

An active memory bank of an embodiment of the present disclosure denotes a memory bank in which a system write or system read is taking place. Thus, an active bank signal (or an active bank bit) prevents re-writes during that clock cycle, and instead indicates that a system write or read will occur during that clock cycle. For example, an active bank signal indicates that write register 512 will write a data word previously received from input register 504 to memory bank 510 during that clock cycle. Thus, e1 register knows that data word for re-write operation should not be transmitted to write register 512 during that clock cycle. Input register 504 transmits data word, associated address, and desired control bits to write register 512.

The e1 register 508 has previously been described with respect to FIG. 1 and will be described in conjunction with FIG. 7. The e1 register 508 is coupled to input register 504, write register 512, delay register 514, verify register 516, and verify results register 520. The e1 register 508 may supply data word, associated address of a data word within memory bank 510, and control signals to write register 512, and verify register 516. The e1 register 508 may receive a data word, its associated address, and control signals from delay register 514 and verify results register 518. The e1 register 508 may also transmit a physical address within e1 register 508 in case the data word is already stored within e1 register 508. Although not shown, if delay register 514 were not used, e1 register 508 may receive data word, associated address, and control signals from write register 512. Moreover, e1 register 508 may communicate with input register to receive signals such as data word signal and control signal such as inactive bank signal.

Write register 512 is coupled to delay register 514 and memory bank 510. In other embodiments, write register 512 may be coupled to verify register 516. Write register 512 comprises data storage elements comprising data bits. Typically, write register 512 comprises data bits for a data word, its associated address, valid bit, and other desired control bits. The valid bit is a valid register bit and may be set to one when write register 512 contents are valid such that write operation may occur. Write register 504 receives data word, associated address, and desired control bits from input register 504 for system write operations. For memory bank clock cycles that write register 504 would not otherwise be writing system data words to that memory bank, e1 register 508 transmits data words, associated address, and desired control bits to write register 512. This allows write register 512 to attempt re-write operations when write register 512 would not otherwise be writing system data words to memory bank 510. As previously explained, when pseudo-dual port memory bank 510 is used, read operations generally take precedence over write operations from write register 512. Moreover, when pseudo-dual port memory bank 510 is used, write register 512 may perform write operation simultaneously with verify operation performed by verify register 516 if the operations share a common row address. Write register 512 also transmits data word, associated address, and desired control bits to delay register 514 (or verify register 516 if no delay register is used).

Delay register 514 is coupled to verify register 516 and e1 register 508. Delay register 514 comprises data storage elements comprising data bits. Typically, delay register 514 comprises a data word, associated address bits, a valid bit, and other desired control bits. Valid bit indicates if delay register 514 contents are valid. The delay register or multiple delay register could provide more clock cycle delay between write and verify. As previously explained, the delay register 514 is optional for RAM technologies that require delay between write and verify operations for a particular address within memory bank 510. If row address change occurs within memory pipeline 504, delay register 514 transmits data word, associated address, and desired control bits to e1 register 508. Thus, data word may be verified on a later clock cycle when write register will write a data word sharing a common row address. In another embodiment, data word may be verified on a later clock cycle when no verify operation will otherwise occur to the memory bank. If no row address change occurs within memory pipeline 504, after desired delay clock cycles, delay register 514 transmits the data word, associated address, and desired control bits to verify register 516.

Verify register 516 is coupled to memory bank 510 and verify results register 520. Verify register 516 comprises data storage elements comprising data bits. Typically, verify register 516 comprises a data word, its associated address, valid bit, and other desired control bits. Verify register 156 may comprise internal e1 address if data word was received as a result of re-write operation or verify operation from e1 register. Valid bit indicates whether verify register 516 contents are valid for verify operation. Verify register 516 contents, such as data word, can be sourced from either delay register 514 (or write register 512 in case delay register 512 is not used) or e1 register 508. Verify register 516 would receive contents from delay register 514 if no row address change has occurred. Verify register 516 would receive contents from e1 register 508 if row address change occurred. In one embodiment, verify register 516 receives the data word, its associated address, address within e1 register, fail count bits, and other desired control bits from e1 register 508. Verify register 516 transmits the associated address to memory bank 510 for the data word to be verified. Verify register 516 transmits the data word, fail count bits, and other desired status bits to compare data logic 520. Verify register 516 transmits the data word and its associated address to verify results register 518 in case of a system write. Verify register 516 transmits internal e1 address in case of re-write operation or verify from e1 register 508. Thus, if the data word and the associated address already exist e1 register 508, verify register 516 need not transmit the data word and the associated address to verify results register 518.

Compare memory logic 520 is coupled to verify register 516. Compare memory logic 520 comprises data storage elements comprising data bits. Compare memory logic 520 may comprise read or sense amplifiers to read a data word from memory bank 510. Hardware logic for implementing compare memory logic 520 can be used by those with ordinary skill in the art.

In the case of verify operation, compare memory logic 520 receives input from verify register 516 and memory bank 510. Memory bank 510 outputs a data word to compare memory logic 520 based on the associated address transmitted from verify register 516. Compare memory logic 520 also receives the data word from verify register 516. Thus, compare memory logic 520 determines whether the write operation passed or failed. Compare memory logic 520 makes the pass/fail determination based on methods desired by those with ordinary skill in the art. In one embodiment, compare memory logic 520 determines whether the data word from verify register 516 matches the data word from memory bank 510. In other embodiments, compare memory logic 520 deems that the operation passed if a predetermined number of bits match. If verify operation passed, compare memory logic 520 passes appropriate control bits to verify results register 518, for example fail count bits may be set to 0. Verify results register 518 may then invalidate the entry within e1 register if needed. If verify operation failed, verify results register 518 updates fail count bits within e1 register (in case of re-write or verify from e1) or transmits the data word, the associated address, and control bits to e1 register (in case of system write).

In the case of read operation, memory bank 510 outputs a data word, the associated address, and desired control bits to compare memory logic 520. Compare memory logic 520 determines whether the read operation passed or whether re-write operation should be performed on memory bank 510 because too many errors occurred while reading the data word. In one embodiment, compare memory logic 520 corrects data words using ECC and parity bits associated with data words. If ECC determines that too many errors occurred (e.g., errors above a predetermined threshold), compare memory logic 520 also transmits the data word and control bits to verify results register 518.

Verify results register 518 is coupled to compare memory logic 520 and e1 register 508. Verify results register 518 comprises data storage elements comprising data bits. Typically, verify results register 518 comprises data bits for a data word, associated address, valid bit, and desired control bits. Valid bit indicates that contents of verify results stage register 518 are valid to be written to e1 register 508. Verify results register 518 may also comprise internal e1 address. Verify results register 518 transmits data to e1 register as previously explained.

One of ordinary skill in the art will understand that pipeline structure 500 is exemplary and may include more write, delay, verify, verify results registers, and compare logic blocks to allow more re-write attempts before writing failed data words to e1 register. Moreover, more registers and memory banks may be added without departing from the scope of the present disclosure.

Increased Pipeline Depth to Support Pre-Read Operations in a Memory Device

Figure 14:
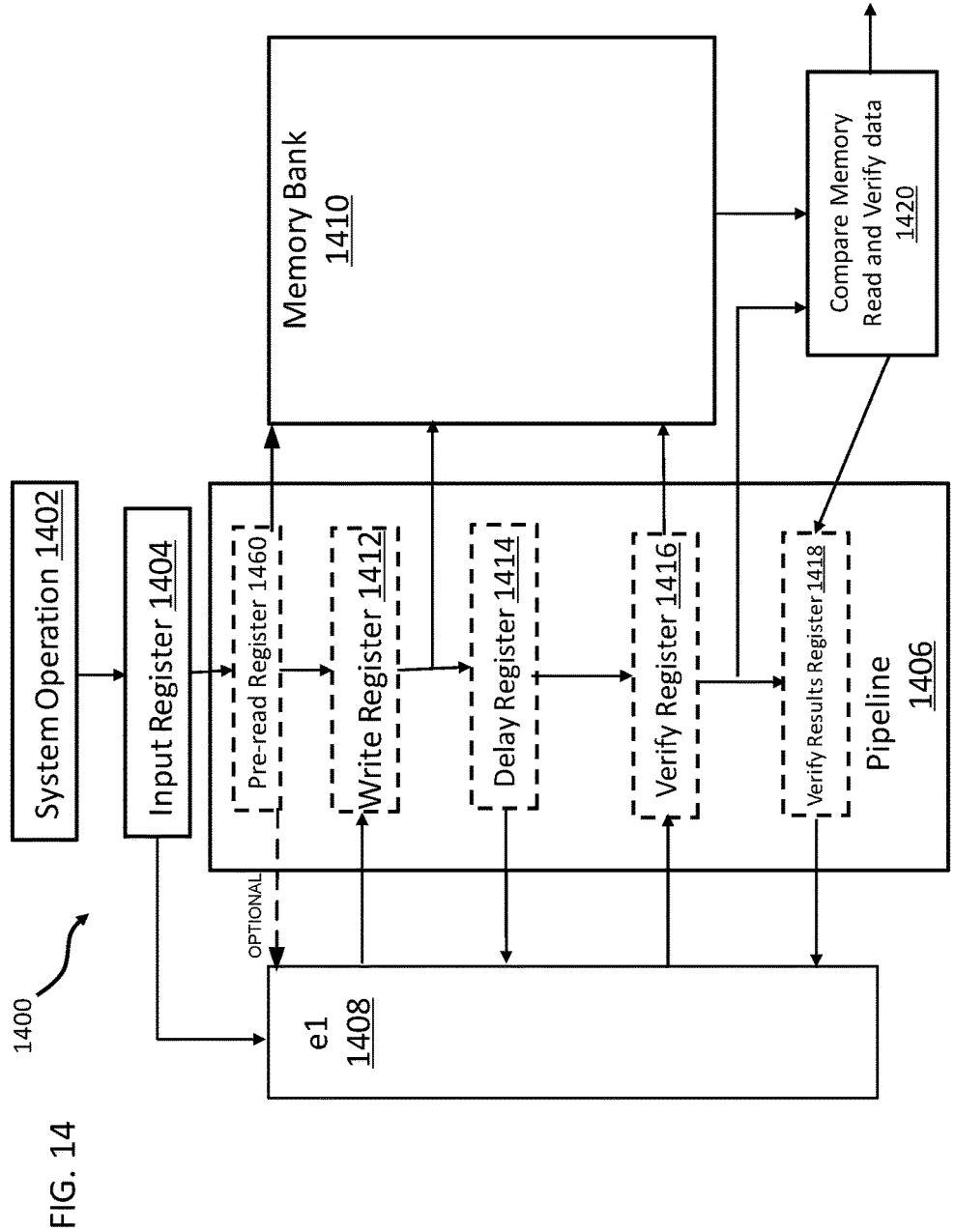
FIG. 14 is a block diagram of exemplary embodiment of a memory device of the present disclosure showing pipeline structure that allows pipestages for performing a pre-read operation for a write operation.

FIG. 14 is a block diagram of exemplary embodiment of a memory device of the present disclosure showing pipeline structure that allows pipestages for performing a pre-read operation for a write operation. FIG. 14 shows exemplary pipeline 1400 for implementing the pipeline flow for system pre-read, write, re-write, and verify operations, among other data manipulation operations. Pipeline 1400 is implemented using system operations 1402, input register 1404, memory pipeline 1406, e1 register 1408, and memory bank 1410. Memory pipeline 1406 comprises pre-read register 1460, write register 1412, delay register 1414, verify register 1416, and verify results register 1418. Moreover pipeline 1400 comprises compare memory logic 1420.

It should be noted that pipeline 1400 can be distinguished from pipeline 500 in that the memory pipeline 1406 comprises a pre-read register and pipe-stage 1460 prior to the write register 1412 and pipe-stage.

System operation 1402 performs substantially the same function as system operations 502 in FIG. 5. For example, system operation 1402 comprises signals for performing a desired operation such as system write and system read, among other data manipulation operations. As such, system operation 1402 typically includes signals indicating a data word, the associated data address within memory bank 1410, and control signals indicating the operation to be performed on memory bank 1410 (such as write or chip select signal), among other signals for performing data manipulation operations and maintaining appropriate states. Typically, the signals from system operation 1402 are stored in input register 1404. Other configurations for signals from system operation 1402 may be used without departing from the scope of the present disclosure. Moreover, other embodiments of pipeline 1400 are possible without departing from the teachings of this disclosure. For example, delay register 1414 allows delay between write and verify operation on a data word. STT-MRAM may require a delay between write operations at a particular address and verify operation at the common address. The delay cycle allows data storage elements within memory bank 1410 to return to a stable state before performing verify operation. Other RAM technologies, and in some instances STT-MRAM itself, may not require such delay and delay register 1414 is not necessary.

Input register 1404 is coupled to pre-read register 1460. Input register 1404 comprises data storage elements comprising data bits. In certain embodiments, input register 1404 can include data bits for a data word, associated address, a valid bit, and other desired control bits. The input register 1404 comprises the initial stage of the pipeline.

As mentioned above, in one embodiment, for example, where a pseudo-dual bank memory bank is used, the input register 1404 adds a delay in the pipeline that allows the memory device time to search for a data word and an associated address in the e1 register 1408 that shares a common row address with a data word (associated with a write operation) in the input register. For example, a write operation may be received into the input register 1404 from system operations 1402 along with the data word to be written and its corresponding address. The input register provides the requisite delay to be able to search in the e1 register for a verify operation that shares a common row address with the data word associated with the write operation. In this way, a write operation and a verify operation can be simultaneously performed since the data words share a common row address.

The valid bit, as discussed above, indicates whether data manipulation operations such as system write operation should be performed or the register should not be used to perform such operations. For example, valid bits based on a write signal and chip select signal provided by system operation 1402 may indicate whether data word in input register is used for write. Input register 1404 may also be coupled to e1 register 1408, for example, to transmit associated address and control bits to e1 register 1408. This associated address and control bits may be used in case of row address change in the pipeline or to invalidate an e1 register 1400 entry with the same associated address, for example. For example, the address and control bits may be used to look for a pending verify operation in the e1 register that shares a common row address with a data word to be written into the memory bank.

An active memory bank of an embodiment of the present disclosure denotes a memory bank in which a system write or system read is taking place. Thus, an active bank signal (or an active bank bit) prevents re-writes during that clock cycle, and instead indicates that a system write or read will occur during that clock cycle. For example, an active bank signal indicates that write register 1412 will write a data word previously received from input register 1404 to memory bank 1410 during that clock cycle. Thus, e1 register knows that data word for re-write operation should not be transmitted to write register 1412 during that clock cycle.

Input register 1404 transmits data word, associated address, and desired control bits to pre-read register 1460. A pre-read register 1460 can be used in the pipeline for several purposes. For example, the data word, associated address and control bits received from the input register 1404 could be associated with a write operation. If the information transmitted from input register 1404 into the pre-read register is associated with a write operation, a pre-read register 1460 can be used to reduce power consumption by pre-reading the data word to be written from memory bank 1410. Power consumption is reduced as a result of performing a pre-read because instead of writing the data word received from the input register 1404 directly into the memory bank at the associated address, the current data word stored at the associated address in the memory bank 1410 is pre-read to determine how many bits in the current data word need to be flipped in order to conform it to the newly received data word. For example, if the newly received data word to be written into the memory bank comprises all 1's, but the pre-read operation determines that the data word already written into memory bank at the associated address also comprises all 1's, then power is saved because the newly received data word would not need to be re-written into the memory. Accordingly, the pre-read operation reduces power consumption by reducing the number of bits that need to be written for each write operation. In other words, the pre-read operation takes into account that some of the bits in a given word may already be in the correct orientation so a write operation does not need to typically write all the bits in the word.

In another embodiment, a pre-read operation is performed as part of a bit-redundancy remapping protocol. Examples of on-the-fly bit failure detection and bit redundancy remapping techniques are described in U.S. patent application Ser. No. 15/792,672, filed Oct. 24, 2017, entitled "ON-THE-FLY BIT FAILURE DETECTION AND BIT REDUNDANCY REMAPPING TECHNIQUES TO CORRECT FOR FIXED BIT DEFECTS" and hereby incorporated by reference in its entirety.

In one embodiment, the pre-read register 1460 may require extra bits to carry the information acquired as a result of the pre-read operation. In other words, the pre-read register 1460 not only needs to store the data word, associated address, and desired control bits received from the input register 1404, but it also needs to store information acquired as a result of the pre-read operation, e.g., the bits read from memory bank 1410. For example, the pre-read register 1460 may need to store mask bits comprising information regarding the bits in the data word received from the input register that need to be flipped in order to correctly perform the write operation. Further, the mask bits also need to store information regarding the direction in which the bits get flipped. In one embodiment of the present invention, pre-read register may also need to store ECC bits in order to perform error correction on the bits that are read from and written to memory bank 1410.

In one embodiment, instead of carrying the additional bits of storage within the pre-read register itself, the memory device can store the additional bits within e1 register 1408. However, as shown in FIG. 14, the connection between the pre-read register 1460 and the e1 register 1408 is optional. In a more typical embodiment, the additional bits will be stored within the pre-read register 1460, because storing the additional data in the e1 register may not be desirable in certain circumstances because of size considerations.

The e1 register 1408 performs substantially the same function as the e1 register described in conjunction with FIG. 5. The e1 register 1408 is coupled to input register 1404, write register 1412, delay register 1414, verify register 1416, and verify results register 1420. The e1 register may, in one embodiment, be also coupled to pre-read register 1460. The e1 register 1408 may supply data word, associated address of a data word within memory bank 1410, and control signals to write register 1412, and verify register 1416. The e1 register 1408 may receive a data word, its associated address, and control signals from delay register 1414 and verify results register 1418. The e1 register 1408 may also transmit a physical address within e1 register 1408 in case the data word is already stored within e1 register 1408. Although not shown, if delay register 1414 were not used, e1 register 1408 may receive data word, associated address, and control signals from write register 1412. Moreover, e1 register 1408 may communicate with input register to receive signals such as data word signal and control signal such as inactive bank signal.

Write register 1412 is coupled to delay register 1414 and memory bank 1410. Write register 1412 performs substantially the same function as write register 512 in FIG. 5.

Delay register 1414 is coupled to verify register 1416 and e1 register 1408. Delay register 1414 performs substantially the same function as delay register 514 in FIG. 5.

Verify register 1416 is coupled to memory bank 1410 and verify results register 1420. Verify register 1416 performs substantially the same function as verify register 516 in FIG. 5.

Compare memory logic 1420 is coupled to verify register 1416. Compare memory logic 1420 performs substantially the same function as compare logic 520 in FIG. 5. Verify results register 1418 is coupled to compare memory logic 1420 and e1 register 1408. Verify results register 1418 performs substantially the same function as verify result register 518 in FIG. 5.

One of ordinary skill in the art will understand that pipeline structure 1400 is exemplary and may include more write, delay, verify, verify results registers, and compare logic blocks to allow more re-write attempts before writing failed data words to e1 register. Moreover, more registers and memory banks may be added without departing from the scope of the present disclosure.

Figure 19:
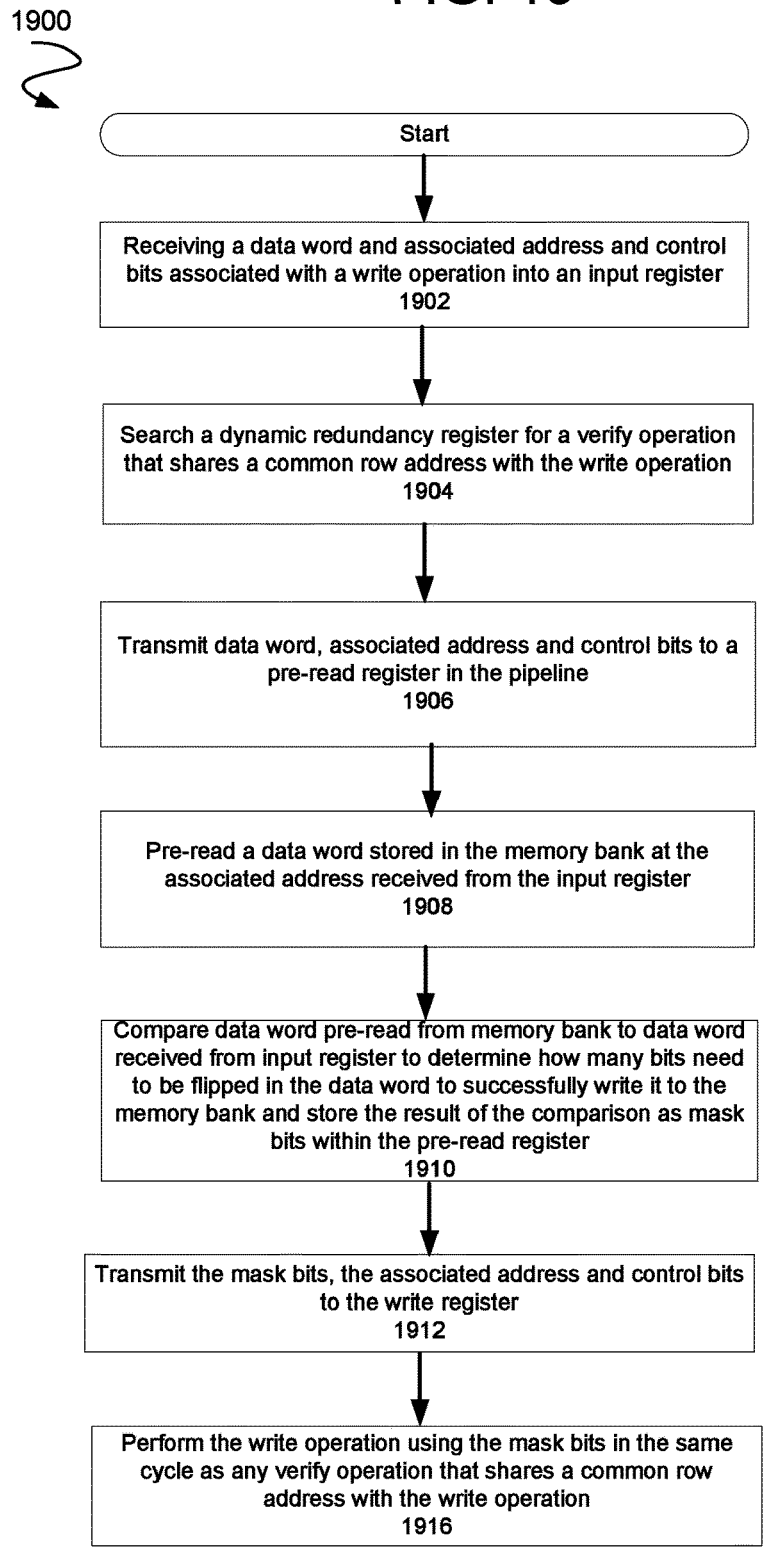
FIG. 19 depicts an exemplary embodiment for a process flow showing the manner in which a pre-read register is used to perform a write operation in an exemplary memory device of the present disclosure.

FIG. 19 depicts an exemplary embodiment for a process flow showing the manner in which a pre-read register is used to perform a write operation in an exemplary memory device of the present disclosure.

At step 1902, a data word, an associated address and control bits are received into the input register 1404 from system operations 1402.

At step 1904, as mentioned above, in one embodiment, the input register 1404 adds a delay in the pipeline that allows the memory device time to search for a data word and an associated address in the e1 register 1408 that shares a common row address with a data word (associated with a write operation) in the input register.

At step 1906, the input register 1404 transmits data word, associated address, and desired control bits to pre-read register 1460. As indicated above, the pre-read register 1460 can be used in the pipeline for several purposes. For example, the data word, associated address and control bits received from the input register 1404 could be associated with a write operation. If the information transmitted from input register 1404 into the pre-read register is associated with a write operation, a pre-read register 1460 can be used to reduce power consumption by pre-reading the data word to be written from memory bank 1410.

Accordingly, at step 1908, the data word stored in the memory bank at the associated address received from the input register is pre-read.

At step 1910, the data word pre-read from the memory bank is compared to the data word received from the input register to determine which bits need to be flipped in the data word stored in the memory bank in order to successfully write the new data word received from the input register into the memory bank. The results of the comparison can, in one embodiment, be stored as mask bits in the pre-read register. In one embodiment, compare logic may be built into the pipeline to perform this comparison. As mentioned above, in one embodiment, the pre-read register 1460 may require extra bits to carry the information acquired as a result of the pre-read operation. In other words, the pre-read register 1460 not only needs to store the data word, associated address, and desired control bits received from the input register 1404, but it also needs to store information acquired as a result of the pre-read operation, e.g., the bits related to the results of the compare operation.

At step 1912, at least the mask bits, the associated address and control bits may be transmitted to the write register. In a different embodiment, the data word to be written to the memory bank (received from the input register) may also be transmitted along with the mask bits.

At step 1916, the write operation is performed using the mask bits. Further, if a data word and an associated address is received from the e1 register at step 1904, the verify operation that shares a common row address with the write operation is also performed in the same cycle as the write operation.

Figure 20:
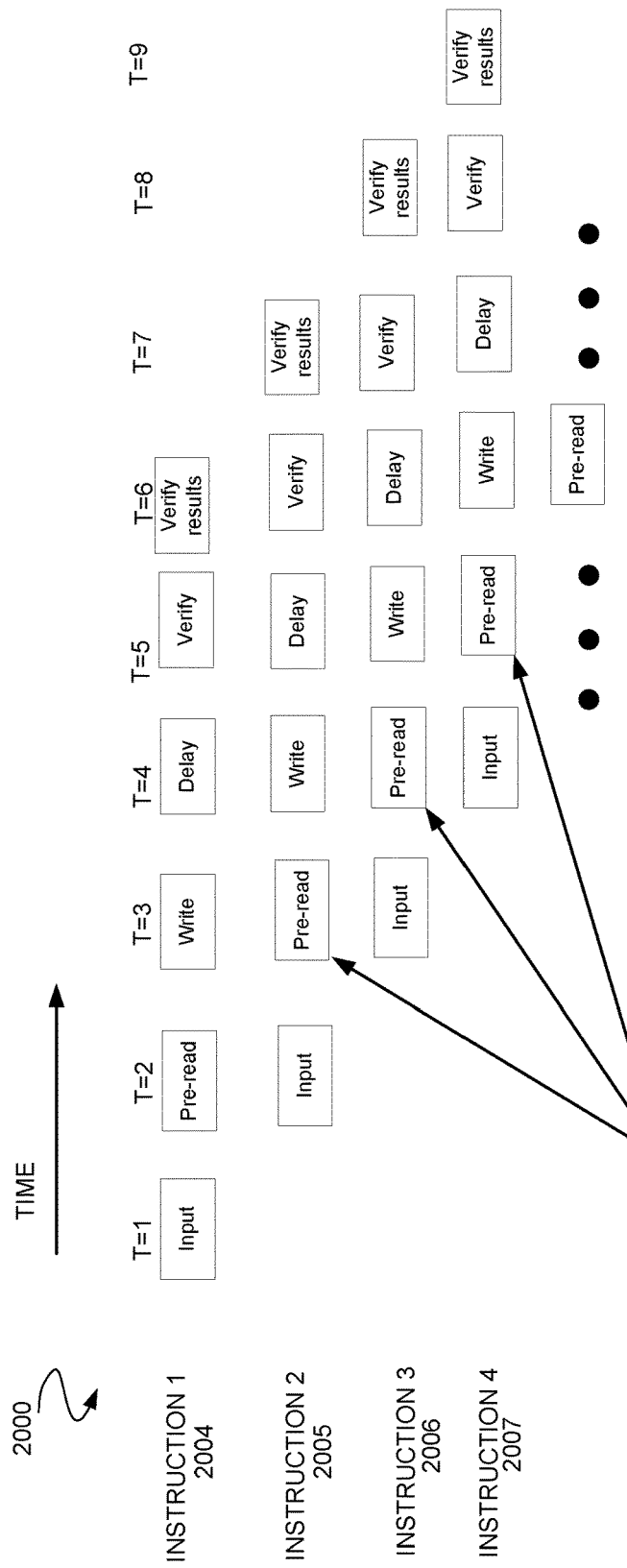
FIG. 20 is a block diagram of an exemplary pipeline structure for a memory device that comprises a pre-read pipe-stage for a write operation in accordance with an embodiment of the present invention.

FIG. 20 is a block diagram of an exemplary pipeline structure for a memory device that comprises a pre-read pipe-stage for a write operation in accordance with an embodiment of the present invention. As shown in pipeline structure 2000, at any given slice of time, e.g., T=3, T=4 and T=5, there will be a pre-read operation and a write operation being performed simultaneously. As each write is being performed in the write register, at any given slice of time, another write operation is coming into the pre-read register from the input register. For example, Instruction 1 2004 enters the pre-read pipestage at time T=2. At time, T=3, when Instruction 1 2004 enters the write register, Instruction 2 2005 enters the pre-read register. Similarly, at time T=4, Instruction 1 2004 enters the delay cycle, Instruction 2 enters the write register and new Instruction 3 2006 enters the pre-read register.

Accordingly, a read and a write operation will need to be performed to the memory bank 1410 at any given period of time. The memory device will, therefore, need an extra port into memory bank 1410. As mentioned earlier, a pseudo-dual port memory bank works in cases where in a single cycle at most a write operation is performed concurrently with a verify operation. The pipeline structure of FIG. 14 would require that a read and a write operation be performed concurrently with a verify operation. Accordingly, two read ports (one for a verify operation and one for a read operation) and one write port will be needed.

Figure 15:
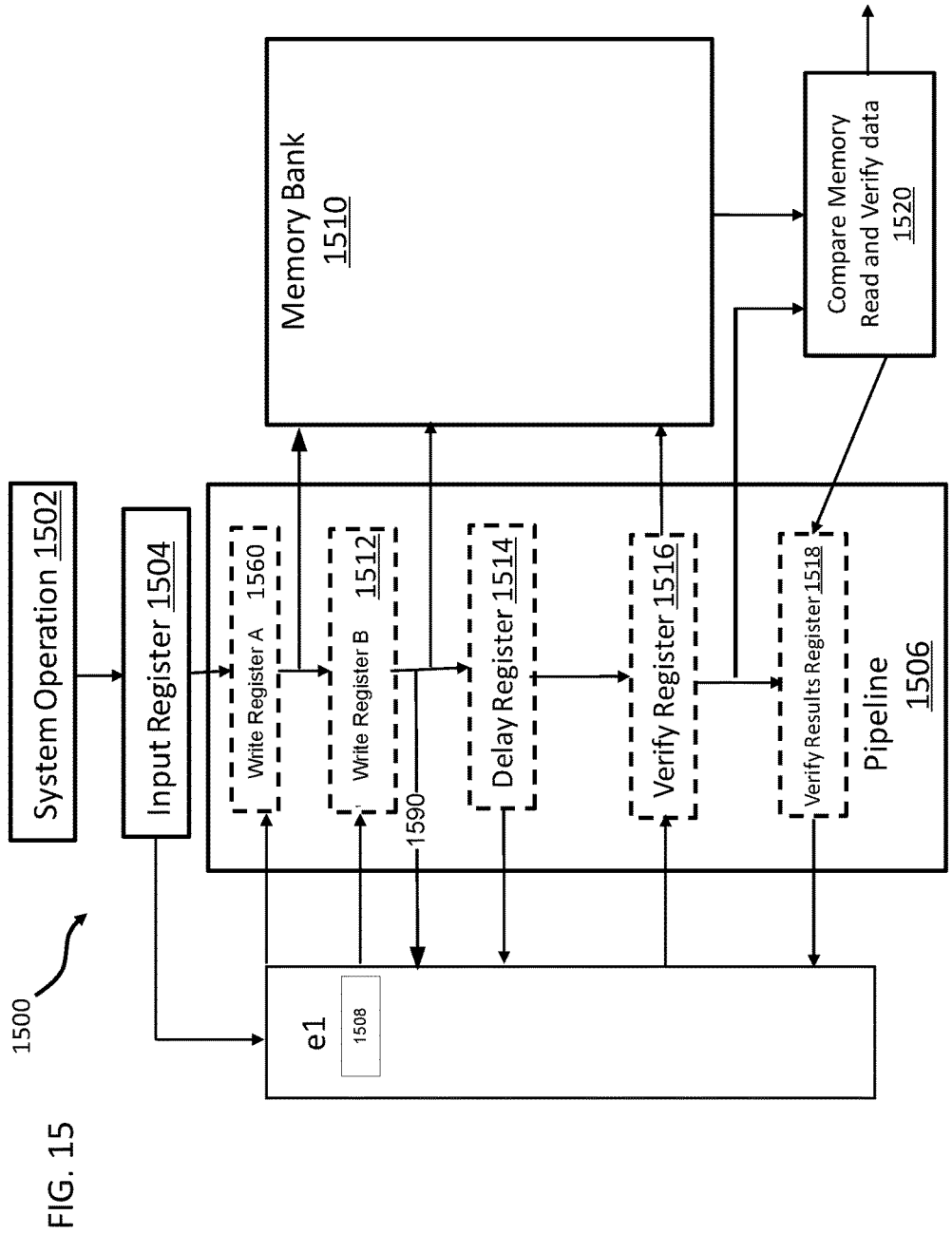
FIG. 15 is a block diagram of exemplary embodiment of a memory device of the present disclosure showing pipeline structure that allows an additional cycle for write operation for storing a data word.

Increased Pipeline Depth to Support Additional Write Operations in a Memory Device FIG. 15 is a block diagram of exemplary embodiment of a memory device of the present disclosure showing pipeline structure that allows an additional cycle for a write operation for storing a data word. The additional write cycle in FIG. 15 allows incoming data words to be written an additional window to be written accurately into the memory bank. FIG. 15 shows exemplary pipeline 1500 for implementing the pipeline flow for system write, re-write, and verify operations, among other data manipulation operations. Pipeline 1500 is implemented using system operations 1502, input register 1504, memory pipeline 1506, e1 register 1508, and memory bank 1510. Memory pipeline 506 comprises write register A 1560, write register B 1512, delay register 1514, verify register 1516, and verify results register 1518. Moreover pipeline 1500 comprises compare memory logic 1520.

System operation 1502 comprises signals for performing a desired operation such as system write and system read, among other data manipulation operations. As such, system operation 1502 typically includes signals indicating a data word, the associated data address within memory bank 1510, and control signals indicating the operation to be performed on memory bank 1510 (such as write or chip select signal), among other signals for performing data manipulation operations and maintaining appropriate states. Typically, the signals from system operation 1502 are stored in input register 1504. Other configurations for signals from system operation 1502 may be used without departing from the scope of the present disclosure.

Moreover, other embodiments of pipeline 1500 are possible without departing from the teachings of this disclosure. For example, delay register 1514 allows delay between write and verify operation on a data word. STT-MRAM may require a delay between write operations at a particular address and verify operation at the common address. The delay cycle allows data storage elements within memory bank 1510 to return to a stable state before performing verify operation. Other RAM technologies, and in some instances STT-MRAM itself, may not require such delay and delay register 1514 is not necessary.

Input register 1504 is coupled to write register 1512. Input register 1504 comprises data storage elements comprising data bits. In certain embodiments, input register 1504 can include data bits for a data word, associated address, a valid bit, and other desired control bits. The input register 1504 comprises the initial stage of the pipeline.

In one embodiment, for example, where a pseudo-dual bank memory bank is used, the input register 1504 adds a delay in the pipeline that allows the memory device time to search for a data word and an associated address in the e1 register 1508 corresponding to a verify operation that shares a common row address with a data word in the input register. The data word in the input register would be associated with a write operation that shares a common row address with the data word for the verify operation in the e1 register. For example, a write operation may be received into the input register 1504 from system operations 1502 along with the data word to be written and its corresponding address. The input register provides the requisite delay to be able to search in the e1 register for a verify operation that shares a common row address with the data word associated with the write operation. The input register 1504 provides the necessary delay in the pipeline to be able to look for the matching verify operation in the e1 register before the data word to be written is inserted into the write register 1512. In other words, the delay of input register 1504 allows enough time to search for the matching verify operation in the e1 register prior to inserting the data words to be written and verified into the write register 1512 and the verify register 1516 respectively.

The valid bit indicates whether data manipulation operations such as system write operation should be performed or the register should not be used to perform such operations. For example, valid bits based on a write signal and chip select signal provided by system operation 1502 may indicate whether data word in input register is used for write. Input register 1504 may also be coupled to e1 register 1508, for example, to transmit associated address and control bits to e1 register 1508. This associated address and control bits may be used in case of row address change in the pipeline or to invalidate an e1 register entry with the same associated address, for example. For example, the address and control bits may be used to look for a pending verify operation in the e1 register that shares a common row address with a data word to be written into the memory bank.

An active memory bank of an embodiment of the present disclosure denotes a memory bank in which a system write or system read is taking place. Thus, an active bank signal (or an active bank bit) prevents re-writes during that clock cycle, and instead indicates that a system write or read will occur during that clock cycle. For example, an active bank signal indicates that write register 1560 will write a data word previously received from input register 1504 to memory bank 1510 during that clock cycle. Thus, e1 register knows that data word for re-write operation should not be transmitted to write register 1512 during that clock cycle. Input register 1504 transmits data word, associated address, and desired control bits to write register A 1560.

The e1 register 1508 performs substantially the same functions as the e1 register discussed in conjunction with FIGS. 5 and 14. The e1 register 1508 is coupled to input register 1504, write register A 1560, write register B 1512, delay register 1514, verify register 1516, and verify results register 1520. The e1 register 1508 may supply data word, associated address of a data word within memory bank 1510, and control signals to write register A 1560, write register B 1512, and verify register 1516. The e1 register 508 may receive a data word, its associated address, and control signals from delay register 1514 and verify results register 1518. The e1 register 1508 may also transmit a physical address within e1 register 1508 in case the data word is already stored within e1 register 1508. Although not shown, if delay register 1514 were not used, e1 register 1508 may receive data word, associated address, and control signals from one of the write registers. Moreover, e1 register 1508 may communicate with input register to receive signals such as data word signal and control signal such as inactive bank signal.

Write register A 1560 is coupled to write register B 1512 and to memory bank 1510. Write register 512 comprises data storage elements comprising data bits. Typically, write register A 1560 comprises data bits for a data word, its associated address, valid bit, and other desired control bits. The valid bit is a valid register bit and may be set to one when write register A contents are valid such that write operation may occur. Write register A 1560 receives data word, associated address, and desired control bits from input register 1504 for system write operations. For memory bank clock cycles that write register A 1560 would not otherwise be writing system data words to that memory bank, e1 register 1508 transmits data words, associated address, and desired control bits to write register 1560. This allows write register 1560 to attempt re-write operations when write register 1560 would not otherwise be writing system data words to memory bank 1510.

In one embodiment, write register A 1560 is coupled to another write register B 1512. Accordingly, pipeline 1500 comprises two write stages. The purpose of two write stages in the pipeline is to attempt each write operation at least twice prior to the verification stage. As mentioned earlier, STT-MRAM may suffer from a high write error rate (WER) and, accordingly, attempting to write each word at least twice prior to verification may reduce the WER associated with the memory.

Figure 16:
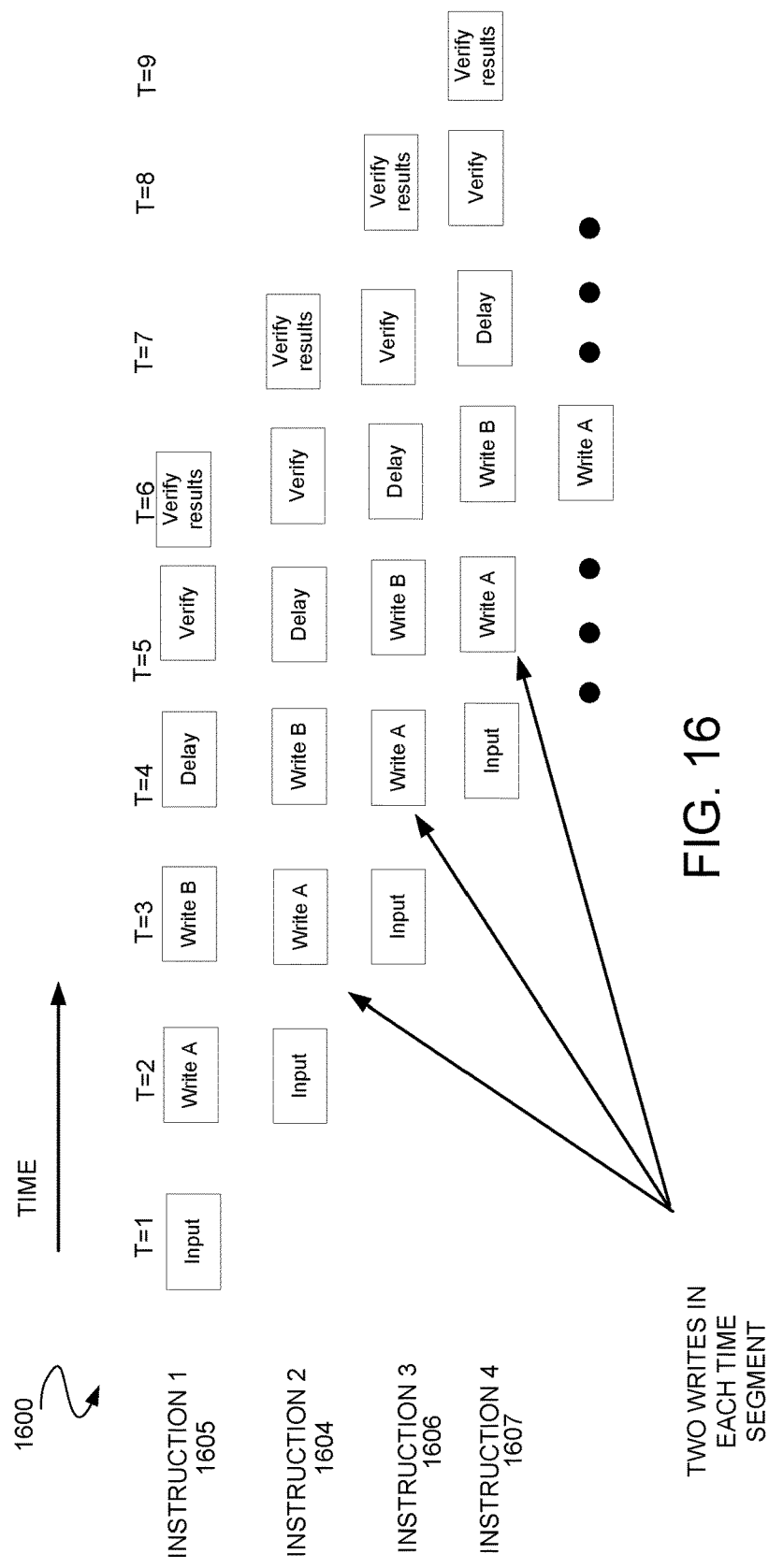
FIG. 16 is a block diagram of an exemplary pipeline structure for a memory device that comprises an additional write stage in accordance with an embodiment of the present invention.

In one embodiment, an extra port in the memory bank will be required to support an additional write operation. FIG. 16 is a block diagram of an exemplary pipeline structure for a memory device that comprises an additional write stage in accordance with an embodiment of the present invention. As shown in pipeline structure 1600, at any given slice of time, e.g., T=3, T=4 and T=5, there will be two write operations being performed simultaneously. Each write will be performed twice, however, at any given slice of time, as one write is going through its second cycle in write register B 1512, a new write will be incoming into write register A 1560. For example, Instruction 1 1605 enters write register A at time T=2. At time T=3, when Instruction 1 1605 enters write register B, Instruction 2 1604 enters write register A. Similarly, at time T=4, Instruction 1 1605 enters the delay cycle, Instruction 2 enters write register B and new Instruction 3 1606 enters write register A.

Accordingly, two write operations will need to be performed to the memory bank 1510 at any given period of time. The memory device will, therefore, need an extra port into memory bank 1510. As mentioned earlier, a pseudo-dual port memory bank works in cases where in a single cycle at most a write operation is performed concurrently with a verify operation. The pipeline structure of FIG. 15 would require that two write operations be performed concurrently with a verify operation. Accordingly, two write ports and a single read (or verify) port into memory bank 1510 will be needed. Two write ports are necessary because simply performing one write in a given cycle and inserting the other write into the e1 register would increase the size of the e1 register beyond practical limits.

In one embodiment, a tri-ported memory bank structure can be obtained by adding an extra write port to the pseudo-dual port memory bank structure using the Y-mux structure as explained in conjunction with FIG. 4. In a different embodiment, three separate ports are implemented into the memory bank 1510, wherein two ports are optimized for write operations and one port is optimized for read operations. As explained earlier, ports that are optimized for write operations will have higher current requirements and occupy more physical space than ports that are optimized for read operations. In one embodiment, the three ports are all implemented using the Y-mux structure discussed in conjunction with FIG. 4. In one embodiment, a true dual port memory bank is implemented for the two write operations and an extra port is added using the Y-mux structure for the read port.

In one embodiment, instead of two separate write stages in the pipeline 1500, a single write pulse that is double the width of a traditional write pulse can also be used. Within the time period of the single write pulse, there can be two attempts at writing the data word into memory bank 1510.

Write register A 1560 transmits data word, associated address, and desired control bits to write register B 1512. This way the same data word can be written twice to the memory bank 1510 in two separate cycles.

It should be noted that read operations generally take precedence over write operations from either of write registers. If a read operation occurs, then the pipeline is typically stalled to allow the read operation to terminate.

As discussed above, e1 register 1908 can receive a ROWchg signal that indicates row address change within a pipeline structure of the present disclosure. When a ROWchng signal is received in the embodiment of FIG. 15, there will be an unfinished write in write register A 1560 and a write that has not been verified yet in write register B 1512. Accordingly, in the embodiment of FIG. 15, the e1 register will typically be larger than other embodiments because upon receiving a ROWchg signal, two entries from the pipeline will be inserted into the e1 register while the memory operation causing the row change signal to assert is allowed to enter the pipeline. The entry from write register A 1560 will need to be re-written and the entry from write register B 1512 will need to be verified. In one embodiment, if a ROWchg signal is received, the data word that has only passed through one write stage can be transferred to the e1 register through connection 1590 while the other data word that has passed through both write stages can be transferred to the e1 register through the delay register 1514. The data word sent to the e1 register through connection 1590 would need to be re-written while the data word transmitted from the delay register 1514 would need to be verified during a later cycle.

Further, similar to the embodiments discussed in connection with FIGS. 5 and 14, the ROWchg signal may also be used to indicate that another data word and associated address should be transmitted from e1 register 1508 to the pipeline structure for a verify operation. If a pseudo-dual port memory bank is used, e1 register 1508 may choose a data word and an associated address such that they share a common row address with a data word to be written into the write register of the pipeline structure. In this way, a write operation and a verify operation can be simultaneously performed since the data words share a common row address. The input register 504 provides the necessary delay in the pipeline to be able to look for the matching verify operation in the e1 register before the data word to be written is inserted into the write register 512. In other words, the delay of input register 1504 allows enough time to search for the matching verify operation in the e1 register prior to inserting the data words to be written and verified into the write registers and the verify register 516 respectively. In the embodiment of FIG. 15, since the write operation passes through two stages of the pipeline, the e1 register has another cycle to be able to look for the matching verify operation. Accordingly, the delay in the input register 1504 may not be necessary to provide sufficient time to find a matching verify operation.

Write register B 1512 is coupled to delay register 1514 and memory bank 1510. In other embodiments, write register 1512 may be coupled to verify register 1516. Write register 1512 comprises data storage elements comprising data bits. Typically, write register 1512 comprises data bits for a data word, its associated address, valid bit, and other desired control bits. The valid bit is a valid register bit and may be set to one when write register 1512 contents are valid such that write operation may occur. Write register 1504 receives data word, associated address, and desired control bits from write register A 1560 so that the data word can be written into memory bank 1510 a second time.

For memory bank clock cycles that write register 1504 would not otherwise be writing system data words to that memory bank, e1 register 1508 transmits data words, associated address, and desired control bits to write register 1512. This allows write register 1512 to attempt re-write operations when write register 1512 would not otherwise be writing system data words to memory bank 1510. In one embodiment, the e1 register 1508 can also transmit data words associated with re-write operations to write register A 1560 so that the re-write operations may also be attempted at least twice in the pipeline.

Delay register 1514 is coupled to verify register 1516 and e1 register 1508. Delay register 1514 comprises data storage elements comprising data bits. Typically, delay register 1514 comprises a data word, associated address bits, a valid bit, and other desired control bits. Valid bit indicates if delay register 1514 contents are valid. The delay register or multiple delay register could provide more clock cycle delay between write and verify.

As previously explained, the delay register 1514 is optional for RAM technologies that require delay between write and verify operations for a particular address within memory bank 1510. If row address change occurs within memory pipeline 1504, delay register 1514 transmits data word, associated address, and desired control bits to e1 register 1508. Thus, data word may be verified on a later clock cycle when write register will write a data word sharing a common row address. In another embodiment, data word may be verified on a later clock cycle when no verify operation will otherwise occur to the memory bank. If no row address change occurs within memory pipeline 1504, after desired delay clock cycles, delay register 1514 transmits the data word, associated address, and desired control bits to verify register 1516. The addition of a delay between the write register 1560 and the verify register 1516 also allows the data transferred from the write register 1512 to stabilize before transferring the information to the verify register 1516. This prevents noise from being injected into the verify cycle.

Verify register 1516 is coupled to memory bank 1510 and verify results register 1520. Verify register 1516 performs substantially the same function as verify register 516 in FIG. 5.

It should be noted that in one embodiment the second write register B 1512 may be placed subsequent to the verify register 1516. In other words, instead of having two write registers back to back in the pipeline, one of the write registers may follow the verify register 1516. This way a write operation can be attempted in the first write cycle and verified thereafter to ensure that the operation completed successfully. If the write operation did not complete successfully, then another write cycle subsequent to the verify operation can be used to attempt a re-write. This may be more efficient in certain cases than performing two write operations consecutively on the same data word. Similarly, other combinations are possible that attempt one or more re-write operations at different stages of the pipeline.

In one embodiment, the pipeline illustrated in FIG. 15 could also have a pre-read register that performs substantially the same function as pre-read register 1460 in FIG. 14.

Compare memory logic 1520 is coupled to verify register 1516. Compare memory logic 1520 performs substantially the same function as compare logic 520 in FIG. 5. Verify results register 1518 is coupled to compare memory logic 1520 and e1 register 1508. Verify results register 1518 performs substantially the same function as verify result register 518 in FIG. 5.

One of ordinary skill in the art will understand that pipeline structure 1500 is exemplary and may include more write, delay, verify, verify results registers, and compare logic blocks to allow more re-write attempts before writing failed data words to e1 register. Moreover, more registers and memory banks may be added without departing from the scope of the present disclosure.

One of ordinary skill in the art will understand that pipeline structure 1500 is exemplary and may include more write, delay, verify, verify results registers, and compare logic blocks to allow more re-write attempts before writing failed data words to e1 register. Moreover, more registers and memory banks may be added without departing from the scope of the present disclosure.

Figure 6:
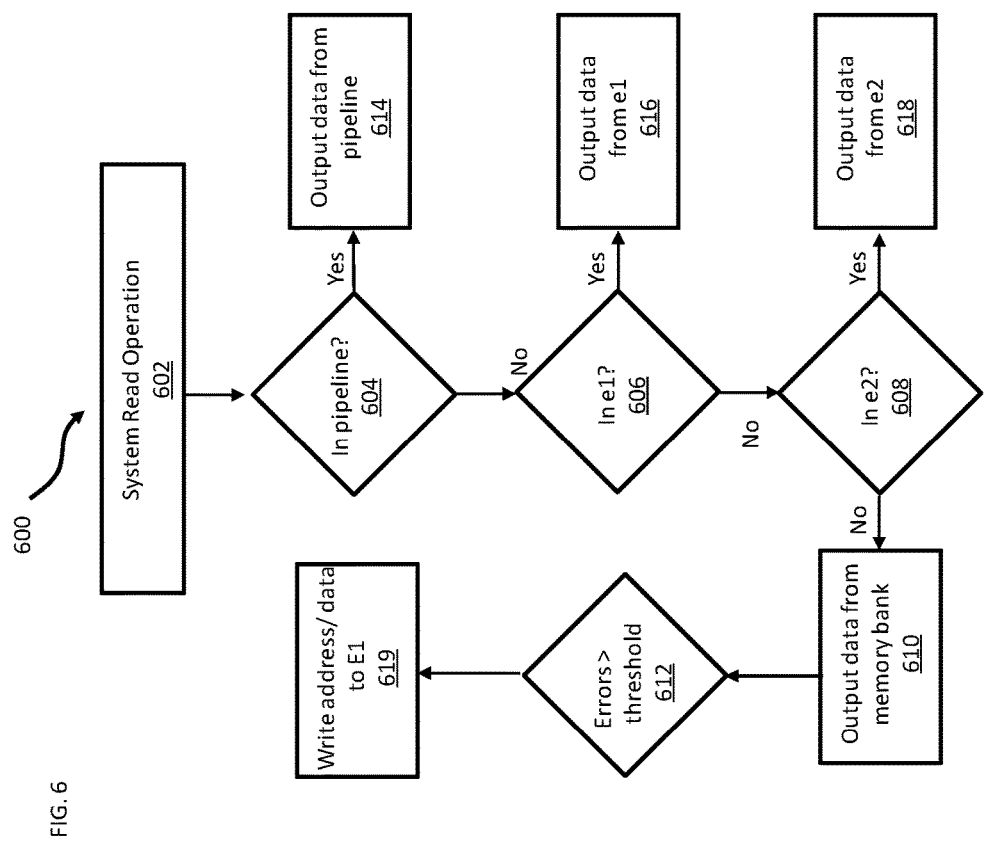
FIG. 6 is an exemplary process flow showing an embodiment of a system read operation using an embodiment of memory device of the present disclosure.

FIG. 6 is an exemplary process flow showing an embodiment of a system read operation using an embodiment of memory device of the present disclosure. FIG. 6 shows process flow 600 for system read operation of the present disclosure. Process flow 600 illustrates the high-level read operation performed on a memory device. In step 602, a system read operation to be performed on memory bank exists within a memory device. In step 604, the valid address stored in both pipeline banks are checked to determine whether the data word associated with system read operation exists there. If no, e1 register checks address to determine whether the data word associated with system read operation exists there in step 606. If no, e2 register checks the address to determine whether the data word associated with system read operation exists there in step 608. If no, the data word is read from memory bank at the associated address of system read operation in step 610. If the result of step 608 is yes, the data word is read from e2 register in step 618. If the answer to step 604 returned yes, then data word is read from pipeline 614. If the answer to step 606 is yes, then the data word is read from e1 register in step 616. One of ordinary skill in the art may recognize other process flows for system read operations without departing from the teachings of the present disclosure.

System read process flow 600 may include additional steps. After step 610, compare logic may determine whether system data word from memory bank was read within a predetermined error budget in step 612. If the data word output from memory bank contains errors, such errors may be corrected though ECC. If the data word output from memory bank contained more errors than allowed by a predetermined error budget, the data word may also be corrected and stored in e1 register in step 619. In this way, e1 register may attempt to re-write data word back to memory bank so that the data word may be read within a predetermined error budget on future read operations. The corrected data word and associated address would be stored within e1 register.

It should be noted that as discussed above, in one embodiment, the e2 register is optional. For memory devices without the additional dynamic redundancy register, the process flows from step 606 directly to step 610. In other words, at step 606, e1 register checks address to determine whether the data word associated with system read operation exists there. If no, then at step 610, the data word is read from memory bank at the associated address of system read operation in step 610.

Figure 7:
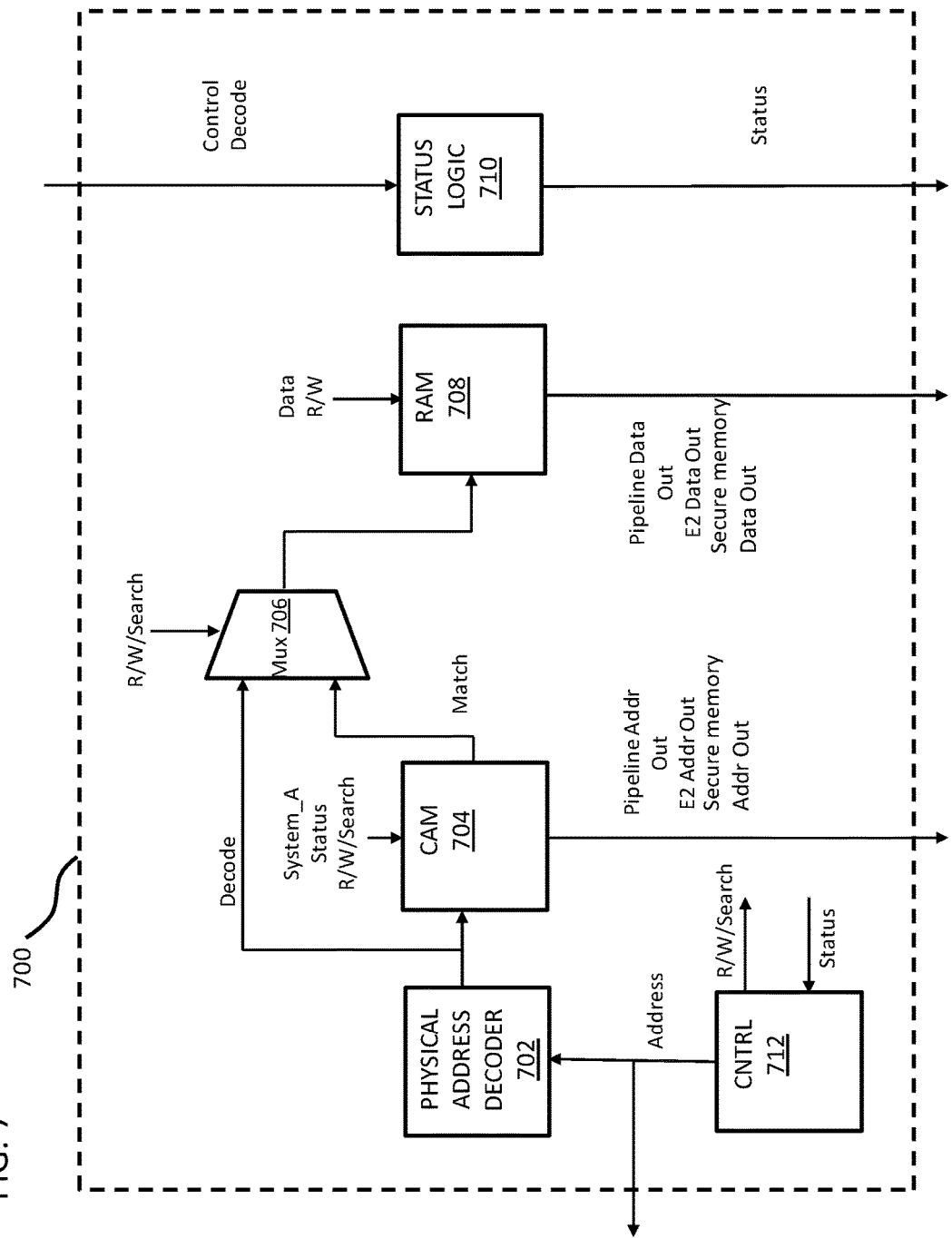
FIG. 7 is a block diagram of an embodiment of a memory device showing a first level dynamic redundancy register.

FIG. 7 is a block diagram of an embodiment of a memory device showing a first level dynamic redundancy register. FIG. 7 shows exemplary e1 register 700 described herein that comprises physical address decoder 702, CAM 704, mux 706, RAM 708, status logic 710, and control logic 712. One of ordinary skill in the art will recognize that e1 register 700 is exemplary, and includes features such as CAM 704 which are not required for achieving the teachings of the present disclosure. Moreover, e1 register 700 communicates control signals for maintaining consistency of operations both internally and to communicate with components of memory device such as pipeline banks, e2 register and secure memory storage, e.g., 932. Such control signals may be modified without departing from the teachings of the present disclosure.

Physical address decoder 702 is coupled to CAM 704, mux 706, and control logic 712. Physical address decoder 702 receives an address input from control logic 712. Physical address decoder 702 uses the address input to determine the appropriate physical addresses within CAM 704 and RAM 708 for performing data manipulation operation, such as read and write. Physical address decoder 702 selects an entry within CAM 704 using decode signal. Physical address decoder 702 may also select an entry within RAM 708 using decode signal to mux 706.

In one embodiment, physical address decoder 702 may take pointers as input from control logic 712. Different pointers from control logic 712 indicate available addresses for writing data to CAM 704 and RAM 708 or reading data from CAM 704 and RAM 708, or other pointers may be used. For example, pointers from control logic 712 may keep track of lowest open addresses within CAM 704 and RAM 704. Thus, e1 register 700 keeps track of addresses for storing new data. Pointers from control logic 712 may also keep track of oldest stored data within CAM 704 and RAM 708. Thus, re-write operations may be tried on a First-In-First-Out (FIFO) basis. Other schemes for addressing data within e1 register 700 and selecting data for data manipulation operations may be used by those with ordinary skill in the art without departing from the scope of this disclosure.

CAM 704 is coupled to mux 706. CAM 704 takes as input decode signal from physical address decoder 702. CAM 704 also takes as input an associated address which may be received from input register, delay register, or verify results register of a pipeline structure. CAM 704 also takes as input control bits such as read, write, or search signal received from control logic 712. CAM 704 also takes as input other control bits from status logic 710.

The associated address signals indicate addresses within a memory bank. Associated address signal is typically received from input register, delay register, or verify results register. Thus, e1 register 700 receives an address within a memory bank where data word should be verified or written. The e1 register 700 may also receive associated address from input register to be searched for words with matching row addresses which may be verified. As mentioned above, the input register allows a delay period for searching words associated with pending verify operations in the e1 register that have matching row addresses. CAM 704 will typically write associated address from delay register or verify results registers to itself, so that associated address may be used later for re-write or verify operation.

Status signal, such as valid bit, indicates whether physical address within CAM 704 contains valid data for data manipulation operation. CAM 704 may receive status signal from status logic 710.

Read signal indicates that CAM 704 should output an associated address, and RAM 708 should output the corresponding data word. CAM 704 may use decode and read signal to output an associated address of the data word stored in RAM 708. For example CAM 704 may output an associated address of the data word to write register. In this way, write register may write data from e1 register in a clock cycle during which it would otherwise be inactive.

Write signal indicates that the associated address should be stored within CAM 704 and the corresponding data word should be stored within RAM 708. For example, CAM 704 may use the associated address signal, decode signal, and write signal to write the associated address to a physical address within CAM 704. In one embodiment, this may occur because row address change occurred within pipeline structure and delay register sent a data word, an associated address, and control bits to e1 register 700 for storage. In another embodiment, verify results register may send a data word, an associated address, and control bits to e1 register 700 for storage because verify operation failed or data was not read within a predetermined error budget.

Search signal indicates that CAM 704 should search itself for an appropriate address. For example, CAM 704 uses search signal received from control logic 712 to search itself for an associated address to output to verify register. Thus, if row change has occurred in pipeline structure, CAM 704 may output the associated address of a data word sharing a common row address with the data word to be written from the pipeline. In addition, e1 RAM 708 outputs a data word matching the associated address within CAM 704 to the pipeline.

CAM 704 outputs associated addresses to the pipeline structure, such as to write register and verify register. CAM 704 also outputs associated addresses to e2 register or to secure memory storage area 932 (as discussed in connection with FIG. 9). CAM 704 may only output a portion of associated address. For example, if row address change occurred and CAM 704 searched itself for an appropriate address for verify operation, CAM 704 may output only the column address since the row address may be known. CAM 704 also outputs match signal to mux 706. Match signal indicates the physical address within RAM 708 of a data word that corresponds to the associated address within CAM 704. Match signal may be used when reading a data word from RAM 708.

Mux 706 takes as input read, write, search signal from control logic 712. Mux 706 also takes as input decode signal received from physical address decoder. Mux 706 also takes as input match signal from CAM 704. Mux then transmits select signal to RAM 708 for data manipulation operation. If mux 706 receives read signal, mux 706 typically transmits decode signal to RAM 708 because decode signal indicates the physical address within RAM 708 for read operation. If mux 706 receives write signal, mux 706 typically transmits decode signal to RAM 708 because decode signal indicates the physical address within RAM 708 for write operation. If mux 706 receives search signal, mux 706 typically transmits match signal to RAM 708 because match signal indicates the physical address within RAM 708 for outputting data word.

RAM 708 takes as input select signal from mux 706. RAM 708 also takes as input a data word received from pipeline structure, such as from delay register or verify results register. RAM 708 also takes as input read and write signals received from control logic 712. Select signal from mux 706 indicates the physical address within RAM 708 for performing data manipulation operation such as read or write operation. Data word signal indicates the data word for storage within RAM 708. Read signal indicates whether the physical address signal should be used for read operation such that data should be read from RAM 708 and output to pipeline structure or e2 register or secure memory storage. Write signal indicates whether select signal should be used for write operation such that data word signal should be written to RAM 708. RAM 708 typically comprises volatile memory such as SRAM, but may comprise non-volatile memory such as STT-MRAM.

Status logic 710 comprises hardware logic that drives the selection of addresses within control logic 710. Status logic 710 takes as input control signals from pipeline structure and e2 register. Control signals may include ROWchg flag previously discussed. Control signals may also indicate whether data words associated with verify and re-write operations in the e1 register should be processed prior to re-locating them to secure memory storage or if the contents of the e1 register should be dumped in their entirety into the secure memory storage area 932. Pipeline structure may also transmit fail count bits to status logic 710. In one embodiment, status logic 710 updates a valid bit associated with a data word to invalid in the case that status logic 710 receives fail count bits set to 0. That is, because control signals received from verify results register indicated that verify operation passed, e1 register 700 invalidates the entry associated with data word (associated addresses, data word, any associated control bits). Status logic may also take as input inactive signal indicating that memory bank may become inactive during a subsequent clock cycle. Thus, e1 register should output a data word to write register for a re-write operation. Status logic 710 may also receive control signals from e2 register. For example, status logic 710 may receive signal indicating that e2 register is ready for a new data word. Status logic 710 may also receive a signal from the secure memory storage indicating that it is ready for a new data word in embodiments where there is no e2 register. Status logic 710 may also receive decode signal from physical decoder 702. Decode signal will indicate the entry or entries within e1 register 700 which are being updated.

Status logic 710 transmits status signals. Status logic 710 transmits status signals both internally and externally. Status logic 710 transmits status signals to control logic 710. Status logic 710 may also transmit status signals, such as fail count bit, to pipeline structure and e2 register. Thus, control signals from status logic 710 may be used to maintain consistency of operations both within e1 register 700 and within pipeline structure.

Control logic 712 comprises hardware logic for determining operations to be performed on CAM 704 and RAM 708. Control logic 712 also comprises hardware logic for outputting address signal to physical address decoder 702. Control logic 712 takes as input status signals from status logic 710. Status signals drive the selection of addresses by control logic 712. For example, status signals may indicate that write operation should be performed on CAM 704 and RAM 708. Control logic may then increment a pointer to next address, indicating empty addresses within CAM 704 and RAM 708 for writing associated addresses and data words. The address signal output from control logic 712 may comprise pointers that are decoded by physical address decoder 702 to select appropriate physical addresses within CAM 704 or RAM 708 for performing data manipulation operation. The address signal output from control logic 712 may also be output to the pipeline to indicate physical addresses within e1 register 700.

In this way, e1 register 700 may transmit a data word, its associated address, and its physical address within e1 register 700 to pipeline structure. The physical address within e1 register 700 may be used to update e1 register 700 control bits after verify or re-write operation occurs. If the re-write operation failed, for example, fail count bits within e1 register 700 may be updated using the physical address within e1 register 700.

Smart Dynamic Redundancy Register Design to Prevent E1 Overflow

In one embodiment of the present invention, a memory device may comprise multiple banks or segments. As noted above, the memory bank may comprise STT-MRAM which suffers from an inherently stochastic write mechanism, wherein bits have certain probability of write failure on any given write cycle. In other words, the memory cells are characterized by having a high write error rate. The dynamic redundancy registers of the present disclosure allow the memory bank to be operated with high WER (write error rate). However, designers of the memory device need to ensure that the size of a dynamic redundancy register or cache memory, e.g., an e1 register used to store data words associated with pending verify and re-write operations does not exceed practical limitations.

Accordingly, the e1 register needs to be designed with a sufficient fixed size so that overflow is avoided in all cases. One of the factors that need to be taken into consideration in determining an optimal size for the e1 register is the WER. For example, for a higher error rate, the e1 register will need to be larger than for a lower error rate. In one embodiment, the number of entries in the e1 register will be at least the WER*the size of the memory bank.

Further, in one embodiment, the e1 register will contain at least one entry per row segment. In one embodiment, the e1 register can contain 2 entries per row segment. For example, if each row segment in a memory bank has a 100 rows, then the size of the e1 register would be at least 200 entries.

In one embodiment, the number of entries the e1 register needs to contain per row segment is related to the depth of the pipeline. In other words, the number of entries the e1 register contains is directly proportional to the number of pipeline stages (or pipe-stages). This is because with a longer pipeline, there will be more data words that need to be stored in the e1 register in case of a row change, e.g., when a RowChg signal is received. For example, as seen in FIGS. 5, 14 and 15, the pipeline can have several stages. The more stages the pipeline has, the higher the number of entries that e1 needs to be designed to contain. If the pipeline has an additional write stage, as shown in FIG. 15, receiving a RowChg signal would mean that the entries in both a write register and a verify register would need to be saved to be verified at a later time. Accordingly, additional storage space will be needed in the e1 register as compared to a case where there's only a single write stage in the pipeline.

In one embodiment, if the e1 register comprises N rows per segment and the pipeline has M number of stages, then the e1 register will comprise at least N*M entries.

As mentioned above, the number of entries in the e1 register can also be a function of the WER. In one embodiment, the size of the e1 register can be at least (N*M)+(WER*number of entries in the memory bank).

In one embodiment, the memory device can comprise a plurality of memory banks as discussed above, wherein each of the memory banks (or segments) can have its own pipeline and a dedicated e1 register. Or alternatively, the memory device can comprise a plurality of memory banks, wherein each of the memory banks (or segments) can have its own pipeline, but a single e1 register serves all the segments (instead of a dedicated e1 register per segment).

In one embodiment, a warning pin or status bit can be used to indicated to the user the occupancy level of the e1 register. For example, status bits may indicate to a user that the e1 register is 25%, 50%, 75% or completely full.

Figure 21:
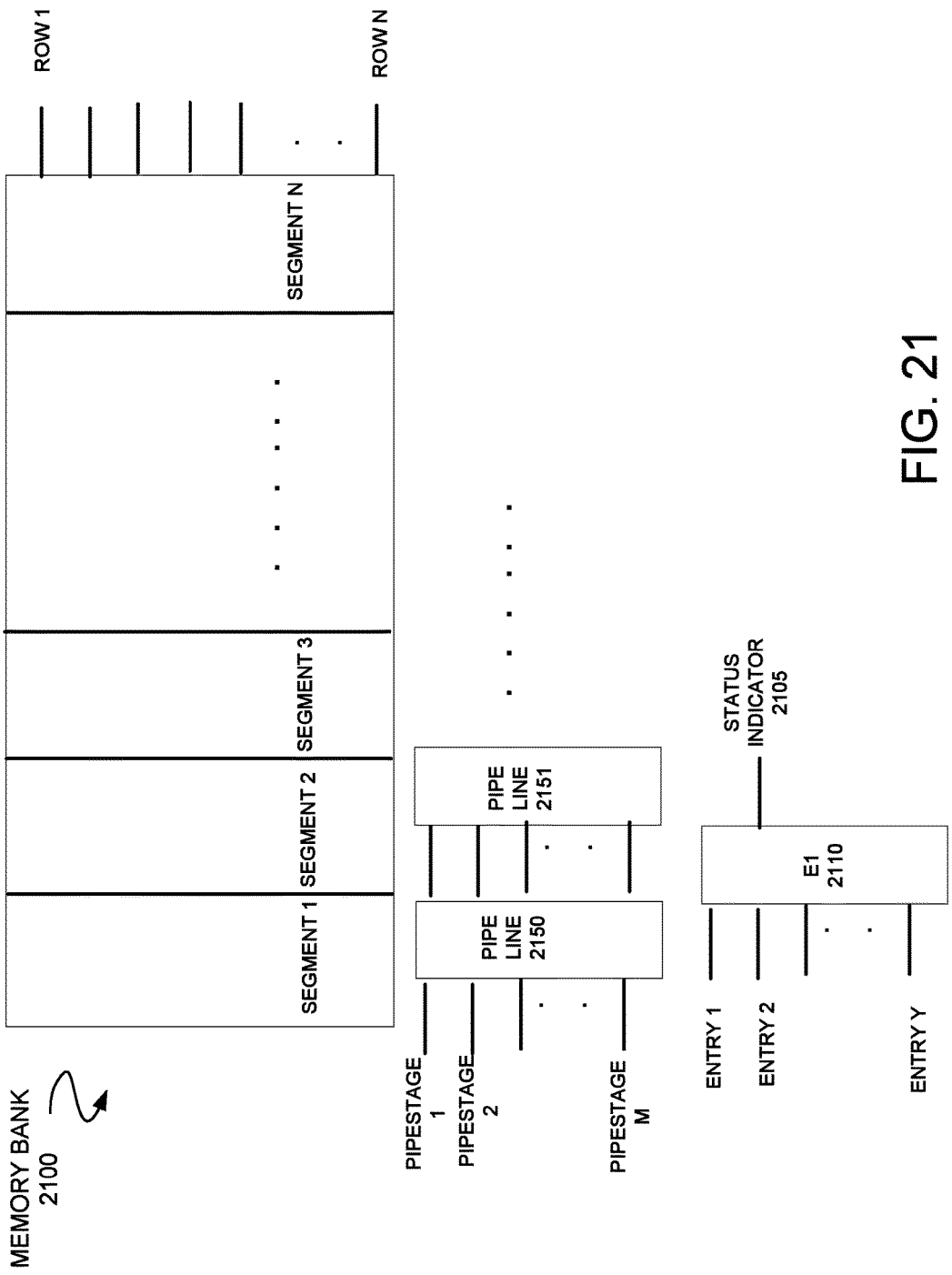
FIG. 21 illustrates a smart design for a dynamic redundancy register in accordance with an embodiment of the present invention.

FIG. 21 illustrates a smart design for a dynamic redundancy register in accordance with an embodiment of the present invention. The memory bank 2100 comprises multiple addressable memory cells configured in multiple segments, wherein each segment contains N rows per segment. Each of the segments can be associated with its own pipeline. As shown in FIG. 21, segment 1 of memory bank 2100 can be associated with pipeline 2150 while segment 2 can be associated with pipeline 2151. Each pipeline comprises M pipestages and are configured to process write operations for data words addressed to a given segment of a of the memory bank. Alternatively, in one embodiment, a single pipeline can service all the segments in the memory bank. In other words, the entire memory bank comprises a single pipeline.

The memory device can also comprise a dynamic redundancy register or cache memory E1 2110. The number of entries, Y, in e1 is based on M, N and a prescribed word error rate (WER) so as to prevent overflow of the cache memory. In a different embodiment, each of the segments of memory bank 2100 can have its own associated e1 register. However, in a typical embodiment, a single e1 register services all the segments of the memory bank.

In one embodiment, the number of entries Y in e1 can be calculated using the formula: (N*M+B*E), wherein B indicates the number of rows in the memory bank.

In one embodiment, a warning pin(s) or status bit(s) 2105 can be used to indicate to the user the occupancy level of the e1 register. For example, status bits may indicate to a user that the e1 register is 25%, 50%, 75% or completely full.

One of ordinary skill in the art will understand that the specific control signals, logic and structures disclosed with respect to FIG. 7 are merely exemplary, and illustrate one of many possible implementations of e1 register 700. Other implementations of e1 register 700 may be used in conjunction with the teachings of the present disclosure.

Figure 8:
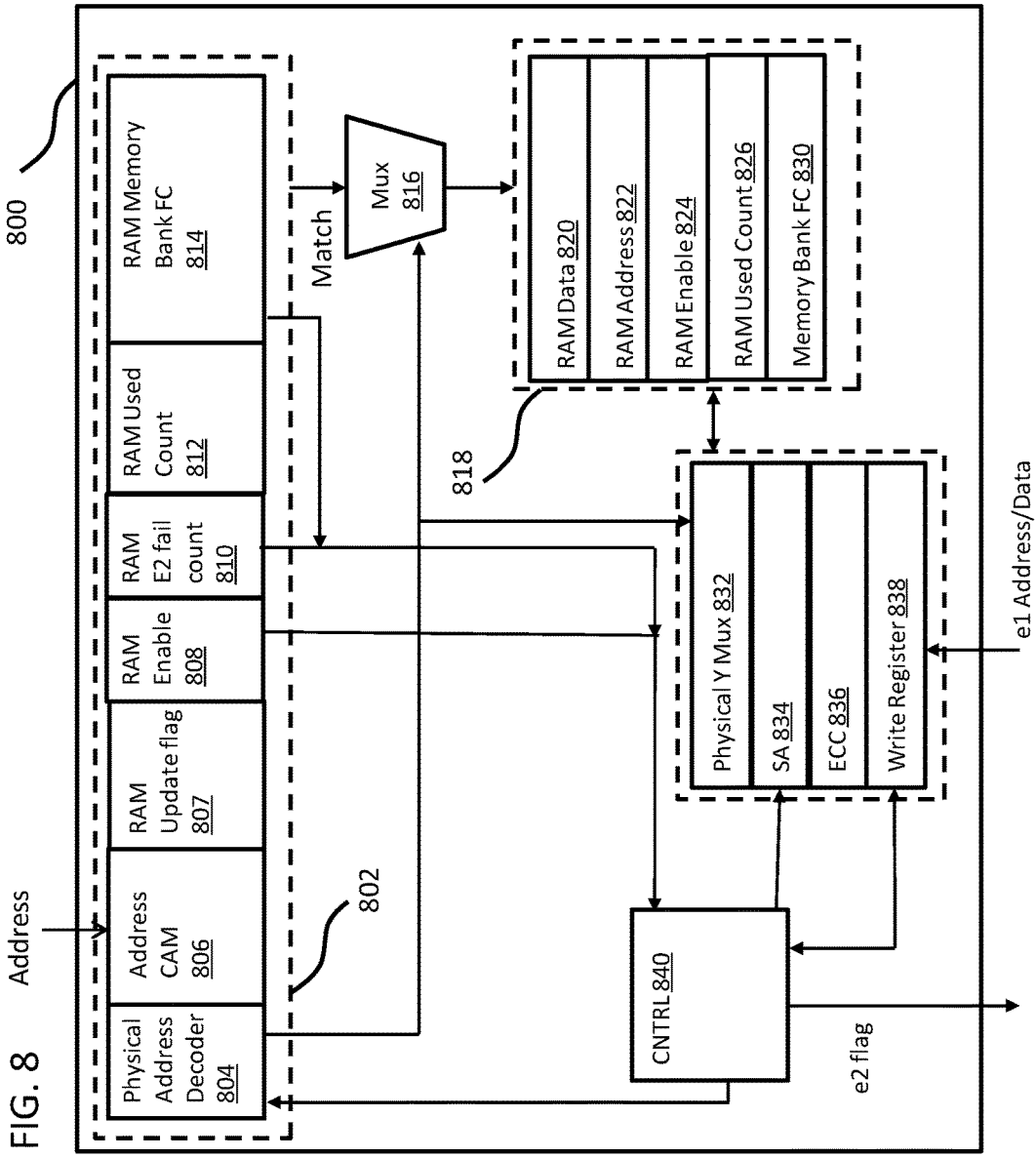
FIG. 8 is a block diagram of an embodiment of a memory device of the present disclosure showing a last level dynamic redundancy register.

FIG. 8 is a block diagram of an embodiment of a memory device of the present disclosure showing a last level dynamic redundancy register. FIG. 8 shows exemplary e2 register 800 described herein that comprises CAM/RAM/Enbl/Pointers block 802, mux 816, e2 RAM 818, and physical y-mux 832, sense amplifier 834, error correction code bits 836, write register 838, and control logic 840. One of ordinary skill in the art will recognize that e2 register 800 is exemplary, and includes features such as RAM Memory bank FC 814 which are not necessary for achieving the teachings of the present disclosure. Moreover, e2 register 800 communicates control signals for maintaining consistency of operations both internally and to communicate with components of memory device such as pipeline banks, memory banks, and e1 register. Such control signals may be modified without departing from the teachings of the present disclosure.

CAM/RAM/Enbl/Pointers block 802 comprises physical address decoder 804, address CAM 806, RAM update flag 807, RAM enable 808, RAM e2 fail count 810, RAM used count 812, and RAM memory bank FC 814. Thus, block 802 comprises data storage elements comprising data bits. Block 802 is used for storing control bits and associated addresses of data words.

Physical address decoder 804 receives an address inputs from control logic 840. As explained in relation to e1 register and FIG. 7, physical address decoder 804 uses address inputs to determine physical addresses for writing associated addresses and data words to CAM 806 and RAM 818, respectively. Physical address decoder 804 outputs decode signal to CAM 806 and mux 816. Moreover, physical address decoder 804 may output decode signal to physical y-mux 832.

CAM 806 stores associated addresses for data words. As explained in relation to e1 register and FIG. 7, CAM 806 may take as inputs various control signals and associated addresses. CAM 806 can then write associated addresses to itself or determine appropriate physical address within RAM 818 for matching data word. Typically, such data word would be output, for example, to pipeline banks or memory banks.

RAM update flag 807 comprises control bits for determining whether associated data should be updated within RAM 818. For example, control signals received from control logic 840 may indicate that RAM 818 entry should be updated based on a new data word. RAM update flag 807 thus provides a mechanism to track data words that should be updated in case it is not possible to update the data word immediately.

RAM enable 808 comprises control bits indicating whether e2 RAM 818 contains a valid data word. RAM enable 808 may thus require that all bits be set to one, for example, to provide a stringent mechanism to ensure that RAM 818 includes valid data. RAM enable 808 may be output to control logic 840 so that control logic may keep track of valid data within block 802 and RAM 818. One of ordinary skill in the art will recognize that other schemes may be used to ensure reliability of data words. For example, multiple copies of data word may be maintained in RAM 818 and selected based on a voting scheme. In another scheme, a more stringent error correction code (ECC) scheme may be performed within e2 register 800 than in memory bank. In another scheme, RAM 818 points to particular addresses within main memory for storing data words rather than storing the data words within e2 register 800 itself.

RAM e2 fail count 810 indicates the number of times a data word has failed to write to e2 RAM 818. For example, RAM 818 may comprise non-volatile STT-MRAM in an embodiment. In that case, e2 register 800 may write to RAM 818 until write operation is successful in order to maintain reliability within e2 register 800. Thus, e2 fail count indicates the number of times a data word has failed to write to RAM 818. RAM e2 fail count 810 may be output to control logic 840, so that control logic 840 may output appropriate addresses for writing to RAM 818.

RAM used count 812 indicates the number of times that a physical address within e2 RAM 818 has been used. The e2 register 800 may desire to keep track of the number of times that a particular physical address within RAM 818 has been used. For example, the number of times that a read operation has occurred, write operation has occurred, or both to a specific physical address within RAM 818.

RAM memory bank FC 814 indicates the number of times that a data word has failed to write to a memory bank. For example, e2 register 800 may desire to keep track of the number of times that a write operation from e2 register 800 has failed to the memory bank. This may be useful so that only a desired number of re-write operations are tried. The specific components of block 802 are exemplary and may be modified without departing from the teachings of the present disclosure. For example, one of ordinary skill in the art will recognize that RAM memory bank FC 814 is optional and provides a mechanism for controlling the number of re-write attempts to memory bank.

Mux 816 is coupled to CAM/RAM/Enbl/Pointers block 802 and e2 RAM 818. Mux 816 takes as input decode signal from physical address decoder 804 indicating physical address within e2 RAM 818 and match signal from CAM 806 indicating that match exists within e2 RAM 818. Thus, as explained with respect to e1 register 700 of FIG. 7, e2 RAM 818 can perform read or write operation. If e2 RAM 818 comprises MRAM, write operations may be tried a number of times based on RAM e2 fail count 810. In another embodiment, after a predetermined number of write attempts to physical address within e2 RAM 818, RAM used count 812 may operate to indicate that another location within e2 RAM 818 should be chosen for write operation.

The e2 RAM 818 comprises RAM data 820, RAM address 822, RAM enable 824, RAM used count 826, and Memory Bank FC 830. The e2 RAM 818 may comprise volatile or non-volatile memory. In one embodiment, The e2 RAM 818 comprises non-volatile memory such as MRAM so that contents may be saved on during power down.

RAM data 820 comprises data storage elements comprising data bits storing a data word received from e1 register. RAM address 822 stores an associated address within a memory bank for the data word stored within RAM data 820. For example, CAM 806 may store an associated address to RAM address 822. RAM enable 824 stores the same enable bits as RAM enable 808. RAM used count 826 stores the same used count as in RAM used count 812. Memory Bank FC 830 stores the same fail count as RAM Memory Bank FC 814. Thus, block 802 comprising volatile storage (e.g., SRAM) may be backed up to non-volatile storage (e.g., MRAM).

Similar to the explanation given with respect to FIG. 4, y-mux 832 allows read and write operations to be performed on RAM 818. Sense amplifiers 824 are used to read RAM 818. ECC block 836 allows error correcting on RAM 818. Write Register 938 may comprise CAM for searching write register contents. Write register 838 receives data word and address from e1 register. Write register 838 also communicates with e2 control logic 840 to, for example, send ready e2 ready signal when write register 838 is ready for new data word from e1 register.

Control logic 840 comprises hardware logic. Control logic 840 determines appropriate operations (such as read, write, and search) to be performed on e2 register 800. Control logic 840 also determines addresses. As previously explained in connection with FIG. 7, control logic 840 may use many different addressing schemes. In one embodiment, control logic 840 uses pointers to determine physical addresses within block 802 and RAM 818 for writing data words. Control logic 840 may also communicate with other components of memory device including pipeline banks, memory banks, and e1 register. For example control logic 840 transmits e2 flag to e1 register to indicate that e2 register 800 may receive a new data word to write register 838.

The above description and drawings are only to be considered illustrative of specific embodiments, which achieve the features and advantages described herein. Modifications and substitutions to specific process conditions can be made. Accordingly, the embodiments in this patent document are not considered as being limited by the foregoing description and drawings.

We claim:

1. A method of writing data into a memory device, the method comprising:
utilizing a pipeline to process write operations of a first plurality of data words addressed to a memory bank;
writing a second plurality of data words and associated memory addresses into a cache memory, wherein said cache memory is associated with said memory bank and wherein further each data word of said second plurality of data words is either awaiting write verification associated with said memory bank or is to be re-written into said memory bank;

detecting a power down signal;

responsive to the power down signal, transferring the second plurality of data words and associated memory addresses from said cache memory into a secure memory storage area in the memory bank;

detecting a power up signal;

responsive to the power up signal, and before said memory device is powered up, transferring the second plurality of data words and associated memory addresses from said secure memory storage area to said cache memory; and responsive to the transferring, and before said memory device is powered up, processing the second plurality of data words and associated memory addresses from said cache memory to said pipeline for writing data to the memory bank during power up.

2. A method as described in claim 1 wherein said memory bank comprises a plurality of spin-transfer torque magnetic random access memory (STT-MRAM) cells.

3. A method as described in claim 1 further comprising:
responsive to said power down signal, transferring any partially completed write operations of said pipeline to said secure memory storage area.

4. A method as described in claim 1 further comprising:
responsive to said power down signal, copying any partially completed write operations of said pipeline to said cache memory.

5. A method as described in claim 1 wherein said transferring comprise utilizing a secure communication process substantially compliant with one of: voting; ECC encoding; use of multiple copies; comparing multiple copies; and voting from multiple copies.

6. A method as described in claim 1 wherein said power down signal originates from a system level software stack and represents a system wide orderly power down event.

7. A method as described in claim 1 further comprising removing a data word and its associated address from said cache memory responsive to an indication that said data word has been verified as properly written to said memory bank.

8. A method of writing data into a memory device, the method comprising:
utilizing a pipeline to process write operations of a first plurality of data words addressed to a memory bank;
writing a second plurality of data words and associated memory addresses into a cache memory, wherein said cache memory is associated with said memory bank and wherein further each data word of said second plurality of data words is either awaiting write verification associated with said memory bank or is to be re-written into said memory bank;
detecting a power down signal;
responsive to the power down signal, transferring the second plurality of data words and associated memory addresses from said cache memory into a secure memory storage area in the memory bank;
detecting a power up signal; and
responsive to the power up signal, and before said memory device is powered up, transferring the second plurality of data words and associated memory addresses from said secure memory storage area to said pipeline for writing data to the memory bank during power up.

9. A method as described in claim 8 wherein said memory bank comprises a plurality of spin-transfer torque magnetic random access memory (STT-MRAM) cells.

10. A method as described in claim 8 further comprising:
responsive to said power down signal, transferring any partially completed write operations of said pipeline to said secure memory storage area.

11. A method as described in claim 8 further comprising:
responsive to said power down signal, copying any partially completed write operations of said pipeline to said cache memory.

12. A method as described in claim 8 wherein said transferring comprise utilizing a secure communication process substantially compliant with one of: voting; ECC encoding; use of multiple copies; comparing multiple copies; and voting from multiple copies.

13. A method as described in claim 8 wherein said power down signal originates from a system level software stack and represents a system wide orderly power down event.

14. A method as described in claim 8 further comprising removing a data word and its associated address from said cache memory responsive to an indication that said data word has been verified as properly written to said memory bank.

15. A memory device for storing data, the memory device comprising:
a memory bank comprising a plurality of addressable memory cells;
a pipeline configured to process write operations of a first plurality of data words addressed to said memory bank;
a cache memory operable for storing a second plurality of data words and associated memory addresses, wherein said cache memory is associated with said memory bank and wherein further each data word of said second plurality of data words is either awaiting write verification associated with said memory bank or is to be re-written into said memory bank; and
a logic module operable to:
detect a power down signal;
responsive to the power down signal, transfer the second plurality of data words and associated memory addresses from said cache memory into a secure memory storage area reserved in the memory bank;
detect a power up signal;
responsive to said power up signal, and before said memory device is powered up, transfer data words and associated memory addresses from said secure memory storage area to said cache memory; and
before said memory device is powered up, process said data words and associated memory addresses from said cache memory to said pipeline for storage to said memory bank during power up.

16. A memory device as described in claim 15 wherein said plurality of addressable memory cells of said memory bank comprises spin-transfer torque magnetic random access memory (STT-MRAM) cells.

17. A memory device as described in claim 15 wherein said logic module utilizes a secure communication process substantially compliant with one of: voting; ECC encoding; use of multiple copies; comparing multiple copies; and voting from multiple copies.

18. A memory device as described in claim 15 wherein a data word and its associated address are removed from said cache memory responsive to an indication that said data word has been verified as properly written to said memory bank.

19. A memory device for storing data, the memory device comprising:
- a memory bank comprising a plurality of addressable memory cells;
- a pipeline configured to process write operations of a first plurality of data words addressed to said memory bank;
- a cache memory operable for storing a second plurality of data words and associated memory addresses, wherein said cache memory is associated with said memory bank and wherein further each data word of said second plurality of data words is either awaiting write verification associated with said memory bank or is to be re-written into said memory bank; and
- a logic module operable to:
  - detect a power down signal;
  - responsive to the power down signal, transfer the second plurality of data words and associated memory addresses from said cache memory into a secure memory storage area reserved in the memory bank;
  - detect a power up signal; and
  - responsive to said power up signal, and before said memory device is powered up, transfer data words and associated memory addresses from said secure memory storage area to said pipeline for storage to said memory bank during power up.

20. A memory device as described in claim 19 wherein said plurality of addressable memory cells of said memory bank comprises spin-transfer torque magnetic random access memory (STT-MRAM) cells.

\* \* \* \* \*